(12) United States Patent
Gampp et al.

(10) Patent No.: US 12,067,995 B2
(45) Date of Patent: Aug. 20, 2024

(54) APPARATUS AND METHOD FOR DETERMINING A PREDETERMINED CHARACTERISTIC RELATED TO AN ARTIFICIAL BANDWIDTH LIMITATION PROCESSING OF AN AUDIO SIGNAL

(71) Applicant: FRAUNHOFER-GESELLSCHAFT ZUR FOERDERUNG DER ANGEWANDTEN FORSCHUNG E.V., Munich (DE)

(72) Inventors: Patrick Gampp, Erlangen (DE); Christian Uhle, Ursensollen (DE); Julia Havenstein, Nuremberg (DE); Oliver Hellmuth, Buckenhof (DE); Sascha Disch, Fuerth (DE); Antonios Karampourniotis, Nuremberg (DE); Juergen Herre, Erlangen (DE); Peter Prokein, Erlangen (DE)

(73) Assignee: FRAUNHOFER-GESELLSCHAFT ZUR FOERDERUNG DER ANGEWANDTEN FORSCHUNG E.V., Munich (DE)

(*) Notice: Subject to any disclaimer, the term of this patent is extended or adjusted under 35 U.S.C. 154(b) by 179 days.

(21) Appl. No.: 16/582,165

(22) Filed: Sep. 25, 2019

(65) Prior Publication Data
US 2020/0020346 A1 Jan. 16, 2020

Related U.S. Application Data

(63) Continuation of application No. PCT/EP2018/025081, filed on Mar. 29, 2018.

(30) Foreign Application Priority Data

Mar. 31, 2017 (EP) .................................... 17164360
Sep. 7, 2017 (EP) .................................... 17189992

(51) Int. Cl.
*G10L 19/02* (2013.01)
*G10L 19/022* (2013.01)
(Continued)

(52) U.S. Cl.
CPC ........ *G10L 19/0208* (2013.01); *G10L 19/022* (2013.01); *G10L 19/26* (2013.01);
(Continued)

(58) Field of Classification Search
CPC ... G10L 19/022; G10L 19/0208; G10L 19/26; G10L 21/0216; G10L 21/0232; G10L 21/038; G10L 25/69
(Continued)

(56) References Cited

U.S. PATENT DOCUMENTS 5,914,986 A 6/1999 Ohta et al.
7,593,847 B2 9/2009 Oh
(Continued)

FOREIGN PATENT DOCUMENTS

AR 072703 A1 9/2010
AU 2016204672 A1 * 7/2016 ............. G10L 19/26
(Continued)

OTHER PUBLICATIONS

ISA/EP, International Search Report and Written Opinion, Jun. 13, 2018 re PCT International Patent Application No. PCT/EP2018/025081.
(Continued)

*Primary Examiner* — Nicole A K Schmieder
(74) *Attorney, Agent, or Firm* — Perry + Currier

(57) ABSTRACT

An apparatus for determining a predetermined characteristic related to an artificial bandwidth limitation processing of an audio signal has a slope evaluator configured for evaluating a slope of a spectrum of the audio signal to obtain a slope evaluation result. The apparatus has a frequency evaluator
(Continued)

configured for evaluating a cut-off frequency of the spectrum of the audio signal to obtain a frequency evaluation result, and has a processor for providing an information indicating that the audio signal has the predetermined characteristic dependent on an evaluation of the slope evaluation result and an evaluation of the frequency evaluation result.

18 Claims, 29 Drawing Sheets

(51) Int. Cl.
    *G10L 19/26*     (2013.01)
    *G10L 21/0216*     (2013.01)
    *G10L 21/0232*     (2013.01)
    *G10L 21/038*     (2013.01)
    *G10L 25/69*     (2013.01)
    *H03G 3/20*     (2006.01)

(52) U.S. Cl.
    CPC ...... *G10L 21/0216* (2013.01); *G10L 21/0232* (2013.01); *G10L 21/038* (2013.01); *G10L 25/69* (2013.01); *H03G 3/20* (2013.01)

(58) Field of Classification Search
    USPC .......................................................... 704/201
    See application file for complete search history.

(56) References Cited

U.S. PATENT DOCUMENTS

| | | | |
|---|---|---|---|
| 8,731,209 B2 * | 5/2014 | Uhle ................ | G10L 21/0364 704/214 |
| 8,996,362 B2 | 3/2015 | Nagel et al. | |
| 9,117,440 B2 | 8/2015 | Mundt et al. | |
| 9,390,721 B2 * | 7/2016 | Daimou ............... | G10L 21/038 |
| 9,741,360 B1 | 8/2017 | Li et al. | |
| 10,199,049 B2 | 2/2019 | Ullberg et al. | |
| 2004/0167775 A1 | 8/2004 | Sorin | |
| 2006/0106619 A1 | 5/2006 | Iser et al. | |
| 2007/0271480 A1 * | 11/2007 | Oh ..................... | G10L 19/005 714/3 |
| 2008/0027716 A1 | 1/2008 | Rajendran et al. | |
| 2008/0059166 A1 | 3/2008 | Ehara | |
| 2009/0046847 A1 | 2/2009 | Wu et al. | |
| 2009/0132243 A1 | 5/2009 | Suzuki | |
| 2009/0144062 A1 | 6/2009 | Ramabadran et al. | |
| 2009/0147963 A1 | 6/2009 | Smith | |
| 2009/0157413 A1 | 6/2009 | Oshikiri | |
| 2010/0198588 A1 | 8/2010 | Sudo et al. | |
| 2011/0054911 A1 | 3/2011 | Baumgarte et al. | |
| 2011/0075832 A1 | 3/2011 | Tashiro | |
| 2011/0099018 A1 | 4/2011 | Neuendorf et al. | |
| 2011/0153318 A1 | 6/2011 | Rossello et al. | |
| 2011/0173012 A1 | 7/2011 | Rettelbach et al. | |
| 2011/0178795 A1 | 7/2011 | Bayer et al. | |
| 2011/0200196 A1 | 8/2011 | Disch et al. | |
| 2011/0288873 A1 | 11/2011 | Nagel et al. | |
| 2012/0051549 A1 | 3/2012 | Nagel et al. | |
| 2012/0221342 A1 | 8/2012 | Oshikiri | |
| 2012/0226691 A1 | 9/2012 | Edwards | |
| 2012/0321105 A1 | 12/2012 | McGrath | |
| 2013/0304481 A1 | 11/2013 | Briand et al. | |
| 2013/0332151 A1 | 12/2013 | Fuchs et al. | |
| 2014/0016791 A1 | 1/2014 | Smith et al. | |
| 2014/0088978 A1 | 3/2014 | Mundt et al. | |
| 2014/0229172 A1 | 8/2014 | Atti et al. | |
| 2015/0073784 A1 | 3/2015 | Gao | |
| 2015/0170663 A1 | 6/2015 | Disch et al. | |
| 2015/0187360 A1 | 7/2015 | Nagel et al. | |
| 2015/0228288 A1 | 8/2015 | Subasingha et al. | |
| 2015/0287417 A1 | 10/2015 | Disch et al. | |
| 2015/0332702 A1 | 11/2015 | Disch et al. | |
| 2016/0133273 A1 | 5/2016 | Kaniewska et al. | |
| 2016/0180857 A1 | 6/2016 | Reuschl et al. | |
| 2016/0241982 A1 | 8/2016 | Seefeldt et al. | |
| 2016/0329061 A1 * | 11/2016 | Heber .................. | G10L 19/005 |
| 2017/0133023 A1 | 5/2017 | Disch et al. | |
| 2017/0169831 A1 | 6/2017 | Kaniewska et al. | |
| 2017/0256267 A1 | 9/2017 | Disch et al. | |
| 2019/0051286 A1 | 2/2019 | Sorensen et al. | |

FOREIGN PATENT DOCUMENTS

| | | |
|---|---|---|
| CN | 102089808 A | 6/2011 |
| CN | 102103860 A | 6/2011 |
| CN | 102150201 A | 8/2011 |
| CN | 102341847 A | 2/2012 |
| CN | 102646419 A | 8/2012 |
| CN | 103503061 A | 1/2014 |
| CN | 105324814 A | 2/2016 |
| CN | 106796800 A | 5/2017 |
| CN | 107077858 A | 8/2017 |
| EP | 2544465 A1 | 1/2013 |
| EP | 2806423 A1 | 11/2014 |
| JP | 2004272292 A | 9/2004 |
| JP | 2011075728 A | 4/2011 |
| JP | 2013515287 A | 5/2013 |
| JP | 2014513819 A | 6/2014 |
| JP | 2016509257 A | 3/2016 |
| JP | 2017507348 A | 3/2017 |
| KR | 20050039454 A | 4/2005 |
| KR | 20100083135 A | 7/2010 |
| KR | 20100106559 A | 10/2010 |
| KR | 20110095354 A | 8/2011 |
| KR | 20130140851 A | 12/2013 |
| KR | 20140023389 A | 2/2014 |
| KR | 20160106586 A | 9/2016 |
| RU | 2417456 C2 | 4/2011 |
| RU | 2607263 C2 | 1/2017 |
| RU | 2015138115 A | 3/2017 |
| WO | 2009099835 A1 | 8/2009 |
| WO | 2012025282 A1 | 3/2012 |
| WO | WO-2012158705 A1 | 11/2012 |
| WO | WO-2014118185 A1 | 8/2014 |
| WO | WO-2016135132 A1 | 9/2016 |

OTHER PUBLICATIONS

ISA/EP, Written Opinion, Mar. 13, 2019 re PCT International Patent Application No. PCT/EP2018/025081.

ISA/EP, International Preliminary Report on Patentability, Jun. 14, 2019 re PCT International Patent Application No. PCT/EP2018/025081.

ISA/EP, International Search Report and Written Opinion, Jun. 13, 2018 re PCT International Patent Application No. PCT/EP2018/025083.

Erne, Markus. "Perceptual Audio Coders "What to listen for"." Audio Engineering Society Convention 111. Audio Engineering Society, 2001.

Chang, Chia-Ming, et al. "Compression artifacts in perceptual audio coding." Audio Engineering Society Convention 121. Audio Engineering Society, 2006.

Dietz, Martin, et al. "Spectral Band Replication, a novel approach in audio coding." Audio Engineering Society Convention 112. Audio Engineering Society, 2002.

Disch, Sascha, et al. "Intelligent gap filling in perceptual transform coding of audio." Audio Engineering Society Convention 141. Audio Engineering Society, 2016.

Arora, Manish, Joonhyun Lee, and Sangil Park. "High quality blind bandwidth extension of audio for portable player applications." Audio Engineering Society Convention 120. Audio Engineering Society, 2006.

Gampp, Patrick, et al. "Methods for Low Bitrate Coding Enhancement Part I: Spectral Restoration." Audio Engineering Society Conference: 2017 AES International Conference on Automotive Audio. Audio Engineering Society, 2017.

Laitinen, Mikko-Ville, et al. "Phase derivative correction of bandwidth-extended signals for perceptual audio codecs." Audio Engineering Society Convention 140. Audio Engineering Society, 2016.

(56) References Cited

OTHER PUBLICATIONS

Desrochers, Simon, and Roch Lefebvre. "Detection and Removal of the Birdies Artifact in Low Bit-Rate Audio." Audio Engineering Society Convention 139. Audio Engineering Society, 2015.
Liu, Xin, and Chang-Chun Bao. "Audio bandwidth extension based on temporal smoothing cepstral coefficients." EURASIP Journal on Audio, Speech, and Music Processing 2014.1 (2014): 41.
Choo, Kihyun, Anton Porov, and Eunmi Oh. "Blind bandwidth extension system utilizing advanced spectral envelope predictor." Audio Engineering Society Convention 138. Audio Engineering Society, 2015.
Simantiraki, Olympia, et al. "Stress detection from speech using spectral slope measurements." Pervasive Computing Paradigms for Mental Health. Springer, Cham, 2016. 41-50.
Volín, J., and J. Zimmermann. "Spectral slope parameters and detection of word stress." Technical Computing Prague (2011): 125-5.
Shima, James Michael. FM demodulation using a digital radio and digital signal processing. MS thesis. University of Florida, 1995.
Tsibulko, Valentin Viktorovich, Ivo Tsvetanov Iliev, and Irena Ilieva Jekova. "Methods for detecting pacemaker pulses in ECG signal: A review." Annual Journal of Electronics 8 (2014): 77-80.
Herre, Jürgen, and Michael Schug. "Analysis of Decompressed Audio-The-Inverse Decoder." Audio Engineering Society Convention 109. Audio Engineering Society, 2000.
ISA/EP, International Search Report and Written Opinion, Jun. 13, 2018, re PCT International Patent Application No. PCT/EP2018/025082.
ISA/EP, International Preliminary Report on Patentability, Jun. 14, 2019, re PCT International Patent Application No. PCT/EP2018/025082.
RUPTO, Office Action, Apr. 17, 2020, re Russian Patent Application No. 2019134729/07(068504) [with English translation].
RUPTO, Office Action, Apr. 17, 2020, re Russian Patent Application No. 2019134610/07(068200) [with English translation].
RUPTO, Decision to Grant, Feb. 5, 2020, re Russian Patent Application No. 2019134727/08(068502) [with English translation].
RUPTO, Search Report, Jan. 30, 2020, re Russian Patent Application No. 2019134727/08(068502) [with English translation].
Bleidt, Robert L. et al. "Development of the mpeg-h tv audio system for atsc 3.0." IEEE Transactions on broadcasting 63.1 (2017): 202-236.
Schmidt, Konstantin et al. "Low complexity tonality control in the intelligent gap filling tool." 2016 IEEE International Conference on Acoustics, Speech and Signal Processing (ICASSP). IEEE, 2016.
U.S. Appl. No. 16/586,424, Apparatus and Method for Determining a Predetermined Characteristic Related to a Spectral Enhancement Processing of an Audio Signal, filed Sep. 27, 2019.
Mousazadeh, Saman et al. "Voice activity detection in presence of transient noise using spectral clustering." IEEE Transactions on Audio, Speech, and Language Processing 21.6 (2013): 1261-1271.
Li, Te et al. "Frequency region-based prioritized bit-plane coding for scalable audio." IEEE transactions on audio, speech, and language processing 16.1 (2007): 94-105.
Guitao, Sun, "Design and Implementation of Multi Format Video Processing System which Support 4k Resolution" with English Abstract, A Master Thesis Submitted to University of Electronic Science and Technology of China, issue 3, 2016.
Huawei, Hisilicon, "TP for 38.803 Emission mask for mmWave bands", R4-1700118, 3GPP TSG-RAN WG4 Meeting #82AH, Spokane, US, Jan. 17-19, 2017.
Panshuang, Duan, "Study on Artificial Bandwidth Extension of Speech", China's outstanding master's academic dissertation full text database(information technology), with English Abstract, Nov. 30, 2008.
Zhang, Yong et al., "Narrowband speech wideband extension algorithm research", Acta Acustica, vol. 39, No. 6, Nov. 2014—with English Abstract.
Bauer, Patrick, et al. "On speech quality assessment of artificial bandwidth extension." 2014 IEEE International Conference on Acoustics, Speech and Signal Processing (ICASSP). IEEE, 2014.
U.S. Appl. No. 16/580,116, Apparatus and Method Processing an Audio Signal, filed Sep. 24, 2019.

* cited by examiner

3000

```
┌─────────────────────────────────────┐
│ Separating a first portion of a spectrum of the │
│ audio signal from a second portion of the       │
│ spectrum of the audio signal, the first portion │──── 3100
│ having a first signal characteristic and the second │
│ portion having a second signal characteristic   │
└─────────────────────────────────────┘
                    │
                    ▼
┌─────────────────────────────────────┐
│ Extending a bandwidth of the first portion │
│ using first parameters associated with the │
│ first signal characteristic, for obtaining a first │──── 3200
│ extended portion                    │
└─────────────────────────────────────┘
                    │
                    ▼
┌─────────────────────────────────────┐
│ Extending a bandwidth of the second portion │
│ using second parameters associated with the │
│ second signal characteristic, for obtaining │──── 3300
│ a second extended portion           │
└─────────────────────────────────────┘
                    │
                    ▼
┌─────────────────────────────────────┐
│ Using the first extended portion and the │
│ second extended portion for obtaining an │──── 3400
│ extended combined audio signal      │
└─────────────────────────────────────┘
```

Fig. 20

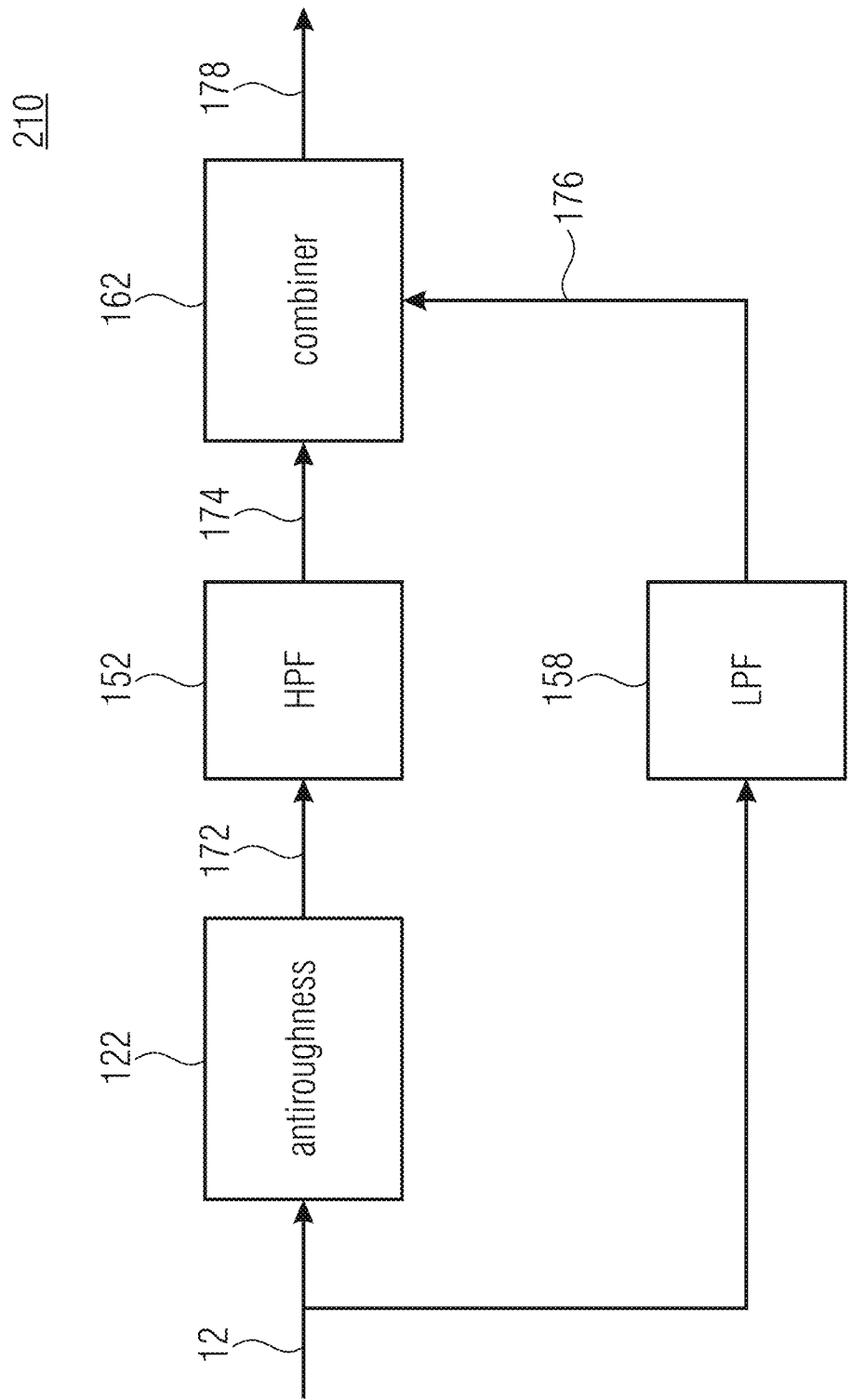

APPARATUS AND METHOD FOR DETERMINING A PREDETERMINED CHARACTERISTIC RELATED TO AN ARTIFICIAL BANDWIDTH LIMITATION PROCESSING OF AN AUDIO SIGNAL

CROSS-REFERENCE TO RELATED APPLICATIONS

This application is a continuation of copending International Application No. PCT/EP2018/025081, filed Mar. 29, 2018, which is incorporated herein by reference in its entirety, and additionally claims priority from European Applications No. EP17164360.4, filed Mar. 31, 2017, and EP17189992.5, filed Sep. 7, 2017, which are also incorporated herein by reference in their entirety.

BACKGROUND OF THE INVENTION

In multi-media applications, audio signals are often coded using dedicated perceptual coding methods like MPEG1/2 Layer 3 ("mp3"), MPEG2/4 Advanced audio coding (AAC), etc. When decoding the encoded audio signal diverse processing methods may be applied so as to reconstruct the audio signal that was originally encoded. However, due to lossy coding operations such as perceptually adapted quantization or parametric coding techniques such as Spectral Bandwidth Replication (SBR), it is possible to obtain artifacts in the decoded audio signal that might be disturbing.

For quite a long time, perceptual audio coders have been developed to foremost preserve the perceptual quality of the original signals. If the coded and non-coded signal is perceptually indistinguishable, this property is called "perceptual transparency".

However, transparency can only be achieved if the available bitrate (i.e. the amount of data used) is high enough. In recent years, it was realized that, at low bitrates, perceptual pleasantness becomes more important than closeness to the original in a transparency sense. Therefore, well-established perceptual coding schemes like MP3 or AAC may sound sub-optimal to date compared to modern coding approaches targeting perceptual pleasantness.

In the following, some coding artifacts are briefly described.

The Birdies Artifact

At low bitrate transform coding, often the quantizers for the coding of the spectral lines have to be set to a very coarse precision, such that their dynamic range is poly adapted to the signal. As a result, many spectral lines are quantized to 0 by the dead-zone of the quantizer or to the value 1, corresponding to the first quantizer step. Over time, spectral lines or groups of lines might toggle between 0 and 1, thereby introducing unwanted temporal modulation. This artifact is called "Birdies" being reminiscent of a bird's twitter. Therefore, this strong time-varying presence of spectral holes and spectral islands is unwanted codec behavior leading to objectionable perceptual artifacts, see [2] and [3].

Bandwidth Limitation

Another well-known coding artifact is bandwidth limitation. If, at low bitrate coding conditions, the available bit budget is insufficient to accommodate the needed precision for transparency, legacy codecs often introduced a static low-pass to limit the audio bandwidth. This may lead to a dull and muffled sound impression, see [2] and [3].

Tonal Spike Artifact

This artifact appears in connection with artificial bandwidth extension methods such as spectral band replication (SBR), see [4], when the tonal-to-noise ratio has been overestimated. In this case tonal components are recreated with too much energy which leads to a metallic sound, see [3].

Beating Artifact

As well as the tonal spike artifact, the beating artifact appears in conjunction with artificial bandwidth extension. Beating creates the perception of roughness and emerges from two tonal components with close frequency distance which can caused by the copy up as used in SBR, see [3].

Therefore, it is an aim to detect, if the audio signal was subjected to a processing that is capable of introducing artifacts and/or to reduce such artifacts.

An example for a processing method that may be a source for artifacts is the Spectral Band Replication (SBR) being a semi-parametric method for extending the bandwidth of an audio signal on the decoder side. In a first step, parts of the transmitted lowpass signal spectrum are replicated by copying the spectral coefficients from the lower to the higher frequency region. In a second step, the spectral envelope is adjusted. The adjustment of the spectral envelope is performed such that the coarse shape of the spectrum matches a given target, whereas the fine structure remains unmodified.

The detection of SBR is desired because from the obtained information it can be concluded that 1. The signals have been compressed by means of perceptual audio coding (i.e., lossy). That follows that an application of enhancement methods addressing the above mentioned artefact types are appropriate.
2. The sound quality of the signal can potentially be improved by dedicated methods for reducing the audibility of artifacts that have been introduced by the SBR. Such methods benefit from the knowledge about the start frequency at which SBR is in effect.

The starting frequency at which SBR is in effect is of interest for post-processings that improve the sound quality by mitigating artifacts introduced by SBR. Therefore, there is a need for detecting SBR and for estimating the start frequency of SBR. In particular, it is a desire to determine whether such enhancement is desired or not. It is, for example, not appropriate for signals of high sound quality, because the enhancement can degrade the sound quality when the audio signal is of high sound quality.

A method for the detection of SBR is described in U.S. Pat. No. 9,117,440 B2. The described method operates on sub-band signals that are computed using a filterbank or time-frequency transform. It then quantifies the relationship between multiple sub-bands by means of cross-correlation, i.e., by multiplying the corresponding samples and accumulating these products over time.

Another example for a source of artifacts is bandwidth reduction (BR) which is also referred to as bandwidth limitation (BL). When the bandwidth is severely limited, a degradation of the sound quality is perceived and a quality enhancement is desired. Such quality improvement may comprise a bandwidth extension (BWE), which should only be applied if needed, i.e. when the natural bandwidth of the signals has been artificially severely reduced. A method for BWE that uses an estimation of the bandwidth is described in [1]. The bandwidth is estimated by detecting the highest frequency present in the signal at any given time. This method is prone to false positive detection errors, because an audio signal can have a limited bandwidth by nature as the mechanism that generated the signal has only generated energy at lower frequencies.

Summing up, perceptual audio coders are widely used, when storage space or streaming bandwidth for audio content is limited. If the applied compression rate is very high (and the used data rate after compression is very low), several coding artifacts are introduced that degrade the perceived audio quality.

Therefore, it is an object of the invention to provide for an enhancing identification of audio signals comprising a characteristic being obtained by artifact prone audio processing and/or to provide for a concept to reduce such artifacts through application of dedicated post-processings on such audio material.

SUMMARY

According to an embodiment, an apparatus for determining a predetermined characteristic indicating that an audio signal was subjected to an artificial bandwidth limitation processing may have: a slope evaluator configured for evaluating a slope of a spectrum of the audio signal to obtain a slope evaluation result; and a processor for providing an information indicating that the audio signal has the predetermined characteristic dependent on an evaluation of the slope evaluation result, wherein the processor is configured for providing the information indicating that the audio signal has the predetermined characteristic by providing a respective information indicating a result for the frame for a plurality of frames of the audio signal for each of the plurality of frames, wherein the processor is configured for obtaining a plurality of results based on the plurality of frames and to combine the plurality of results so as to obtain a combined result being valid for the plurality of frames; and wherein the processor is configured for executing a median filtering using the plurality of results for obtaining the combined result.

According to another embodiment, a method for determining a predetermined characteristic indicating that an audio signal was subjected to an artificial bandwidth limitation processing may have the steps of: evaluating a slope of a spectrum of the audio signal to obtain an slope evaluation result; and providing an information indicating that the audio signal has the predetermined characteristic dependent on an evaluation of the slope evaluation result; providing the information indicating that the audio signal has the predetermined characteristic by providing a respective information indicating a result for the frame for a plurality of frames of the audio signal for each of the plurality of frames, and obtaining a plurality of results based on the plurality of frames and combining the plurality of results so as to obtain a combined result being valid for the plurality of frames; and executing a median filtering using the plurality of results for obtaining the combined result.

Another embodiment may have a non-transitory digital storage medium having stored thereon a computer program for performing a method for determining a predetermined characteristic indicating that an audio signal was subjected to an artificial bandwidth limitation processing, the method having the steps of: evaluating a slope of a spectrum of the audio signal to obtain an slope evaluation result; and providing an information indicating that the audio signal has the predetermined characteristic dependent on an evaluation of the slope evaluation result; providing the information indicating that the audio signal has the predetermined characteristic by providing a respective information indicating a result for the frame for a plurality of frames of the audio signal for each of the plurality of frames, and obtaining a plurality of results based on the plurality of frames and combining the plurality of results so as to obtain a combined result being valid for the plurality of frames; and executing a median filtering using the plurality of results for obtaining the combined result, when said computer program is run by a computer.

According to a first aspect, the inventors have found out that by using a local maximum signal, being derived from the audio signals and by determining a similarity between segments of the local maximum signal, a secure and efficient identification of a characteristic related to a spectral enhancement processing may be obtained such that a respective post-processing may be implemented for the respective audio signal so as to reduce, for example, the tonal spike artifact and/or the beating artifact. Based on the evaluation of the signal, a side-information indicating the implemented audio processing may be not required such that a blind operation of the module is possible.

According to an embodiment of the first aspect, an apparatus for determining a predetermined characteristic related to a spectral enhancement processing of an audio signal comprises a deriver configured for obtaining a spectrum of the audio signal and for deriving information related to a fine structure of the spectrum. The apparatus comprises a determiner configured for determining a similarity in the fine structure of the spectrum. The apparatus further comprises a processor for providing an information indicating that the audio signal comprises the predetermined characteristic dependent on an evaluation of the similarity. For comparing a similarity between the segments of the information related to the fine structure, a low amount of computational effort may be used. Further, a precise and secure determination of similar segments indicating that a spectral enhancement processing may have been performed, may be obtained.

According to a further embodiment of the first aspect, a method for determining a predetermined characteristic related to a spectral enhancement processing of an audio signal comprises obtaining a spectrum of the audio signal and deriving information related to a fine structure of the spectrum. The method comprises determining a similarity in the fine structure such as between segments of the information related to the fine structure and comprises providing an information indicating that the audio signal comprises the predetermined characteristic dependent on an evaluation of the similarity.

According to a further embodiment of the first aspect, a non-transitory storage medium has stored there on a computer program having a program code for performing, when running on a computer, such a method.

According to a second aspect, the inventors have found out that by evaluating a spectrum of an audio signal with respect to a slope of the spectrum, a secure and efficient characterization of the audio signal so as to comprise a characteristic related to an artificial bandwidth limitation processing may be obtained so as to enable a respective post-processing, for example to reduce or eliminate a birdies artifact and/or a bandwidth limitation artifact. Based on the evaluation of the signal, a side-information indicating the implemented audio processing may be not required such that a blind operation of the module is possible.

According to an embodiment of the second aspect, an apparatus for determining a predetermined characteristic related to an artificial bandwidth limitation processing of an audio signal comprises a slope evaluator configured for evaluating a slope of a spectrum of the audio signal to obtain a slope evaluation result. The apparatus further comprises a processor for providing an information indicating that the audio signal comprises the predetermined characteristic dependent on an evaluation of the slope evaluation result. By basing the evaluation if the audio signal comprises a characteristic related to an artificial bandwidth limitation processing on the slope of the spectrum, e.g., a falling edge of the spectrum, a precise detection of the artificial bandwidth limitation processing may be obtained whilst using a low computational effort.

According to another embodiment of the second aspect a method for determining a predetermined characteristic related to an artificial bandwidth limitation processing of an audio signal comprises evaluating a slope of a spectrum of the audio signal to obtain a slope evaluation result. The method comprises providing an information indicating that the audio signal comprises the predetermined characteristic dependent on an evaluation of the slope evaluation result.

According to an embodiment of the second aspect a non-transitory storage medium has a stored there on a computer program having a program code for performing, when running on a computer, such a method.

Both, the first and second aspect allow for discriminating between audio signals or frames thereof being subjected to a respective processing and audio signals or frames thereof which have been un-subjected so as to avoid post-processing of un-subjected frames.

According to a third aspect the inventors have found that by performing a bandwidth extension for different portions having different signal characteristics of an audio signal differently, enhancement of the different portions and/or characteristics may be performed independently from each other so as to obtain a combined signal with a high quality comprising enhanced first portions and enhances second portions. Processing the different signal characteristics differently may allow for adapting the processing based on the respective characteristics.

According to an embodiment of the third aspect, an apparatus for processing an audio signal comprises a separator for separating a first portion of a spectrum of the audio signal from a second portion of the spectrum of the audio signal. The first portion has a first signal characteristic and the second portion has a second signal characteristic. The apparatus comprises a first bandwidth extender for extending a bandwidth of the first portion using first parameters associated with the first signal characteristic, for obtaining a first extended portion. The apparatus comprises a second bandwidth extender for extending a bandwidth of the second portion using second parameters associated with the second signal characteristic, for obtaining a second extended portion. The apparatus further comprises a combiner configured for using the first extended portion and the second extended portion for obtaining an extended combined audio signal. This may allow for enhancing the different portions having different signal characteristics independent from each other so as to obtain a combined audio signal with a high quality.

According to another embodiment of the third aspect a method for processing an audio signal comprises separating a first portion of a spectrum of the audio signal from a second portion of the spectrum of the audio signal, the first portion having a first signal characteristic and the second portion having a second signal characteristic. The method comprises extending a bandwidth of the first portion using first parameters associated with the first signal characteristic, for obtaining a first extended portion. The method comprises extending a bandwidth of the second portion using a second parameter associated with the second signal characteristic, for obtaining a second extended portion. The method further comprises using the first extended portion and the second extended portion for obtaining an extended combined audio signal.

According to another embodiment of the third aspect a non-transitory storage medium has stored there on a computer program having a program code for performing, when running on a computer, such a method.

According to a fourth aspect, the inventors have found that by phase-shifting a portion of an audio signal with respect to a different portion of the audio signal, a perceived roughness may be reduced. In particular, a portion that might be generated or copied for extending the bandwidth may be phase-shifted when compared to an un-extended spectrum.

According to an embodiment of the fourth aspect an apparatus for processing an audio signal comprises an anti-roughness filter for phase-shifting at least a portion of the audio signal so as to obtain a phase-shifted signal. The apparatus comprises a high-pass filter configured for filtering the phase-shifted signals so as to obtain a first filtered signal. The apparatus comprises a low-pass filter configured for a filtering the audio signal so as to obtain a second filtered signal. The apparatus comprises a combiner configured for combining the first filtered signal and the second filtered signal so as to obtain an enhanced audio signal. The apparatus allows for phase-shifting portions left by the high-pass filter when compared to portions left by the low-pass filter such that the first filtered signal may comprise phase-shifted portions when compared to the audio signal, the second filtered signal respectively. This may allow for obtaining a low roughness in the combined signal.

According to another embodiment of the fourth aspect a method for processing an audio signal comprises phase-shifting at least a portion of the audio signal so as to obtain a phase-shifted signal. The method comprises filtering the phase-shifted signals using a high-pass filter so as to obtain a first filtered signal. The method further comprises filtering the audio signal using a low-pass filter so as to obtain a second filtered signal. The method further comprises combining the first filtered signal and the second filtered signal so as to obtain an enhanced audio signal.

According to another embodiment of the fourth aspect a non-transitory storage medium has stored there on a computer program having a program code for performing, when running on a computer, such a method.

BRIEF DESCRIPTION OF THE DRAWINGS

Embodiments of the present invention will be detailed subsequently referring to the accompanying drawings, in which:

FIG. 20 shows a schematic flowchart of a method according to an embodiment of the third aspect;

FIG. 21 shows a schematic diagram of an apparatus according to an embodiment of the fourth aspect;

DETAILED DESCRIPTION OF THE INVENTION

Figure 1:
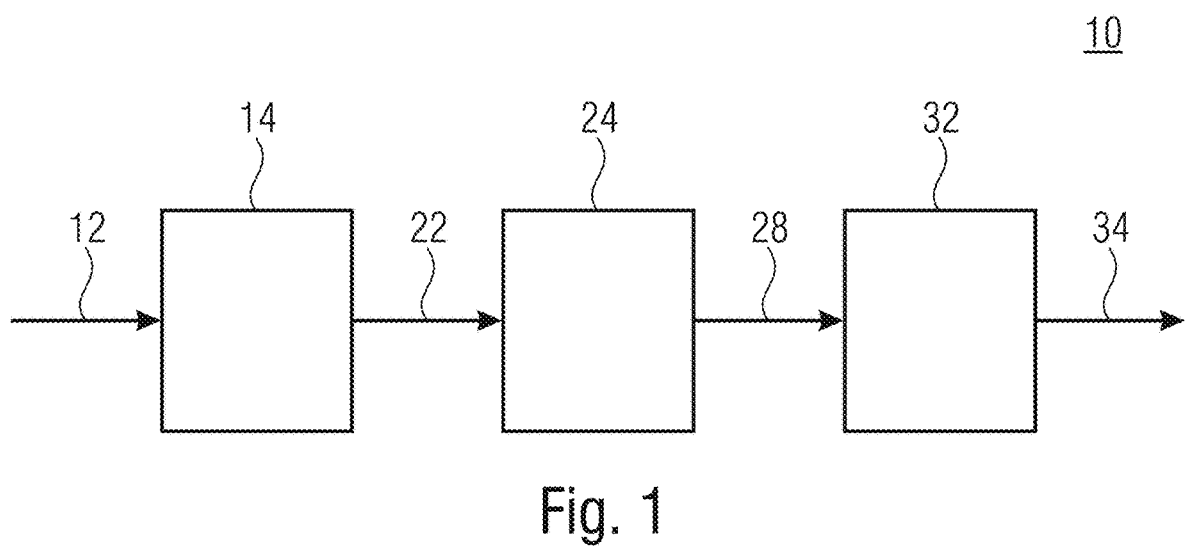
FIG. 1 shows a schematic block diagram of an apparatus for determining a predetermined characteristic related to a spectral enhancement processing of an audio signal, according to an embodiment of the first aspect.

Equal or equivalent elements or elements with equal or equivalent functionality are denoted in the following description by equal or equivalent reference numerals even if occurring in different figures.

It should also be noted that the embodiments described herein relate to digital signal processing. Therefore, all signals are band-limited to frequencies below half the sampling frequency due to the sampling. The (artificial) bandwidth limitation discussed herein refers to additional bandwidth limitation such that the bandwidth of the signal is smaller than the digital representation would allow.

The first aspect and the second aspect relate to identifying signal characteristics within an audio signal that indicate that the respective audio signal was subjected to a specific processing. By identifying the respective characteristic and parameters related thereto, appropriate actions and processing may be performed or executed so as to reduce or eliminate artifacts that might occur responsive to the processing. Therefore, reducing artifacts being possibly inserted into the processed audio signal may be understood as being related to the first aspect, the second aspect respectively.

The third and fourth aspects refer to post-processing audio signals. For post-processing audio signals so as to enhance an audio quality, information in connection with the previously performed processing of the audio signal may be used, for example, information as derived according to the first and second aspect and/or may be used in connection with different audio signals.

Therefore, in the following, reference will be made first to the first and second aspect before referring to the third and fourth aspect. The scope of the first aspect is the improvement of the sound quality of audio signals, in particular of audio signals that have been coded using a lossy compression or other signal processing. Spectral Band Replication (SBR) is a method for parametric audio coding for synthesizing high-frequency content of replicating parts of the audio signal spectrum from lower frequencies, typically guided by side information that is transmitted in the bitstream. The knowledge about the presence of SBR and the starting frequency at which SBR is in effect (or synonymic the cut-off frequency at which the signal has been bandlimited prior to SBR) is used for enhancing or improving the sound quality of audio signals. Embodiments according to the first aspect provide an analysis concept for retrieving this information from an audio signal after it has been decoded without using the information in the bitstream. The described concept is able to detect SBR and other processings that copy parts of the spectrum at lower sub-band and paste them to higher frequencies. Another example except SBR for such a method is, based on the specific configuration, Intelligent Gap Filling (IGF).

When compared to the method disclosed in U.S. Pat. No. 9,117,440 B2, the embodiments according to the first aspect improve the robustness of the analysis with respect to modifications of the spectral envelope by analyzing and probably exclusively analyzing the fine structure of the spectrum. In addition, it has less computational load, since the relationship is computed using summation of binary numbers instead of multiplication.

FIG. 1 shows a schematic block diagram of an apparatus 10 for determining a predetermined characteristic related to a spectral enhancement processing of an audio signal 12, for example, a SBR, and/or an IGF. The apparatus 10 comprises a deriver 14 configured for obtaining a spectrum of the audio signal 12 and for deriving information related to a fine structure of the spectrum. The fine structure may relate to course of spectral lines within the spectrum. Such information may be represented, for example, using a local maximum signal indicating the local extrema, e.g., maxima and/or minima within the spectrum. For example, the local maximum signal may have s predefined value such as a maximum value or a minimum value at a location of the local maximum an a different value at other locations. For example, at the other locations, the local maximum signal may comprise a minimum value. Alternatively, the local maximum signal may comprise a minimum value at the local maximum and a maximum value elsewise. Alternatively or in addition, the local maximum signal may represent both, the local maxima and the local minima. Thereby, the fine structure of the spectrum may be maintained while attenuating or excluding other information. By way of non-limiting example only, embodiments described herein may refer to a local maximum signal being derived by the deriver 14.

For deriving the local maximum signal from the spectrum, the deriver 14 may either derive or compute or determine the spectrum from the audio signal 12. Alternatively, the deriver 14 may receive a signal containing information indicating the spectrum or the spectrum itself. Thus, the illustrated signal 12 may be a signal in the time domain or in the frequency domain. The spectrum being derived by the deriver 14 or received by the deriver 14 may be, for example, a magnitude spectrum or a power spectrum. For deriving or computing such a spectrum, a short-term Fourier transform (STFT) or other suitable transforms may be used. By using the STFT, the audio signal 12 may be divided or separated in a number of suitable blocks and each block may be subjected to the STFT. This may allow to obtain a plurality of spectra of the audio signal, e.g., one spectrum for each block.

For example, sub-band signals may be computed using a filterbank. SBR is a processing where parts of the spectrum are replicated. The same is true for the harmonic transportation. In IGF some parts of the spectrum, for example, comprising a high-frequency range, are attenuated or set to 0 and afterwards refilled. When referring to SBR, the spectral envelope may be modified whereas the fine structure of the spectrum may be maintained. Therefore, embodiments according to the first aspect propose a concept that is robust to modifications of the spectral envelope. For this purpose, the deriver 14 is configured to derive a local maximum signal from the spectrum. The local maximum signal may be defined as a vector of a specific length, e.g., according to the frequency bins in the spectrum, whose elements are set to 1 at indices where the spectrum has a local maximum and set to 0 otherwise. It is to be mentioned that other rules may be applied. For example, additionally to the local maxima, local minima may be set to a specific value, e.g., 1. Alternatively or in addition, a different value, e.g., 0 or a value different from 1 may be used so as to indicate the local maxima and/or minima. This processing may be similar to a whitening or flattering operation that maintains the fine structure and removes all other information. The local maximum signal may allow for enhancing identification of similarities as the comparison may be implemented so as to focus on the structure of the compared segments.

Figure 2A:
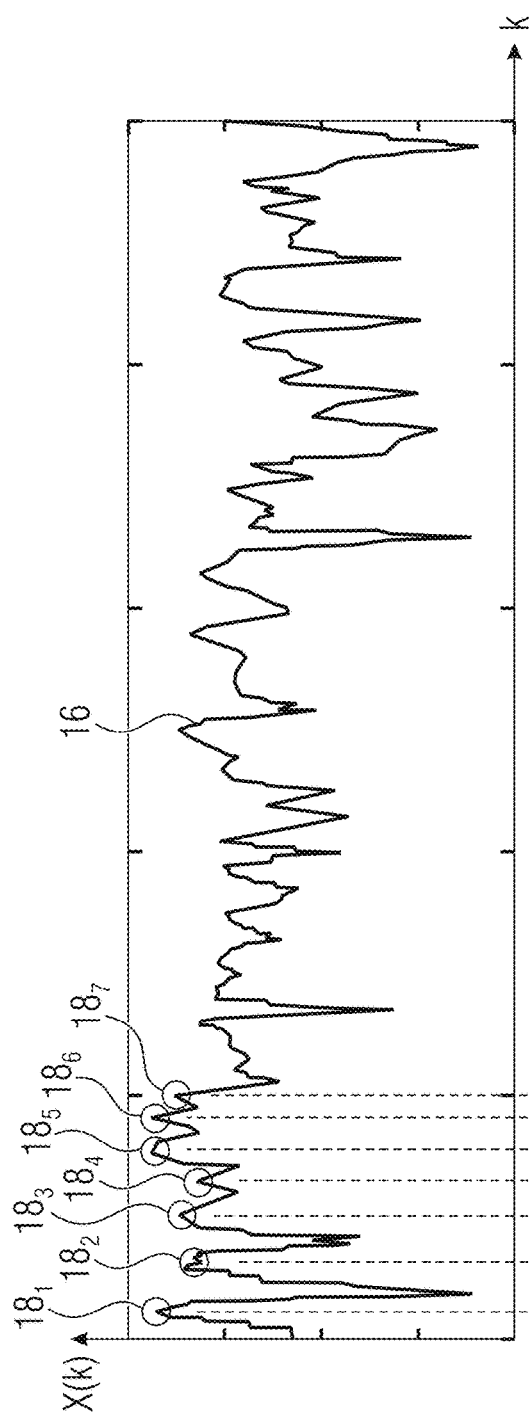
FIG. 2a shows a schematic graph illustrating an example spectrum according to an embodiment of the first aspect, that may be derived from an audio signal from which the spectrum of FIG. 1 may be obtained.

FIG. 2a shows a schematic graph illustrating an example spectrum 16 that may be derived from the signal 12 or may be the signal 12. The abscissa illustrates the frequency index k wherein the ordinate illustrates a magnitude value X(k) of the spectrum 16.

Figure 2B:
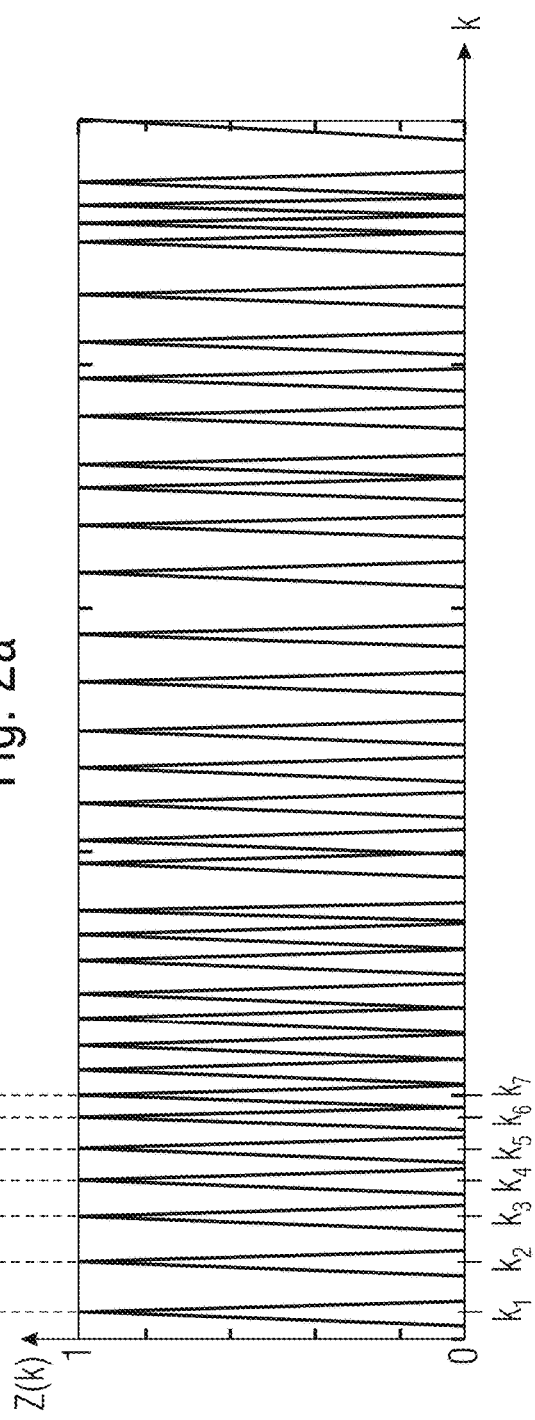
FIG. 2b shows a schematic example diagram of the local maximum signal over the same frequency abscissa as in FIG. 2a according to an embodiment of the first aspect.

FIG. 2b shows a schematic example diagram of the local maximum signal Z over the same frequency abscissa k. At frequency bins $k_1$ to $k_7$ at which the spectrum 16 comprises local maxima $18_1$ to $18_7$, the local maximum function Z(k) is set to a normalized maximum value such as 1 and set to a normalized minimum value such as 0 at other locations as well. The triangular shape in FIG. 2b may result from an interpolation between different frequency bins for a better understanding of the figures. The local maximum signal Z may comprise a same length as the spectrum X(k). The deriver 14 may be configured for providing a signal 22 containing information indicating the local maximum signal Z(k) being derived from the spectrum 16.

The apparatus 10 may comprise a determiner 24 configured for determining a similarity C(τ) between segments of the local maximum signal. For the detection of the spectral enhancement processing, the similarity between a first segment of the vector Z(k), $k=k_0 \ldots k_1$ and a second segment of the vector Z(k+τ) may be determined or computed by the deriver 24 as a function of the lag or shift τ. For example, the similarity C(τ) may be computed as the sum of the absolute values of the difference of the two vectors, i.e. the segments of the local maxima signal.

The segments to be compared may have the same length. The length depends on the frequency resolution at which the spectrum and the local maxima signal has been computed. The frequency resolution depends on the number of spectral coefficients that are computed. The number of coefficients for the spectrum and the local maxima signal are at least 16 or 16384 at maximum, but typically values between 256 and 4096 are chosen. The exact value may be selected depending on the sampling rate of the signal. The first segment may comprise elements of the local maxima signal vector that correspond, for example, to frequencies in the range between 2000 and 15000 Hz.

The parameter r may vary from 1 to a maximum possible value in the signal, for example, representing the maximum frequency or a maximum search frequency, e.g., related to a cut-of frequency in the audio signal 12. This may be represented as a determination rule $$C(\tau) = \sum_{k=k_0}^{k_1} |Z(k) - Z(k+\tau)|, \qquad (1)$$

Figure 3:
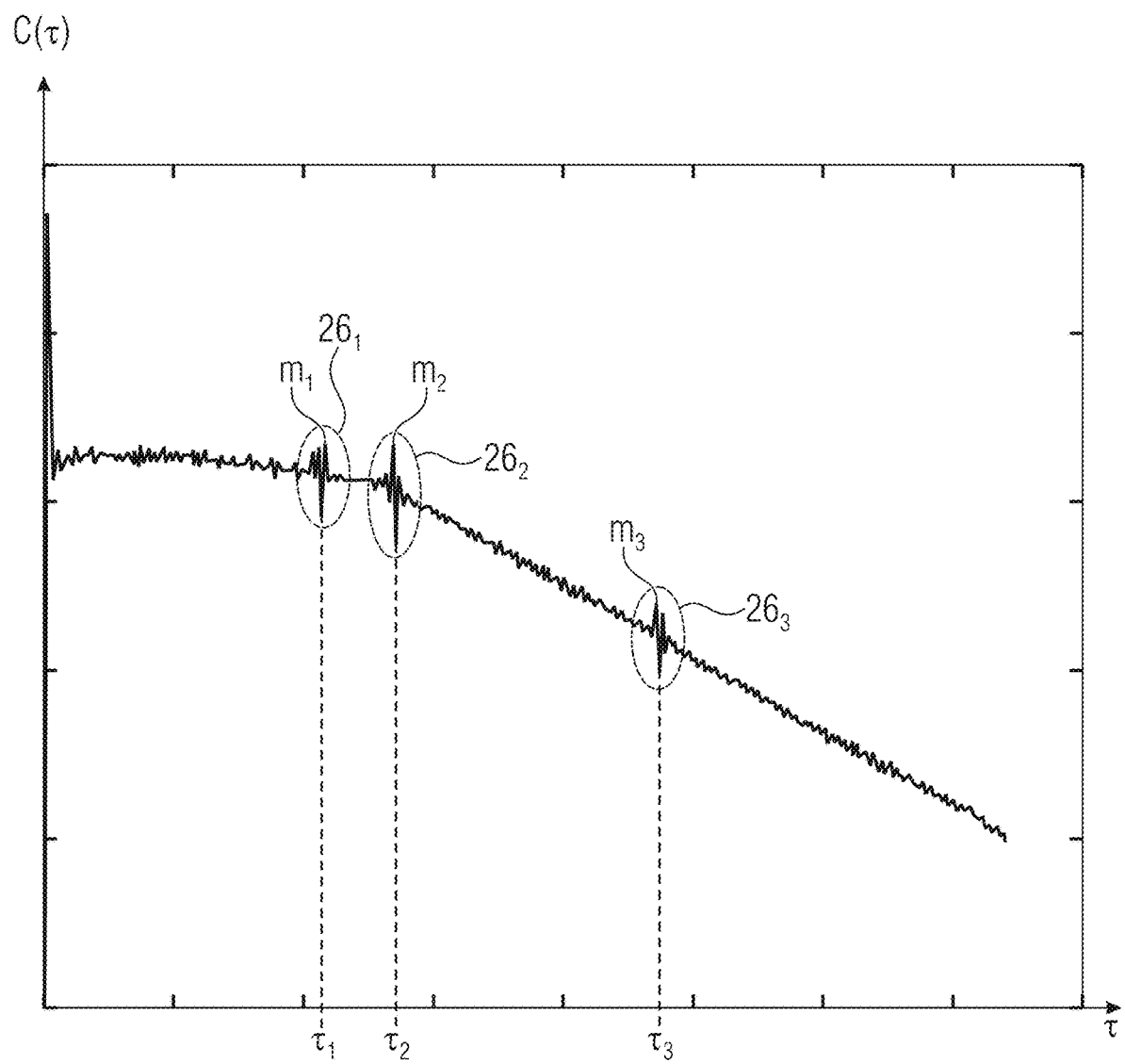
FIG. 3 shows a schematic graph according to an embodiment of the first aspect for determining the similarity using a determination rule.

FIG. 3 shows a schematic graph according to an example that may be obtained wherein determining the similarity using the determination rule given above. An abscissa of the graph shows the lag or shift $\tau$, wherein the ordinate shows a value of the similarity function $C(\tau)$.

By determining the similarity value $C(\tau)$ for a plurality of values of the parameter $\tau$, the graph illustrated in FIG. 3 may be obtained. In regions $26_1$ to $26_3$ variations in the signal may be obtained being associated with values $\tau_1$, $\tau_2$, $\tau_3$ respectively of the parameter $\tau$. Those variations may comprise a local maximum and/or a local minimum within the similarity function $C(\tau)$. I.e., by shifting or applying a lag $\tau_1$, $\tau_2$, $\tau_3$, the similarity function may show a local maximum or minimum and therefore indicating that by shifting a respective segment by the lag $\tau_1$, $\tau_2$, $\tau_3$, a similar signal is obtained which may be an indicator for a spectral enhancement processing. In the example given above, the maximum lag $\tau$ is 20000 Hz.

The determiner may be configured for selecting at least one local maximum and/or local minimum from the similarity values and/or may select the values derived thereof for determining the similarity. In particular, the variations at the regions $26_1$, $26_2$ and $26_3$ indicate a high similarity between the segments used at the shift indicated by the parameter $\tau_1$, $\tau_2$, $\tau_3$ respectively.

Referring again to FIG. 1, the determiner 24 may be configured for providing an information or signal 28 indicating a result of the similarity, for example, values $\tau_1$, $\tau_2$, and/or $\tau_3$ of the parameter $\tau$ or values is derived thereof. The apparatus 10 may comprise a processor 32 for providing an information 34 indicating that the audio signal 12 comprises the predetermined characteristic dependent on an evaluation of the similarity, for example, by evaluating the signal 28. Optionally, the obtained analysis function, i.e. the similarity function, may be further processed, for example, by the determiner 24 and/or the processor 32. For example, a bandpass filtering may be executed to attenuate offset components in the similarity function and to increase the contrast of the local maxima of interest within the similarity function $C(\tau)$. The apparatus 10, e.g., the determiner 24 may comprise a filter configured for filtering the similarity values so as to obtain filtered similarity values illustrated in FIG. 4. The processor 32 may be configured to provide the information 34 so as to comprise information indicating at least one of that the audio signal was subjected to the spectral enhancement processing, a start frequency and/or an end frequency of the spectral enhancement processing.

Figure 4:
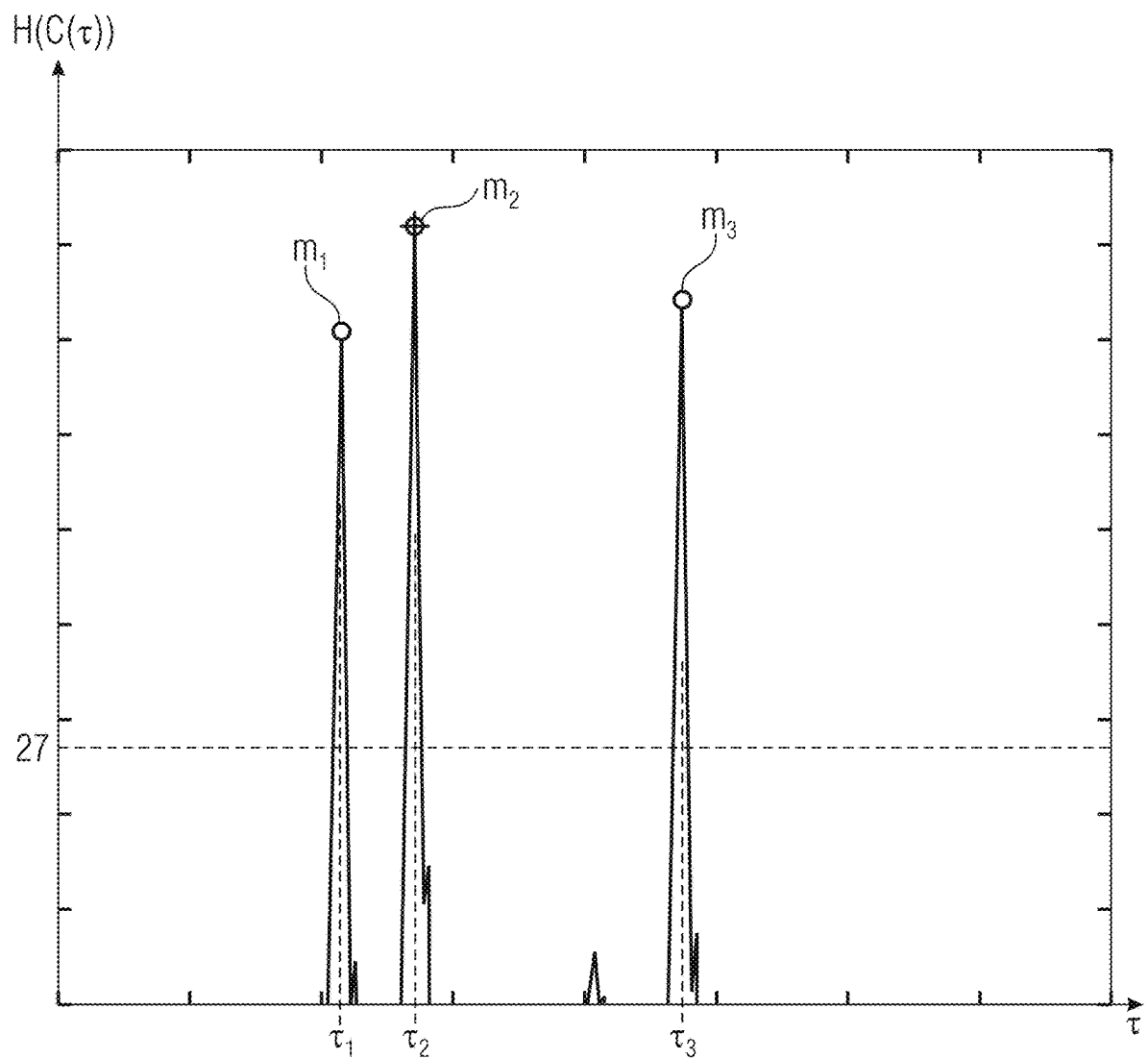
FIG. 4 shows an example of a post-processed similarity function according to an embodiment of the first aspect, illustrated as filtered value thereof.

FIG. 4 shows an example of a post-processed similarity function, illustrated as filtered value thereof, namely $H(C(\tau))$ on the ordinate over the abscissa showing the parameter $\tau$. For example, a filter is implemented as an Finite Impulse Response (FIR) filter having filter coefficients h=[−1 2 −1]. This means that the k-th output element of the filtered vector is computed by a linear combination of the elements at indices k−1, k, and k+1 weighted with h(1)=−1, h(2)=2 and h(3)=−1. This may be represented based on the determination rule:

$y(k)=h(1)x\_\{k-1\}+h(2)x\_\{k\}+h(3)x\_\{k+1\}$

The largest three local maxima at the parameter values $\tau_1$, $\tau_2$, and $\tau_3$ are caused from the spectral enhancement processing, for example, the spectral band replication. For example, SBR processing may be detected, when a small number of local maxima with large magnitude appear in the function. A small number may refer to a number of at most 15, at the most 10 or at the most 5 maxima. According to an embodiment, at most 13 local maxima are to be investigated to detect SBR according to common state-of-the-art configurations of SBR.

The large magnitude may refer to a value being at least 3 dB when compared to the regular signal, at least 5 dB or at least 6 dB. When referring again to FIG. 3, the local maxima in the regions $26_1$, $26_2$ and $26_3$ may refer to the signal beside the respective region as being noise. Such noise may be attenuated by the post-processing so as to enhance maximum determination as described in connection with FIG. 4. A large magnitude of the local maxima is defined as being larger than a threshold. The exact value of the threshold may be set, e.g., manually, to be in the range of 0.1 and 10, depending on the number of values that have been used to computing the similarity function. Normally, a value of 5 may be used.

I.e., the processor 32 may be configured for evaluating a number of local maxima 26 of similarity values or values derived thereof and for evaluating an amplitude of the local maxima 26. The processor 32 may be configured for providing the information 34 indicating that the audio signal 12 comprises the predetermined characteristic when the number of maxima 26 that comprises at least an amplitude threshold value 27 is below a number threshold value, i.e., a number of local maxima exceeding the amplitude threshold 27 value is low enough.

In other words, FIG. 4 shows the similarity function of the post-processing. Local maxima are shown as a circle, the global maximum is highlighted by a cross. The determiner 24 may be configured for selecting the at least one local maximum from the filtered similarity values. Harmonic signals consist of one or more sinusoids with a fundamental frequency and their harmonics, i.e. partial tones whose frequencies are approximately integer multiples of a fundamental frequency. Therefore, one or more local maxima can appear in the similarity function such as an auto correlation function (ACF) To discriminate between local maxima corresponding to harmonic partial tones and SBR or other spectral enhancement processing, the search range may be set to appropriate values, being distinctly larger, for example, for SBR than for harmonic partial terms. Thus, the processor 32 may be configured for excluding harmonics of the audio signal from the evaluation of the similarity. This may be done by selecting those parts of the spectrum of the audio signal which are expected to have a low amount or even no harmonics.

Detecting the local maxima at the parameter values $\tau_1$, $\tau_2$, and $\tau_3$ may be a sufficient indicator for the presence of the spectral enhancement processing. However, it may be of advantage to further estimate the start frequency of the spectral enhancement processing, for example, the SBR. The result of the similarity function or the local maximal may describe the shift at which a portion of the spectrum has been copied and pasted to. For completeness, the information about the start and stop frequency of the source sub-band spectrum or the destination sub-band spectrum may be of interest.

Figure 5:
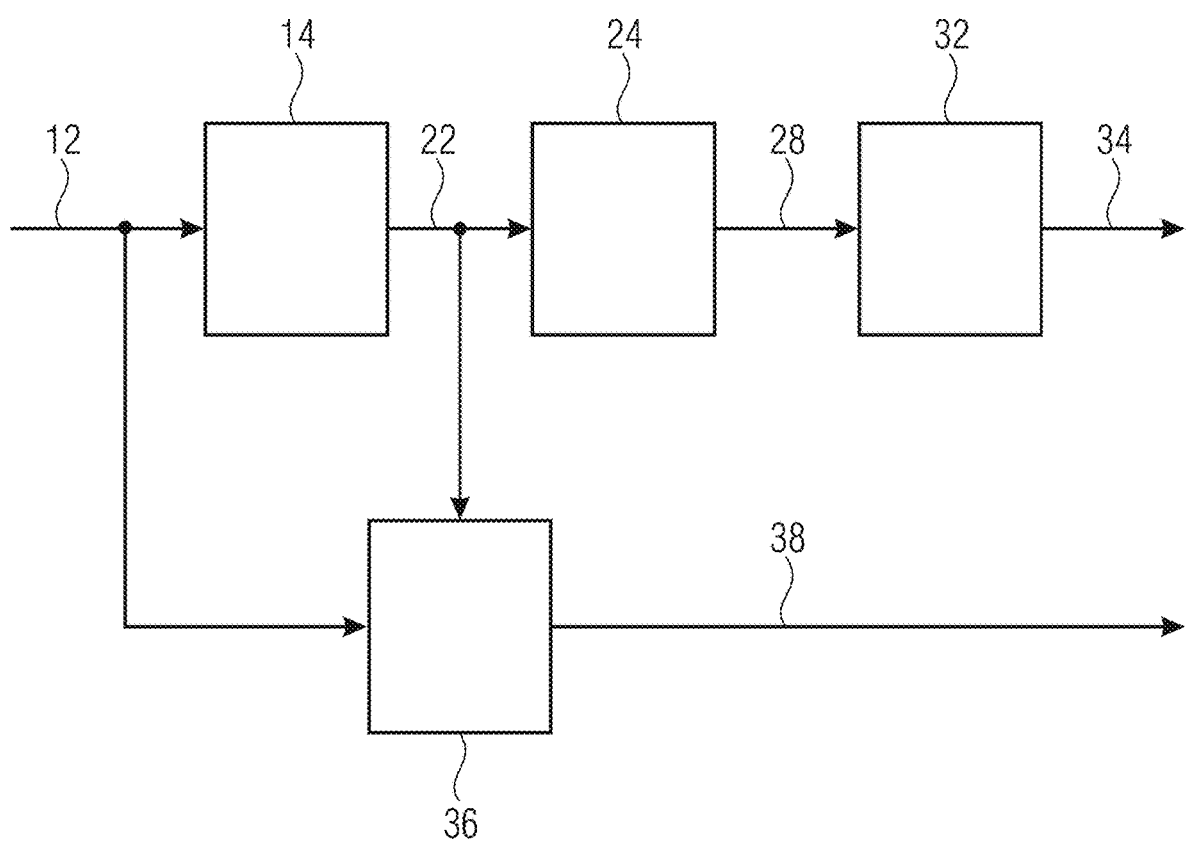
FIG. 5 shows a schematic block diagram of an apparatus according to an embodiment of the first aspect comprising a frequency estimator.

FIG. 5 shows a schematic block diagram of an apparatus 50 according to an embodiment. The apparatus 50 may be an extended version of the apparatus 10 and may further comprise a frequency estimator 36 configured for determining a start frequency and/or a stop frequency of the spectral enhancement processing. The frequency estimator 36 may be configured for providing an information or a signal 38 comprising the respective information indicating the start frequency and/or the stop frequency. The frequency estimator 36 may be configured for using the local maximum signal Z(k), e.g., by obtaining or receiving the signal 22, for determining an element similarity between an element of a first segment of the local maximum signal and a corresponding element of a second segment of the local maximum signal. The second segment may be shifted with respect to the first segment by a number of r samples. This may be referred to as a local similarity analysis (LSA). The input may be the representation of the fine structure of the magnitude spectrum, e.g. the local maximum signal Z(k). The frequency estimator 36, when executing LSA, may operate in the element-wise similarity between the k-th element in the first vector Z(k) and the element at position k+τ, Z(k+τ). To this end, the local similarity matrix may be computed as absolute value of the difference of the two binary numbers Z(k) and Z(k+τ) according to the determination rule $$L(k,\tau)=|Z(k)-Z(k+\tau)| \quad (2)$$

The value L(k,τ) of the local similarity matrix may then be processed by recursive averaging over time. This may be performed according to the determination rule.

$$L(k,\tau)=bL(k,\tau)+(1-b)B(k,\tau), \quad (3)$$

where B(k,τ) denotes a buffer that stores the output of the recursive averaging from the preceding time step (frame) of the audio signal and 0<b<1 is a time constant that controls the temporal averaging. Thus, the frequency estimator 36 may be configured for subjecting the element similarity of a plurality of elements for the first and second segments to a recursive averaging over time so as to obtain an averaged element similarity and for determining the start frequency and/or the end frequency using the averaged element similarity. The temporal averaging may optionally be only applied when the current frame is not silent, i.e., its energy is larger than a threshold 27 characterizing a silent frame from a non-silent frame.

A frame may be determined as being silent if its energy is smaller than a threshold, where the exact value of the threshold may be set dependent on the length of the frame and the range in which the sample values are represented. In general such threshold may be selected such that it equals the energy of a pink noise signal that is scaled to be just audible when played back with a typical sound reproduction equipment (a mobile phone or a TV set) at an average to high volume setting.

I.e., the frequency estimator may be configured for subjecting the element similarity of a plurality of elements of the first and second segments to a recursive averaging over time so as to obtain an averaged element similarity and for determining the start frequency and/or the end frequency using the averaged similarity. Each sample of the spectrum may be associated with a frame. The frequency estimator may be configured to exclude frames from the recursive averaging over time having a spectral energy below an energy threshold level 27, the energy threshold level 27 being related to a considering if the frame or spectrum is silent or not. Thereby, inconsistent results may be avoided by excluding frames being considered to be silent as those frames may also be considered to be un-subjected to audio processing.

As described in connection with FIG. 4, the result of the recursive averaging L(k,τ) may be processed by the band-pass filtering to attenuate the offset component and to increase the contrast of the local maxima of interest, e.g., by convolving each row of the matrix with a kernel such as h=[−1 2 −1].

Figure 6A:
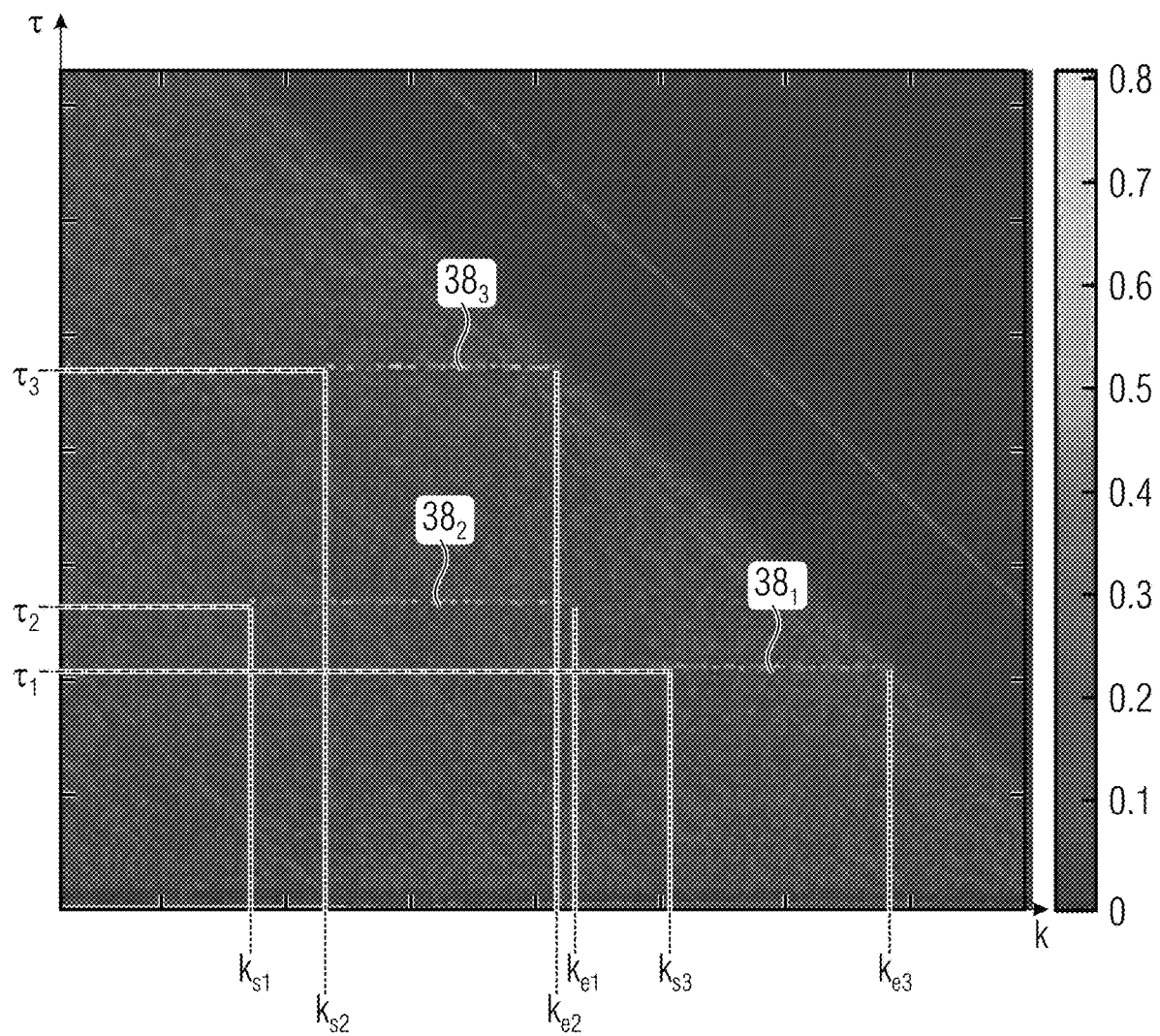
FIG. 6a shows a schematic graphical representation of an example local similarity matrix according to an embodiment of the first aspect.

FIG. 6a shows a schematic graphical representation of an example local similarity matrix L(k,τ), wherein an abscissa illustrates the frequency bins (positions) k and the ordinate represents the lag τ. For a better visibility, the absolute values of the matrix L are shown. The unit for the position k and lag τ are frequency bins. By non-limiting sample, one frequency bin may have a value of 46.9 Hz, wherein any other smaller or larger value may be obtained. Thus, FIG. 4 shows an example for a post-processed similarity matrix L(k,τ) containing the following information:

The global similarity as described in connection with FIG. 4 can be obtained from L(k,τ) by summing along the x-axis (parameter k) and taking the absolute value of the result. Three horizontal lines $38_1$, $38_2$ and $38_3$ in the given example correspond to the local maxima of FIG. 4. The lines $38_1$, $38_2$ and $38_3$ may correspond to lines along which the respective value of the function L(k,τ), i.e., the sum of values, exceeds a certain threshold value, for example, 0.1, 0.2, or 0.3 of the value range ranging from 0-1. The start position and the end position of the horizontal lines correspond to the start frequency $k_{s1}$, $k_{s2}$, $k_{s3}$ respectively and end frequency $k_{e1}$, $k_{e2}$, $k_{e3}$ respectively of repeated parts of the spectrum.

Figure 6B:
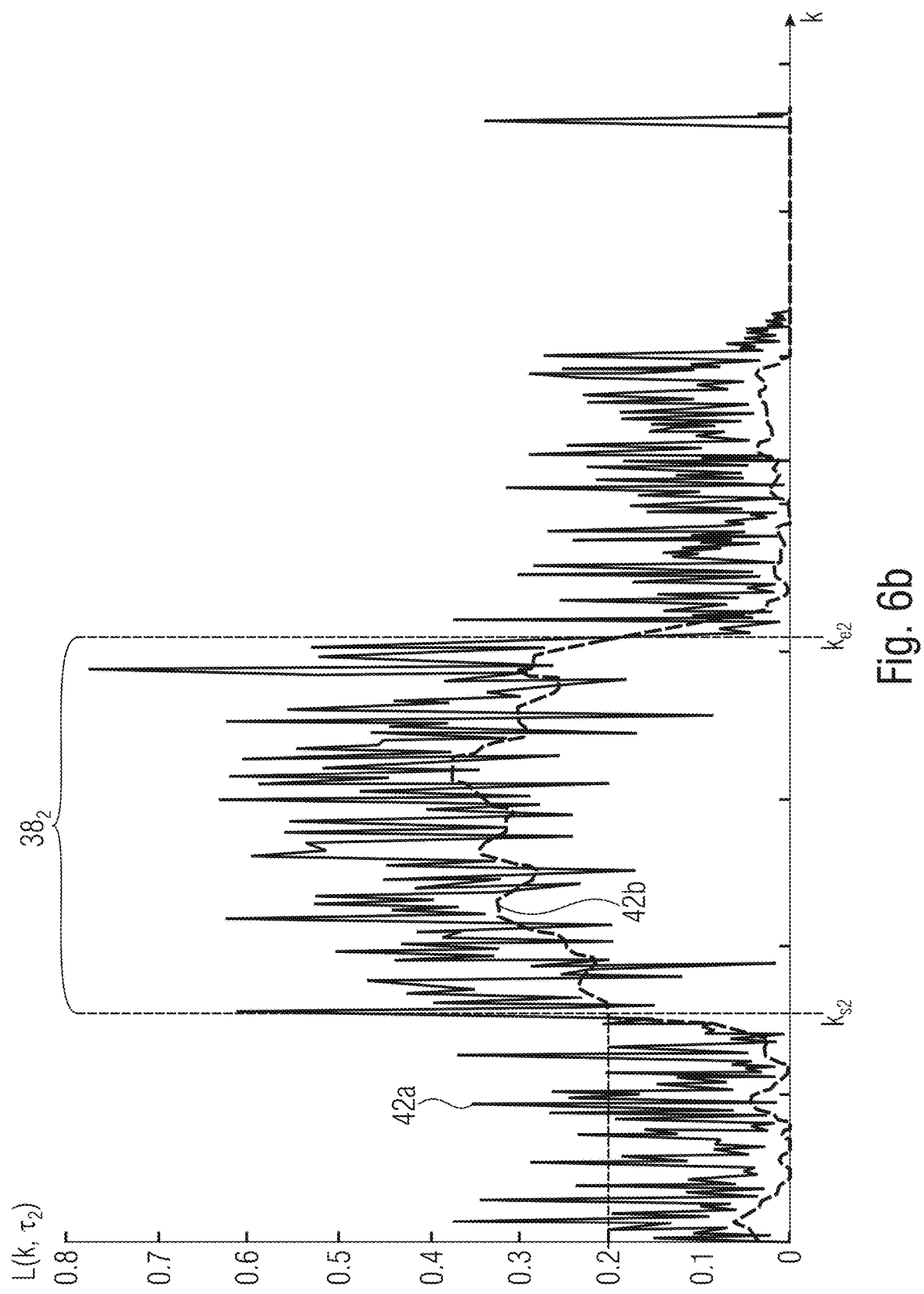
FIG. 6b shows a schematic diagram of a line of the matrix illustrated in FIG. 6a according to an embodiment of the first aspect.

FIG. 6b shows a schematic diagram of a line of the matrix illustrated in FIG. 6a at the parameter $\tau_2$. In FIG. 6b, a graph 42a shows, for example, unfiltered values, wherein a graph 42b may show averaged or filtered values. For example, the graph 42b is compared to a threshold value 27 being, for example, 0.2. A range in which the local similarity matrix L(k,τ), their averaged value respectively, exceeds the threshold value 27, corresponds to the horizontal line $38_2$ at index $\tau_2$. Alternatively or in addition, a steepness (ΔL(k,τ)/k) of the local similarity matrix may be evaluated. A steep rising edge rising with a certain value, e.g., at least 0.5, at least 1 or at least 1.5 may be identified as an edge identifying the start frequency $k_{s2}$. Accordingly, a respective steep and high falling edge may identify the end frequency $k_{e2}$. Alternatively or in addition, a temporal averaging may be executed on the input spectrum, the input spectral respectively and on the final result or results. This may allow for preventing false positive detections using the temporal averaging. A temporal averaging of the input spectral may be referred to as a pre-processing, wherein a temporal averaging of the final result may be referred to as a post-processing. A reason for preventing false positive detections is that the local maxima are typically time-variant due to partial tones. I.e., because different musical tones are played in a melody or because of harmonic changes in the music, the local maxima may vary over time. In contrast hereto, some parameters of spectral enhancement processing such as SBR may be a technical process which is typically time-invariant, e.g., an edge frequency from which the spectrum is enlarged, e.g., a cut-off frequency of a filtering performed previously, or the start and end frequencies of the frequency range that is replicated.

According to an example, for estimating the start frequency, the LSA matrix L is analyzed to identify the start position and end position of each horizontal line. The start position $k_s$ may correspond to the start of the spectrum that has been replicated. The end position $k_e$ may correspond to the end of the spectrum that has been replicated. The largest end position of the original spectrum that has been used for replication is the estimated value for the start frequency at which the SBR is effective. This may be, for example, $k_{e3}$ in FIG. 6a.

First, the global similarity may be computed as $$C(\tau) = \sum_{k=v_1}^{v_2} L(k, \tau), \quad (4)$$

Where $v_1$ and $v_2$ are parameters that determine a range of values $L(k,\tau)$ and may be selected, for example, so as to define the range of $L(k,\tau)$ having a value within a range of at least 500 Hz and at most 15 kHz.

Then, local maxima $m_i$, i.e., 26 in $C(\tau)$ are detected that are larger than a threshold, see, for example, FIG. 4. For each local maxima, the corresponding rows in $L(k,\tau)$ are analyzed. For example, the second local maximum $m_2$ indexes the row $R_2=L(k,\tau_2)$ and is shown in FIG. 6b. For this local maximum a value of $\tau=133$ may be valid and may start from $k=74$ in accordance with FIG. 5.

The start index $k_s$ and the end index $k_e$ may be computed by first smoothing the respective lines $R_i$ so as to obtain, for example, the graph 42b, e.g., by computing a temporal or moving average of a few adjacent values, for example, at least 3, at least 5 or at least 10. Then, the positions at which the smoothed line has the steepest increasing and decreasing slopes are detected. Alternatively or in addition, the slope exceeding a threshold value such as, for example, 0.2 may be a criteria for evaluating the respective line. I.e., the frequency estimator 36 may be configured for subjecting the element similarity of a plurality of elements of the first and second segments to a recursive averaging over time so as to obtain an averaged element similarity 42b and for determining the start frequency and/or the end frequency using the average element similarity 42b. Alternatively or in addition, the apparatus may be configured for performing a temporal averaging of the spectrum, of the local maximum signal or a signal derived thereof, wherein the processor may be configured for providing the information indicating that the audio signal comprises the predetermined characteristic based on a temporal average information of the spectrum, the local maximum signal or a signal derived thereof.

Referring again to FIG. 6a, there are three prominent horizontal lines $38_1$, $38_2$ and $38_3$ for the given examples at indices $\tau_1$, $\tau_2$ and $\tau_3$. The line at index $\tau_2$ may correspond to the first part of the spectrum that has been replicated as showing the earliest beginning, i.e., the lowest parameters $k_s$. The horizontal line starts at index $k_{s1}$ and may correspond to the lag $\tau_2$. Therefore, the first replicated part of the spectrum starts $k_{s2}$ and has been copied to the index $k_{s2}+\tau_2$. By a non-limiting example, $\tau_1$ may be 104, $\tau_2$ may be 133 and $\tau_3$ may be 236. $k_{s2}$ may comprise, for example, a value of 74. Therefore, the first replicated part of the spectrum starts at index 74 and may have been copied to the index 74+133. This index therefore corresponds to the frequency at which the spectral enhancement processing (SBR) is in effect.

The frequency estimator 36 described in connection with FIG. 5 may be configured for computing the local similarity matrix or a different local similarity description. By non-limiting example only, a vector or other row of values having a predetermined structure such as each row being attached to a previous row may allow for a same information. The frequency estimator 36 may determine a the local similarity description (local similarity matrix L) and may be configured for determine portions therein, e.g., lines, that indicate the bandwidth extension processing. For determining the portions indicating the bandwidth extension processing, a steepness of the signal within the local similarity description and/or reaching or exceeding of the threshold value 27 may be evaluated by the frequency estimator 36.

Although having been described as evaluating rows, it is clear that the local similarity matrix L may comprise a different structure, e.g., having switched rows to columns and vice versa or the like. The frequency estimator may thus be configured for determining the local similarity matrix L as the local similarity description and for determining the start frequency $k_s$ and/or the end $k_e$ frequency of the spectral enhancement processing using a steepness between values (e.g., adjacent values within a row or column) in rows or columns and/or using an evaluation of values in the rows or columns at least reaching or even exceeding the threshold value 27.

Figure 7:
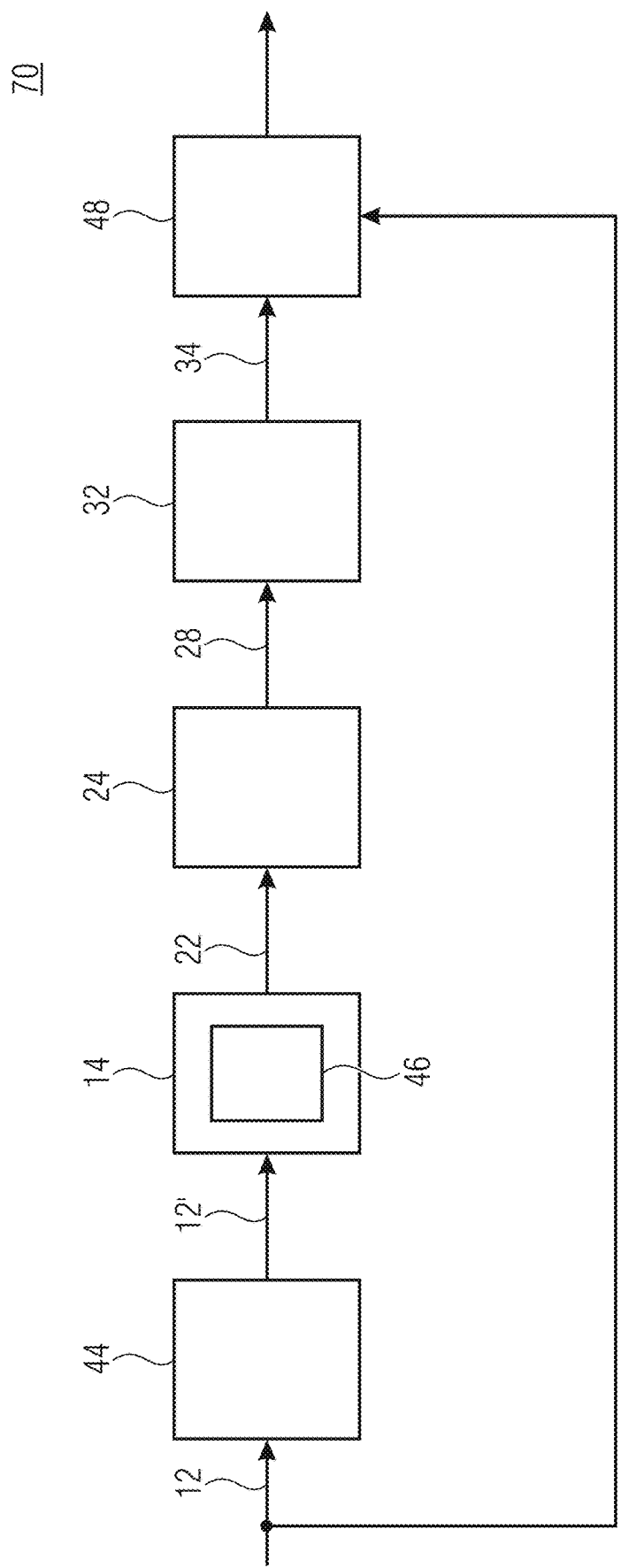
FIG. 7 shows a schematic block diagram of an apparatus according to an embodiment of the first aspect, comprising a spectrum calculator.

FIG. 7 shows a schematic block diagram of an apparatus 70 extending the apparatus 10. Although being explained as extending the apparatus 10, the explanation given in connection with FIG. 7 may also be used to extend the apparatus 50. The apparatus 70 may comprise a spectrum calculator 44 configured for receiving the audio signal 12 as a signal in the time domain and configured for calculating the spectrum from the audio signal 12 and to provide a signal 12' comprising the spectrum. Based thereon, the deriver 14 may be configured for receiving the spectrum 12'. Alternatively, the deriver 14 may be configured to derive the spectrum 12' on its own.

The determiner 14 may comprise a filter 46 configured for filtering the similarity values so as to obtain filtered similarity values as described in connection with FIGS. 3 and 4. The determiner 14 may be configured for selecting the at least one local maximum from the filtered similarity values for further consideration, for example, as row index in the similarity matrix $L(k,\tau)$. I.e., selection of a local maximum from the similarity values or values derived thereof may refer to a further use thereof for determining a start frequency and/or an end frequency of the spectral enhancement processing.

The apparatus 70 may comprise a signal enhancer 48 configured for receiving the audio signal 12 and receiving the information that the spectral enhancement processing has been performed, for example, by receiving the information 34. The signal enhancer is configured for reducing artifacts caused by the spectral enhancement processing of the audio signal using the information 34, i.e., dependent on the information indicating that the audio signal comprises the predetermined characteristic and optionally comprising further details such as the start frequency and/or the stop frequency of a replication process.

Figure 8:
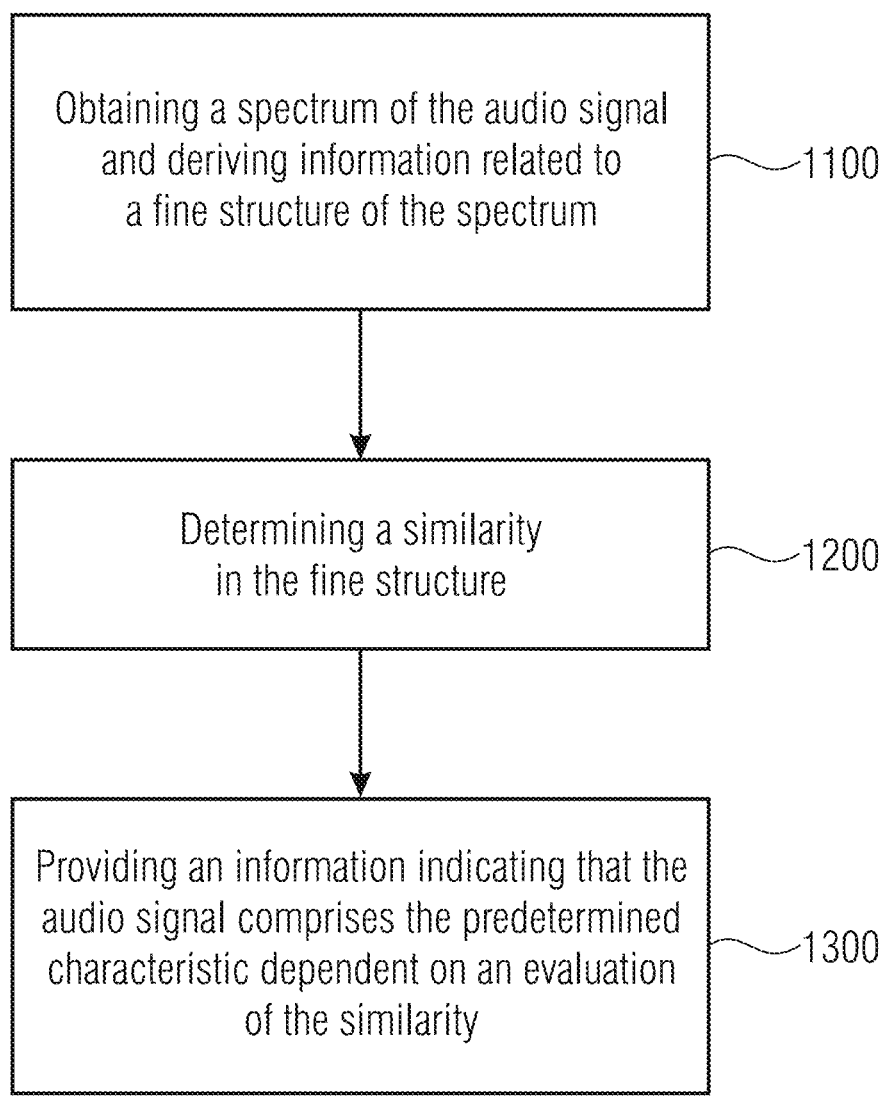
FIG. 8 shows a schematic flow chart of a method for determining a predetermined characteristic related to a spectral enhancement processing of an audio signal according to an embodiment of the first aspect.

FIG. 8 shows a schematic flow chart of a method 1000 for determining a predetermined characteristic related to a spectral enhancement processing of an audio signal. The method 1000 comprises a step 1100 in which a spectrum of the audio signal is obtained and information related to a fine structure of the spectrum is derived, e.g., the local maximum signal. A step 1200 comprises determining a similarity in the fine structure between segments of the local maximum signal. A step 1300 comprises providing an information indicating that the audio signal comprises the predetermined characteristic dependent on an evaluation of the similarity.

In the following, reference will be made to the second aspect. According to the second aspect, it is in the scope to improve the sound quality of audio signals, in particular of audio signals that have been coded using lossy compression.

The described concept is related to the bandwidth of audio signal which is in digital signal processing applications limited. The concept proposes a signal analysis concept detecting the presences of (artificial) bandwidth reduction (BR) and for estimating the cut-off frequency at which BL has been in operation. The obtained results are used to control subsequent processing for restoring the bandwidth by means of bandwidth extension (BWE) and also for controlling the improvement of the sound quality by other means such as filtering.

For the enhancement of the sound quality it of crucial importance to discriminate between a signal having originally a low bandwidth (e.g., a low note played on the basin) and a signal that has been band limited by means of a signal processing, e.g., due to lossy encoding or down sampling. Such discrimination is not possible by analyzing the signal "to find the highest frequency present in the signal", i.e., by determining the frequency above which only negligible energy is present as described in [1]. In contrast, the second aspect proposes to evaluate additional information as described in the following.

The aim of the proposed artificial bandwidth limitation analysis (ABLA) is two-fold:
1). To detect the presence of bandwidth reduction (BR) in the input signal that is likely to be caused by lossy compression or other signal processing and therefore considered as an artifact. The output may be, for example, a binary variable, here referred to as D where D=1 if BL has been detected and 0 otherwise.
2). To estimate the cut-off frequency of the bandwidth limitation. The estimated quantity is referred to fc.

Figure 9:
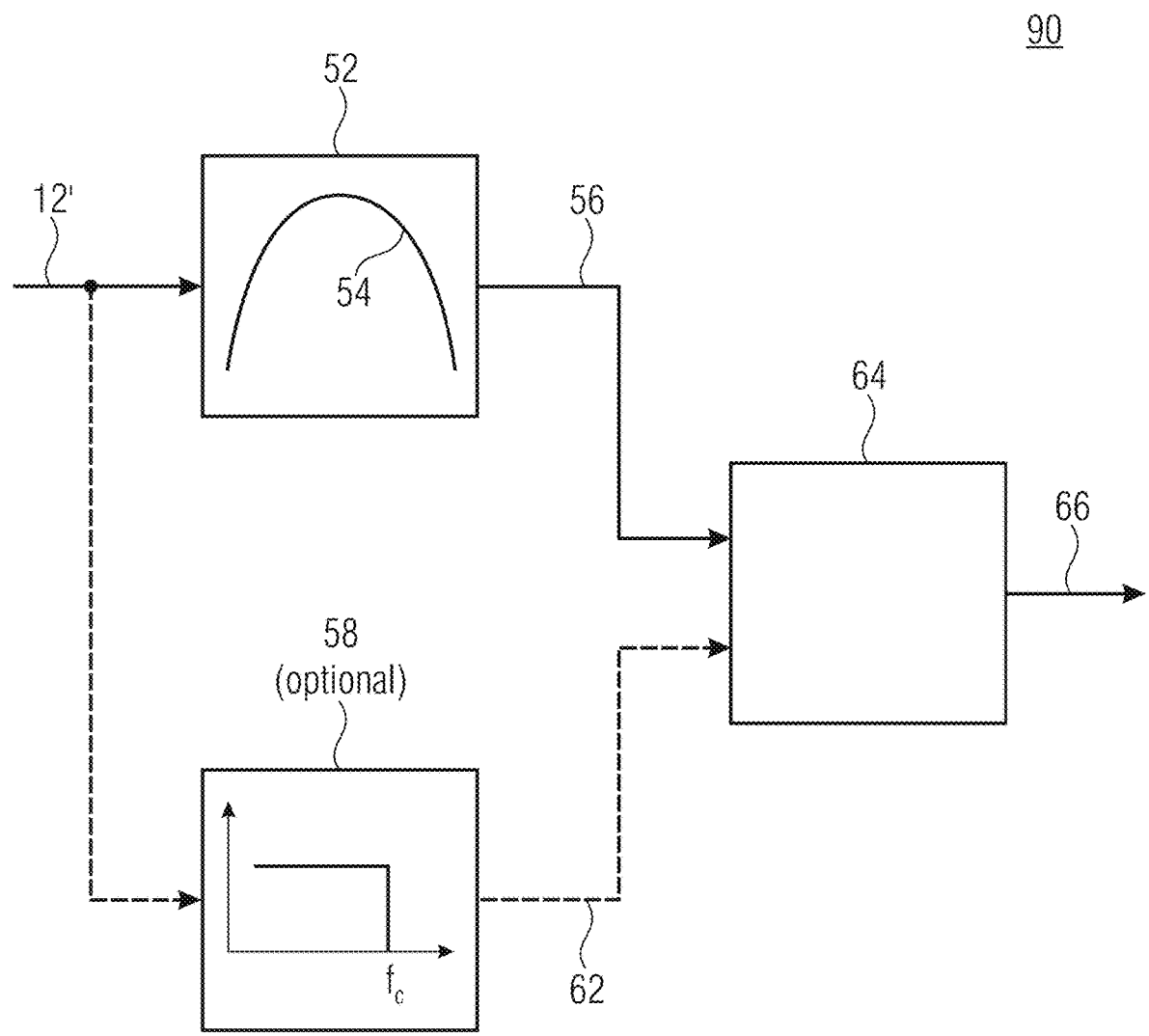
FIG. 9 shows a schematic block diagram of an apparatus according to an embodiment of the second aspect.

FIG. 9 shows a schematic block diagram of an apparatus according to an embodiment of the second aspect. The apparatus may be used for determining a predetermined characteristic related to an artificial bandwidth limitation processing of an audio signal. The apparatus 90 comprises a slope evaluator 52 configured for evaluating a slope of a spectrum of the audio signal 12, for example, the spectrum 12'. The slope evaluator 52 may be configured for providing a slope evaluation result 56. The slope evaluation result 56 may comprise information about a maximum, minimum or average value of the slope (envelope curve) of at least a part of the spectrum, about rising or falling edges within the spectrum or the slope thereof or other information relating to the slope 54.

The apparatus 90 may optionally further comprise a frequency evaluator 58 configured for evaluating a cut-off frequency $f_c$ of the spectrum 12' of the audio signal to obtain a frequency evaluation result 62 comprising information indicating the cut-off frequency $f_c$.

The apparatus 90 comprises a processor 64 for providing an information indicating that the audio signal comprises the predetermined characteristic related to the artificial bandwidth limitation processing. The processor is configured for using the slope evaluation result for providing the information indicating that the audio signal comprises the predetermined characteristic, i.e., the processor may provide the information dependent on the slope evaluation result. For example, this may allow for a decision whether the audio signal uses post-processing, e.g., in terms of a yes/no information or a binary decision. This may allow for excluding such frames from post-processing that are evaluated as not comprising the respective characteristic. Those frames may be identified as being unsubjected to artificial bandwidth limitation and therefore, post-processing has to be avoided. As an option, the apparatus may comprise the frequency evaluator 58 for determining the cut-off frequency. This may allow for identifying further information being used for post-processing, e.g., of subjected frames. Thus, optionally, the processor may be configured for providing the information indicating that the audio signal comprises the predetermined characteristic dependent on an evaluation of the slope evaluation result 56 and the frequency evaluation result 62. By evaluating the slope evaluation result 56 and the frequency evaluation result 62 for the spectrum 12' and/or for further frames of the audio signal resulting in further spectra 12', the processor 64 may derive information if the audio signal from which the spectrum 12' is derived was subjected to the artificial bandwidth limitation. For example, the slope evaluator 52 may be configured for evaluating the slope for an attenuation within the spectrum. The spectrum may be quantified or evaluated with respect to a steepness of the slope, i.e., as indicated by a role-off factor.

By way of example, the slope evaluator 52 may be configured for evaluating an attenuation within the spectrum 12' and for providing the slope evaluation result 56 so as to indicate a measure for the attenuation. The processor 64 may be configured providing the information 66 indicating that the audio signal comprises the predetermined characteristic if the measure for the attenuation is at least a steepness threshold value. Optionally, the apparatus may comprise a resampling evaluator, for example, being a part of the processor 64 or being implemented separately. The resampling evaluator may be configured for evaluating the audio signal for a predetermined characteristic related to an up sampling. Up sampling may be implemented by using a sampling frequency, for example, a common sampling rate may be 11,025 Hz, 22,050 Hz and/or 32,000 Hz. The apparatus 90 and/or 120 may be configured to adapt frequency ranges of the slope evaluator 52 and/or of the frequency evaluator 58 based on the sampling frequency in a case where resampling is detected. By using resampling, the frequency range of the spectrum may be adapted or increased, wherein a low sampling rate may correspond to a low frequency range and a high sampling rate may allow the spectrum to contain high frequency ranges according to the Nyquist criterion. The resampling evaluator may be configured for observing or evaluating a specific set of expected sampling rates and may evaluate, if at this frequency there is a significant decrease in the spectrum and if there is no more significant energy above. In such a case, where a steep edge in the slope as described before and an absence of significant energy above an energy threshold value is present, the energy evaluator may consider the audio signal as being resampled using the respective resampling frequency or sampling rate. The resampling evaluator may be configured for obtaining a negative evaluation result when at the determined or evaluated frequency corresponding to the sampling rate the determination rule $X(k)$>threshold applies, meaning that a value of the spectrum at the frequency k is larger than a threshold indicating that at the point k there is significant energy within the spectrum. Further the determination rule $X(k)$<$X(k+1)$−offset parameter may apply, indicating that with increasing frequency k+1 the spectrum, the energy thereof respectively, increases. This consideration may be normalized by subtracting the offset parameter, for example, 0.1, 0.2, 0.3, 0.5 or 1 dB or a different value, i.e., the spectrum has to increase more than the offset parameter for fulfilling the determination rule.

This allows excluding effects caused by noise or the like. Thus, the magnitude does increase towards higher frequencies at frequency point k above a bandwidth limitation more than 0.5 dB. The threshold may be, for example, −30 dB, −40 dB, −50 dB, or −60 dB as explained above. This means, that for a negative decision there is either no steep attenuation or beyond the respective frequency value there is an increased magnitude.

Figure 11:
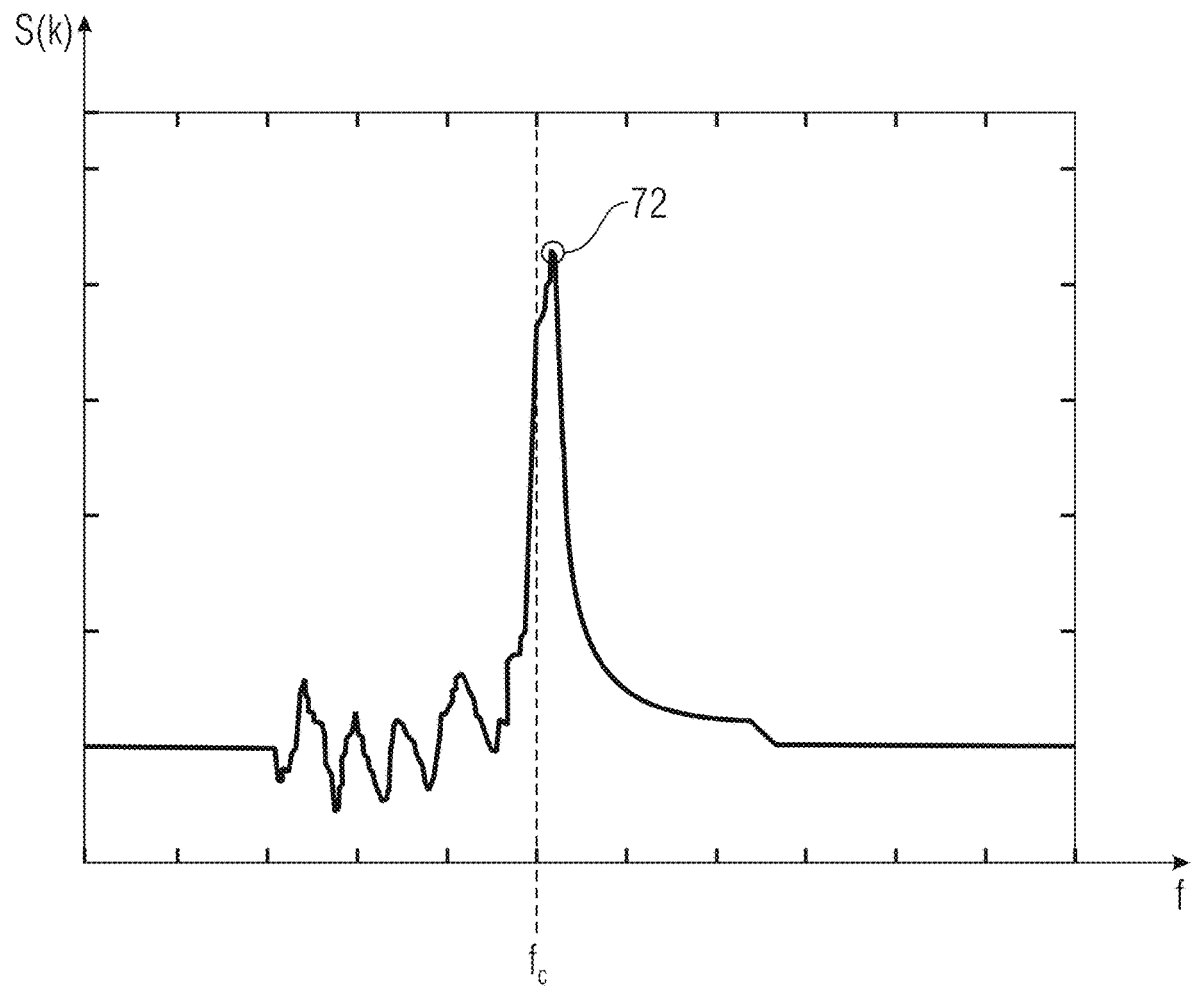
FIG. 11 shows a schematic diagram of an example result of a spectral difference function according to an embodiment of the second aspect.

A positive evaluation result indicating that the audio signal was subjected to an up sampling limiting the bandwidth at frequency index k may be determined, for example, when the spectral difference function s(k) or a different suitable function as described above delivers a value exceeding or being at least a threshold value. Thus, the determination rule may apply that $$S(k) > \text{threshold}$$

the spectral difference function may indicate a steep and strong attenuation and may therefore indicate a resampling. Therefore, when the maximum 72 in FIG. 11 is arranged at or near to an expected resampling rate/resampling frequency, the presence of a resampling may be determined.

Further, the attenuation may be evaluated with respect to an amount, i.e., a half of the falling edge within the spectrum. For example, the slope evaluator 52 may evaluate the slope 54 with respect to a decrease within a specific frequency range of, for example, 100 Hz, 1 kHz or 2 kHz and/or for a total amount of the decrease within the falling edge.

The processor 64 may be configured for deciding, if the spectrum 12' was subjected to the artificial bandwidth limitation and may further be configured for deciding at which cut-off frequency $f_c$ said limitation was applied. Thus, the information 66 may comprise the variable D or a similar information and may further comprise information indicating the cut-off frequency, at least, when the processor 64 determines the spectrum 12' as being applied to the artificial bandwidth limitation processing.

Figure 10:
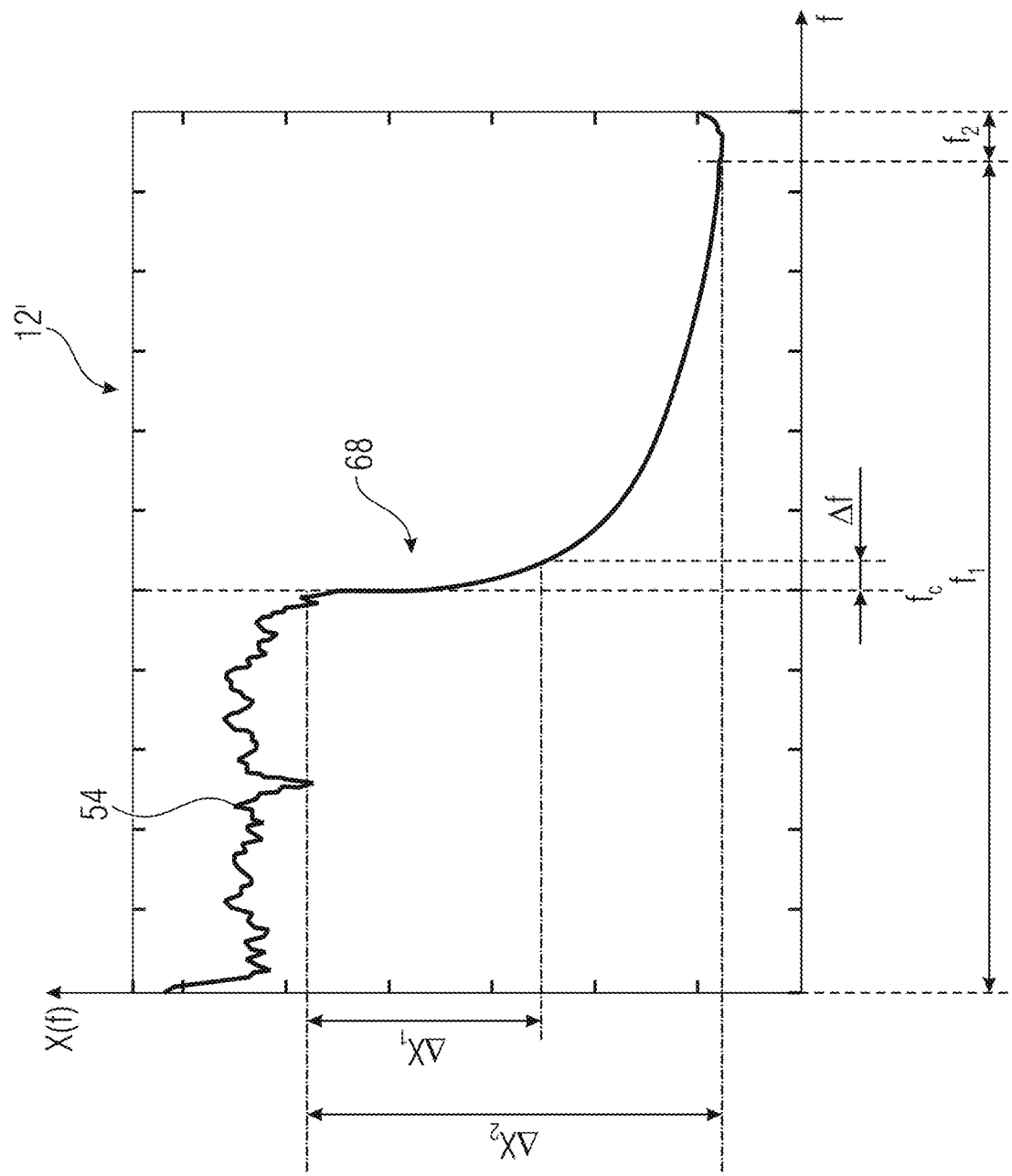
FIG. 10 shows a schematic diagram illustrating an example spectrum in connection with an embodiment of the second aspect.

FIG. 10 shows a schematic diagram illustrating an example spectrum 12' having the slope 54. The slope evaluator 52 may be configured for evaluating the slope 54 with respect to a steepness of the spectrum 12', of a falling edge 68 respectively. The slope evaluator 52 may be configured for providing the slope evaluation result 56 so as to comprise information indicating a measure for the steepness. The measure for the steepness may be obtained, for example, by linking a decrease $\Delta X_1$ of the magnitude X(f) and a frequency range $\Delta f$, for example, as the decrease $\Delta X_1$ per frequency range $\Delta f$ or in terms of a frequency range $\Delta f$ used for obtaining the decrease $\Delta X_1$.

The processor 64 may be configured for providing the information indicating that the audio signal comprises the predetermined characteristic if the measure for the steepness is at least a steepness threshold value. The measure for the steepness may increase for rising values of the term $\Delta X1/\Delta f$ and/or may increase for decreasing values of the term $\Delta f/\Delta X_1$. For example, the steepness threshold value may comprise a value of being equal or proportional to at least 25 dB/1 kHz, 30 dB/1 kHz, 40 dB/1 kHz or 50 dB/1 kHz or higher.

The slope evaluator 52 may be configured for determining a spectral difference function of the spectrum 12', for example, using a window function which only selects a part of the spectrum 12' for an evaluation. The window function may combine a plurality of frequency values of the spectrum 12', the slope 54 respectively and may allow the slope evaluator 52 to determine the measure for the attenuation using results of the window function. This may also be referred to as a window filtering. By combining, e.g., subtracting, values of different windows, a measure for the steepness may be obtained. Alternatively, any other suitable process may be used to evaluate the steepness of the slope 54. Alternatively or in addition, the frequency evaluator may be configured for evaluating an attenuation between a first energy level of a first frequency band of the spectrum 12' and second energy level of a second energy band of the spectrum.

The first and second energy band may be, for example, a so-called low frequency band and a so-called high frequency band. The hand-frequency band may be the frequency band which is expected to be silent after being low-pass filtered, for example, frequencies above 3 KHz. The low-frequency region may refer to a frequency region having frequencies below such a frequency range. Thus, the first energy band may comprise a first frequency range $f_1$ being low when compared to a second frequency range $f_2$ of the second frequency band. The slope evaluator 52 may be configured for providing the slope evaluation result 56 so as to indicate a measure for the attenuation $\Delta X_2$. The processor 64 may be configured for providing the information 66 if the measure for the attenuation is at least an attenuation threshold value. The attenuation threshold value may be, for example, at least 30 dB, at least 40 dB, at least 50 dB or at least 60 dB or even higher.

In other words, the attenuation may be considered as being high such that only negligible energy remains after the filtering in the high frequency band. E.g., the magnitude in the upper frequency region $f_2$ is below −60 dB (attenuation threshold value) smaller than the average magnitude in the pass band, i.e., the frequency region $f_1$. A combination of the evaluation of the steepness of the spectrum and the evaluation of the amount of the attenuation may allow for determining that the current frame of the spectrum 12' was subjected to the artificial bandwidth limitation. Thus, if at least one or advantageously both evaluations give a hint for such a processing, the variable D may be set to 1. If at least one or advantageously both of the evaluation criteria are evaluated negatively, the variable D may be set to 0, i.e., it may be determined that no artificial bandwidth limitation has been applied.

In other words, the steepness of the attenuation may be quantified by comparing the spectral magnitudes in a lower sub-band $f_1$ and the spectral magnitudes in a higher sub-band $f_2$ around a frequency index k and repeating this for all frequency indices in the range of interest. An example is the spectral difference function S(k) that may be formed according to:

$$S(k) = \max X_1 - \max X_2$$

The spectral difference function S(k) may quantify the attenuation as the difference of the maximum magnitude of the lower and the maximum magnitude of the higher sub-band. The parameter k may refer to a frequency index. X(k) may denote a magnitude spectrum. The operation max may return the maximum value of a vector, wherein $X_1 = (x_{k-a}, \ldots x_{k-b})$ may denote a segment of the spectrum below frequency index k and $x_2 = (X_{k+b}, \ldots, X_{k+a})$ may refer to a segment of the spectrum above the frequency index k, wherein a>b. A length of the vector, i.e., a number of samples to be used in the vectors $X_1$ and/or $X_2$ may be, for example, 3, 5, 8, or 10 or even more. In one non-limiting embodiment, a first segment of length 7 and a second segment of length 7 is used in connection with a gap of 5 values between both segments. Accordingly, the maximum of elements 1, 2, 3, 4, 5, 6, 7 is determined and compared to the maximum of element 13, 14, 15, 16, 17, 18, 19.

Alternatively, other functions may be used, for example, $S_2(k)=\min X_1-\max X_2$ or a difference determined from means values of $X_1$ and $X_2$.

The frequency evaluator 58 may be configured for determining a measure for energy in a frequency band of the audio signal and for determining the cut-off frequency $f_t$ based on the energy. For example, the frequency evaluator may evaluate energy in frequency bands with decreasing frequency values, i.e., within decreasing frequency ranges. When referring to FIG. 10 to the upper most frequency illustrated, the frequency evaluator may, for example, determine a low amount of energy in the frequency range $f_2$. While evaluating comparatively small frequency ranges of several bins or even comprising only one frequency bin, the frequency evaluator 58 may determine with decreasing frequency f and increase in the energy as indicated, the slope 54. At the cut-off frequency $f_c$ the frequency evaluator 58 may determine a strong increase in the energy, for example, at least 30 dB, 40 dB, 50 dB or even 60 dB when compared to the low energy level in the frequency range $f_2$. Based thereon, i.e., based on the increase of energy in the frequency range, the frequency evaluator 58 may determine the cut-off frequency $f_c$. This may be also referred to as determining the cut-off frequency $f_c$ as the frequency at which the sub-band energy increases.

FIG. 11 shows a schematic diagram of an example result of the spectral difference function S(k). The originate shows a result of the spectral difference function S(k), wherein the abscissa shows the same frequency axis as illustrated in FIG. 10. The spectral difference function may allow for obtaining a measure for the steepness of the slope 54. A local or even global maximum 72 of the spectral difference function S(k) may indicate a frequency at which the slope 54 comprises a most steep variation, i.e., where the attenuation is very steep. Therefore, this measure may alternatively or in addition be used by the frequency evaluator as a measure for the cut-off frequency $f_c$.

The decrease of the slope 54, and therefore the attenuation may range along the large number of samples such that the difference using a maximum value of the respective vector may provide for a sufficient accuracy. Alternatively, the spectral difference function may be determined for single frequency values, i.e., the vectors $X_1$ and $X_2$ may have a length of 1.

For enhancement of the sound quality it is of crucial importance to discriminate between a signal having originally a low bandwidth, (e.g., a low note played on the basin) and a signal that has been bandlimited by means of a signal processing, e.g., due to lossy encoding or down sampling. This is important to prevent a signal having high sound quality from any post-processing and to apply an enhancement processing only when needed, i.e., to apply subsequent bandwidth extension (BWE) only for restoring high frequency energy that has been artificially removed from the signal and not to process signals having a low bandwidth by nature. For such a purpose, the signal may be analyzed with respect to three characteristics given by the steepness of the attenuation, the amount of attenuation and the cut-off frequency. This may be performed by the following processing steps executed, for example, by an apparatus according to the second aspect.

Figure 12A:
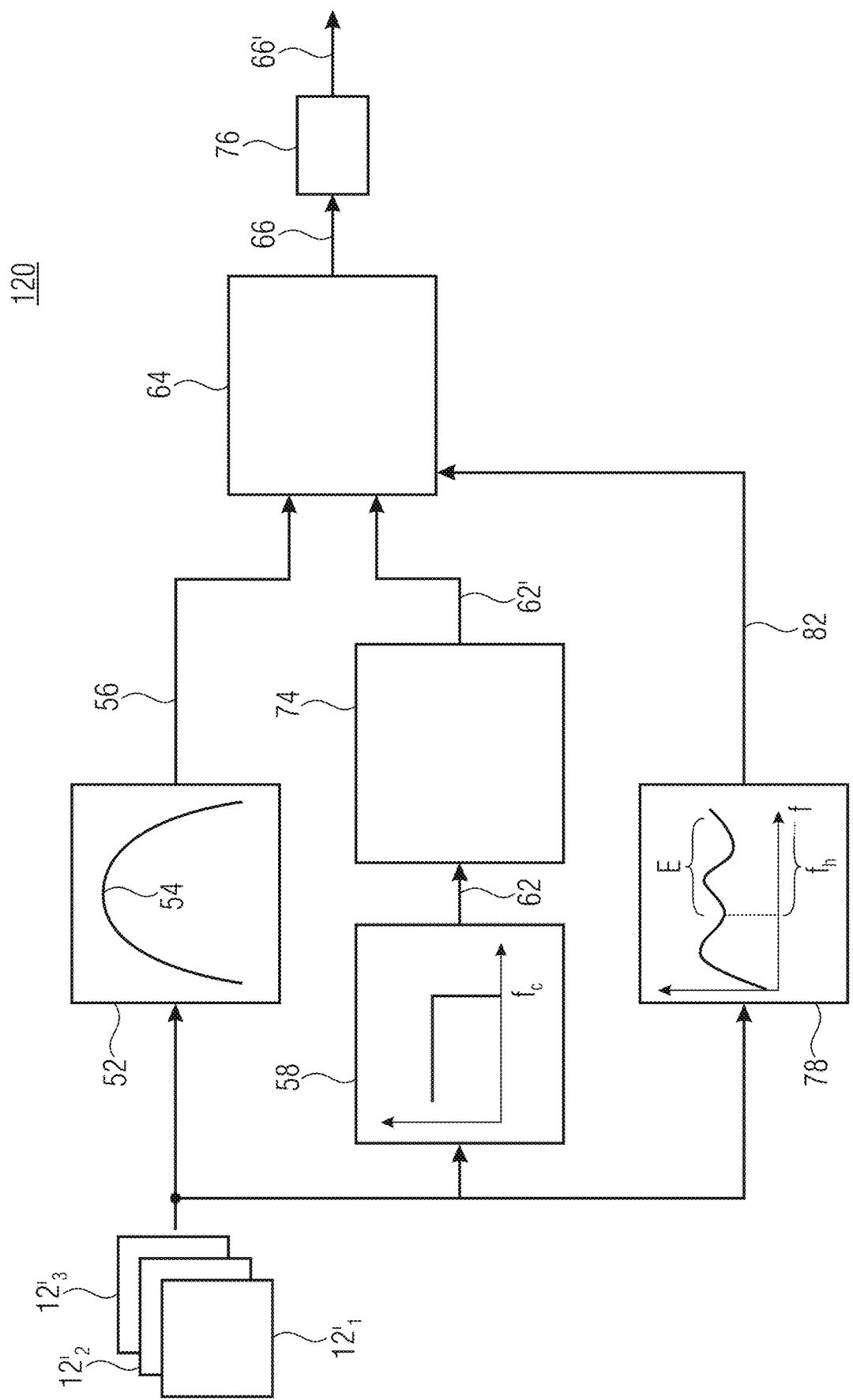
FIG. 12a shows a schematic block diagram of an apparatus according to an embodiment of the second aspect, comprising an energy estimator.

FIG. 12a shows a schematic block diagram of an apparatus 120 according to an embodiment of the second aspect. When compared to the apparatus 90, the apparatus 120 is configured for determining the predetermined characteristic for a plurality of spectrums $12_1'$ to $12_3'$ which may be derived from a number of blocks of the audio signal. I.e., the audio signal may be divided into blocks and from each block a spectrum 12' may be derived. The slope evaluator 52 is configured for evaluating the slope 54 of each of the spectrums $12_1'$ to $12_3'$. In accordance herewith, the frequency evaluator 58 is configured for evaluating each of the spectrums $12_1'$ to $12_3'$.

The processor 64 may be configured for providing the information 66 indicating that the audio signal comprises the predetermined characteristic for each of the spectrums $12_1'$ to $12_3'$. A number of blocks into which the audio signal is divided may be arbitrary. For example, a length of each block in time may be constant such that the number of blocks may be dependent on the length of the audio signal.

The apparatus 120 may comprise a filter 74 connected with the frequency evaluator 58 and configured for receiving the frequency evaluation result 62. The filter 74 may be configured for providing a filtered frequency evaluation result 62'. The processor may be configured for providing the information 66 indicating that the audio signal comprises the predetermined characteristic based on a plurality of slope evaluation results 56 for each of the spectrums $12_1'$ to $12_3'$ and/or a filtered version thereof and the filtered frequency evaluation result 62' associated with a plurality of spectrums $12_1'$ to $12_3'$ of the audio signal. The cut-off frequency used for encoding an audio signal may be essentially time-invariant, time-invariant or may be a parameter that varies rarely or infrequently over time such that a low-pass filtering, a moving maximum, a moving average or a moving median filtering implemented by the filter 74 may allow for obtaining the filtered values 62' remaining unchanged or constant or at least changing at low rates for further processing, for example, when the frequency evaluator 58 determines slightly different cut-off frequencies $f_c$ between the different spectrums $12_1'$ to $12_3'$. I.e., a post-processing of the obtained values $f_c$ may be performed by low-pass filtering or alternatively a different filtering.

In a similar way, artificial bandwidth limitation is usually performed for a complete audio signal or at least a large portion thereof such that it is unlikely that a change of the characteristic related to the artificial bandwidth limitation processing is present in one frame and not present or absent in a subsequent frame will occur. Therefore, the processor 64 may perform a post-processing of the variable D or a corresponding result or value, for example, using a median filtering or the like for a plurality of frames, i.e., for a plurality of spectrums $12_1'$ to $12_3'$. The processor may be configured for providing the information 66 indicating that the audio signal comprises the predetermined characteristic by providing a respective information for each of the plurality of frames of the audio signal and for providing a combined or filtered result 66' by combining the results of the frames such that the combined result 66' is valid for the plurality of frames being subjected to the filter and influencing an output of the filter. For example, when using a median filtering, a number of frames and/or spectra $12_1'$ to $12_3'$ is considered within the respective filter, for example, a filter 76 connected to the processor 64 or being a part of the processor 64 or being implemented by the processor 64. The output 66' of the filter 76 may be combined median-filtered value derived from the considered frames. Although being illustrated as a separate block, the filter 76 may be implemented or may be a part of another computing block.

Alternatively or in addition, the apparatus 120 may comprise a determiner 78 configured for determining an energy E of a frequency band of the spectrums $12_1'$ to $12_3'$ and for providing a signal 82 indicating a presence and/or an amount of the energy E within the respective frequency band. The signal 82 or a signal derived thereof may be provided to the processor 64 such that the processor 64 may have knowledge about the determined energy. It may be of interest, if in a so-called high frequency region $f_h$ energy is present or not. For example, a high-frequency region $f_h$ may be a frequency region having a frequency values being at least or above 1 kHz, 2 kHz, 3 kHz, 4 kHz or a different value, i.e., different bandwidth limiting frequencies. For example, encoders may drop or discard frequencies above a certain frequency value. The frequency value may be in accordance with a specific application such as 3 kHz or 4 kHz for speech-related applications.

The determiner 78 may determine, if the spectra $12_1'$ to $12_3'$ comprise energy or comprise energy above a certain threshold in the high-frequency region $f_h$. In a case where the determiner 78 determines that the respective spectrum $12_1'$ to $12_3'$ comprises no energy E or a low amount thereof in the high-frequency region $f_h$, a reliable determination of the cut-off frequency and/or the attenuation may be difficult or even impossible, for example, because the respective frame does not provide for a suitable slope. When taking into account, by non-limiting example only, a silent spectrum having no energy in the complete spectrum, neither a cut-off frequency nor an attenuation of the slope 54 may be determined. Such information may be provided by the signal 82. The processor may skip evaluating the actual frame or spectrum $12_1'$ to $12_3'$ and may be configured for providing the information 66 based on a previous spectrum observed or evaluated previously, if the energy E is below an energy threshold level which is considered to discriminate between relevant energy present or absent. Put into different terms, the processor may base its decision on a previous frame in a case where the actual spectrum is unable to provide sufficient information.

- In an optional step, a partitioning of the audio signal/input signal into short blocks may be executed, i.e., a number of blocks may be obtained. A length of a block may be, for example, at least 0.5 ms, at least 1 ms or at least 5 ms and at most 1 second, 500 ms or 100 ms. One example interval comprises values of at least 2 ms and at most 80 ms.
- Optionally, computing a magnitude spectrum for each block, e.g., by means of a transform or a filter bank. Thus, the apparatus 19 may comprise, for example, a frequency deriver for deriving a spectrum such as a magnitude spectrum so as to provide the spectrum 12'. For each block a spectrum according or similar to the spectrum illustrated in FIG. 10 may be derived.
- Optionally, a low-pass filtering of spectral coefficients may be performed with respect to time and frequency. For example, a moving averaging or a recursive averaging may be performed, for example, by the slope evaluator 52 and/or the frequency evaluator 58 and/or a processor implementing both, the slope evaluator 52 and the frequency evaluator 58. This may allow for reducing computational loads as the attenuation and steepness of the attenuation as well as the cut-off frequency are arranged within a specific frequency range extended beyond single frequency values such that an evaluation of the frequency ranges may allow for a sufficient accuracy.
- Optionally, when the input signal is mute or does not contain energy in the high frequency region, a reliable estimate may be difficult to be obtained or may be impossible to be obtained. Therefore, the detection result of the previous frame may be used, if the maximum sub-band energy above 3 kHz is below a threshold because this frame does not contain the desired information.
- Optionally, detecting if the signal has been upsampled from a lower sampling frequency, for example, using the determiners 78. A coded signal at low bit rates is typically encoded with a low sampling frequency which can be lower than the sampling frequency at which the current processing framework operates. When up sampling or resampling after decoding has been detected, the search range of the artificial bandwidth limitation analysis (ABLA) according to the second aspect may be modified such that the highest frequency to be detected equals the encoder sampling frequency. For detecting a resampling, the detection of resampling may be carried out for a set of common sampling rates such as 11,025 Hz, 22,050 Hz, 32,000 Hz and/or 44,100 Hz. When the maximum magnitude of the spectral coefficients in a range above the half of the sampling frequency is below a threshold, resampling may be detected. This is based on the Nyquist criterion allowing obtaining frequencies with half of the frequency value when compared to the sampling rate. Therefore, when the energy is below the threshold in the upper half, this may be caused by the used sampling rate. The following ABLA processing is then modified such that the search range is modified such that the highest frequency to be detected equals the detected encoder sampling frequency and thus allowing searching only a portion of the respective spectrum. The other portion, e.g., the upper half, may be neglected as being expected to be caused by the up sampling. The attenuation due to resampling may be larger than the attenuation of the encoding. The resampling detection may ensure that resampling is not mistakenly detected as bandwidth limitation at a lower cut-off frequency $f_c$.
- Computing a detection function, for example, the spectral difference function, that quantifies a steepness of the attenuation over frequency. The spectral difference function or an alternative version when compared to FIG. 11 may be used. The detection function may provide for information of a level difference between adjacent frequency bands.
- Detecting artificial bandwidth limitation (ABL) using a set of rules that evaluate the spectral difference function and the sub-band energy and a threshold parameter. Starting at the frequency index k of the upper end of the search range, the magnitude X of the spectral coefficients and the spectral difference function S(k) or a similar function or quantity may be tested with respect to a set of conditions until a condition is valid or until the lower end of the search range has been reached. All the thresholds are parameters that can be adjusted to change the trade-off between false positive and false negative detections. The conditions:
  1). x(k)>threshold; and
  2). X(k)<X(k+1)−offset parameter AND x(k) greater threshold, i.e., the magnitude does increase towards higher frequencies above a BL more than the offset parameter, e.g., 0.5 dB, when the magnitudes are larger than the threshold, e.g., −60 dB, may lead to a negative detection. Conditions according to:
  1). S(k)>threshold; and
  2). Resampling has been detected may lead to a positive detection.

Determining the cut-off frequency $f_c$ as the frequency at which the sub-band energy increases, for example using the frequency evaluator 58.

Optionally, post-processing $f_c$ by low-pass filtering, for example, using the filter 74.

Optionally, post-processing D by median filtering, for example, by using the filter 76.

The apparatus 90 and/or the apparatus 120 may further comprise a signal enhancer, for example, the signal enhancer 48 being described in connection with the first aspect. The signal enhancer 48 may be configured for reducing artifacts caused by artificial bandwidth limitation processing of the audio signal dependent on the information 66 indicating that the audio signal comprises the predetermined characteristic. I.e., the signal enhancer may be adapted to artifacts being caused by the artificial bandwidth limitation.

In the following, reference will be made to an apparatus configured for suppressing or at least reducing the Birdies coding artifact and for improving the perceived sound quality in accordance with the second aspect. The respective apparatus or method may be used in a case when information has been derived that the audio signal comprises a characteristic related to an artificial bandwidth limitation and/or to a spectral enhancement processing such as a spectral band replication. For example, the apparatus may be used in a case when at least one of artificial bandwidth limitation or spectral band replication has been detected.

Thus, when at least one of the artificial bandwidth limitation and the spectral enhancement processing is detected, the concept according to which the artificial bandwidth limitation is detected may be reused or may be used so as to detect steep and highly attenuated regions in the spectrum, which may be referred to as spectral gaps. A spectral gap may comprise a first and a second edge. Accordingly, a spectral island may also comprise a first and a second edge, wherein between the respective edges the gap or the island may be arranged.

Figure 12B:
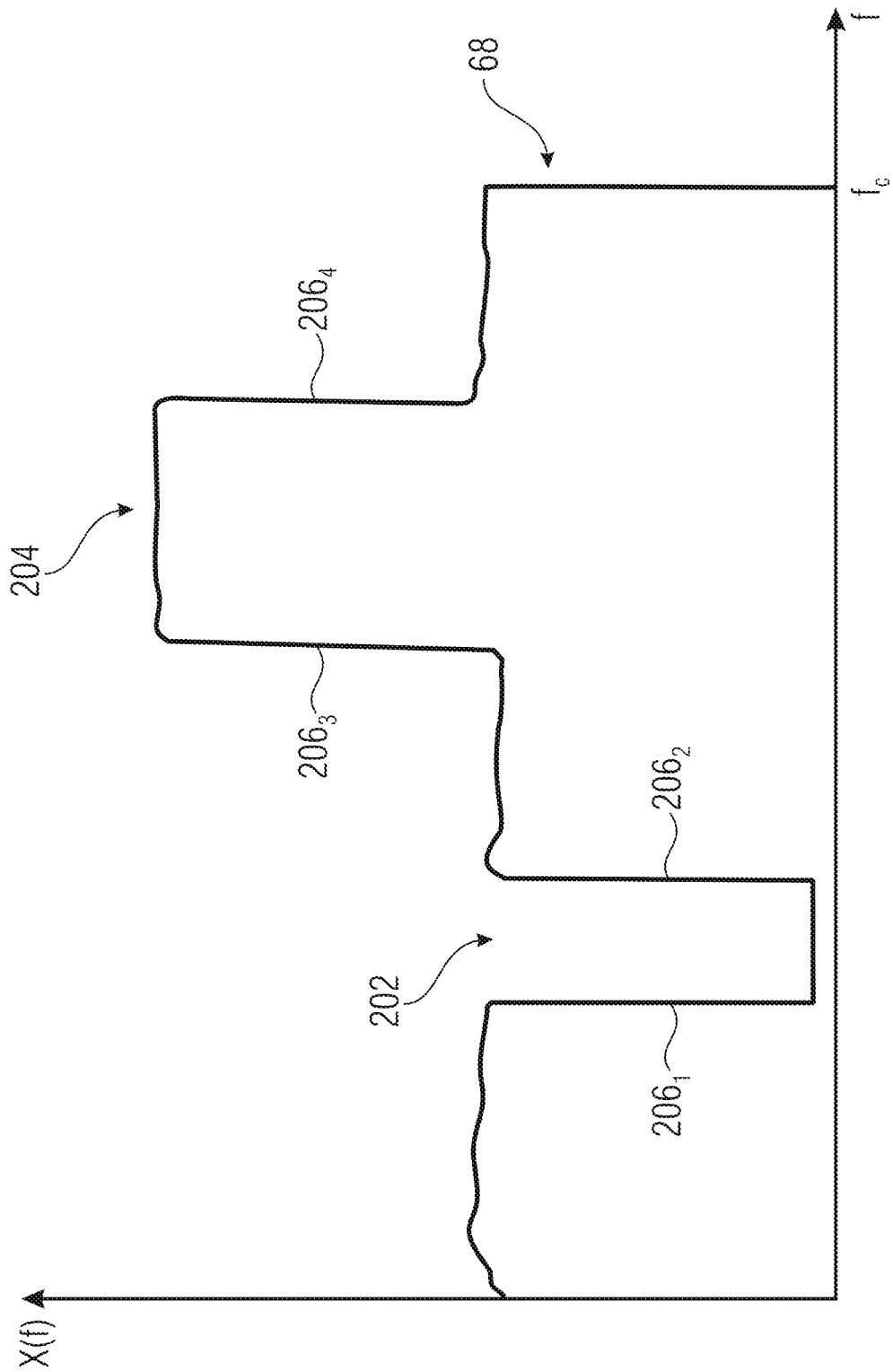
FIG. 12b shows an example spectrum comprising a falling edge at a cut-off frequency according to an embodiment of the second aspect.

When referring now to FIG. 12b, there is shown an example spectrum comprising the falling edge 68 at the cut-off frequency f. Further, at frequency ranges below that cut-off frequency $f_f$, an example spectral gap 202 and an example spectral islands 204 is arranged. When starting from low frequencies, first a falling edge 206₁ and afterwards a rising edge 206₂ is arranged, wherein at frequency ranges therebetween, the spectral gap 202 may be arranged. Accordingly, the spectral island 204 may be arranged between edges 206₃ and 206₄. The edges may be located, quantified and qualified using the teachings disclosed herein for finding the edge 68, in particular, a frequency/energy evaluation may be performed.

In contrast to the cut-off frequency $f_c$, a location, a presence and a magnitude of the gap 202 and the island 204 as well as a number thereof may vary between frames of the audio signal. Simplified, the filling of the gap 202 and/or the attenuation of the island 204 may be performed after using a concept to find the edges 206₁ to 206₄, as was described in connection with the cut-off frequency $f_c$ with the exception that the respective frequencies are variable. I.e., an apparatus or signal enhancer may be configured for filling a spectral gap and/or for attenuating a spectral island. Therefore, spectral weights may be used which may be determined from the audio signal itself, i.e., a side information may remain unrequired. By suppressing the Birdies coding artifact the perceived sound quality may be enhanced. The concept introduced may be used as a post-processing concept which is located after the decoder. It can work blindly without having access to the uncompressed audio signal and to other side information.

The concept which is described in the following so as to reduce the Birdies artifact may use a basic principle called spectral weighting or short-term spectral attenuation. Therefore, a time domain signal X[n] may be transformed into its frequency domain representation X[k,m], where k and m denote the frequency in timeframe index, respectively. In the embodiments described, the short-time Fourier transform (STFT) may be applied, but also other transforms may be used. The output signal Y of the spectral weighting may be given in the following equation:

$$Y[k,m]=G[k,m]\cdot X[k,m].$$

The time domain representation Y[n] of the frequency domain signal Y[n] may be computed by means of an inverse transform, in embodiments the inverse STFT. In the following, time domain signals will be denoted with small letters and frequency domain signals with capital letters. Indexes k and m or frequency domain signals will be omitted for better readability.

Figure 12C:
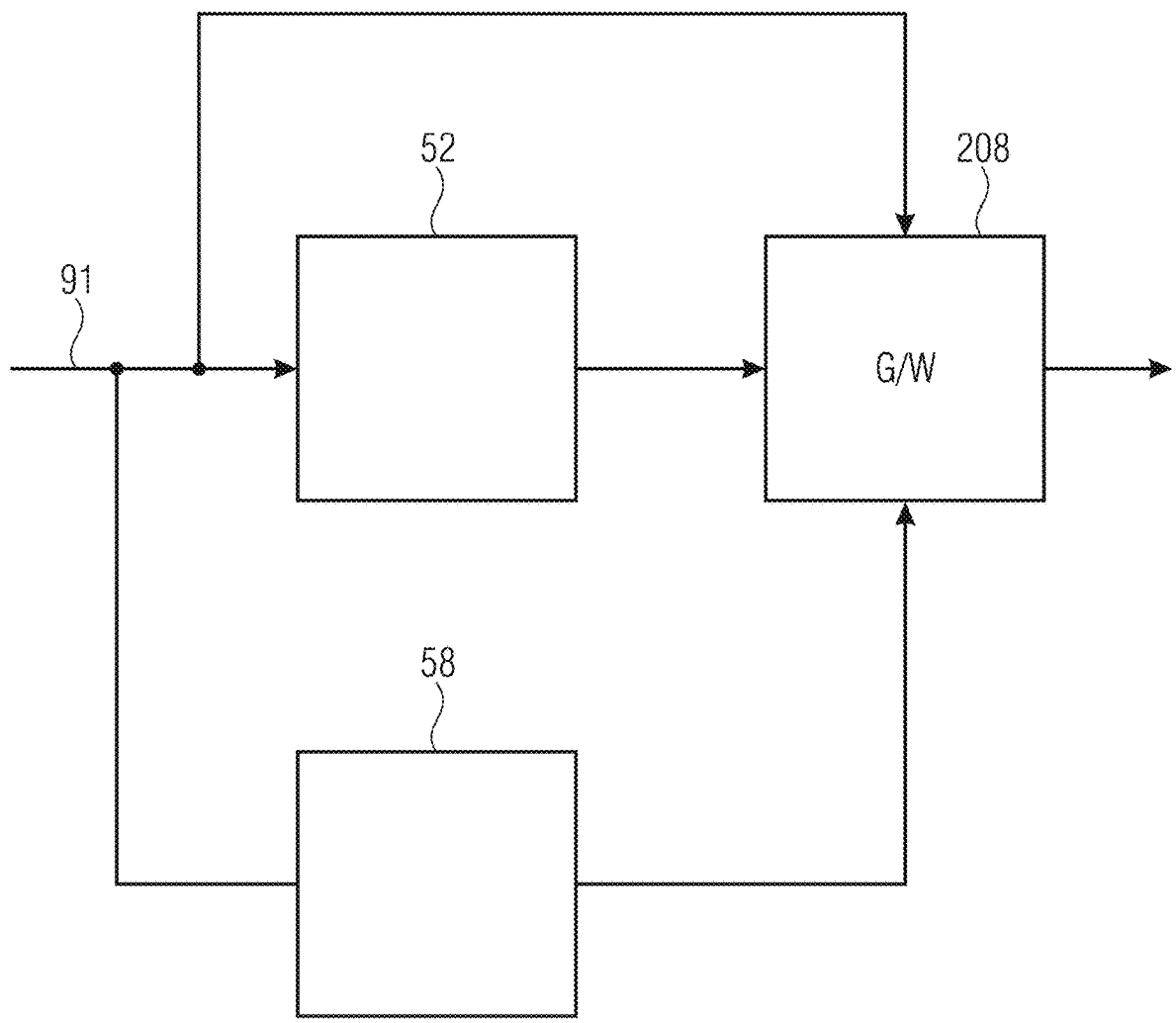
FIG. 12c shows a schematic block diagram of an apparatus configured for processing an audio signal which may be received from a decoder according to an embodiment of the second aspect.

FIG. 12c shows a schematic block diagram of an apparatus 125 configured for processing an audio signal 91 which may be received from a decoder and which may have been subjected to artificial bandwidth limitation and/or spectral enhancing such as spectral band replication. The apparatus 125 comprises the slope evaluator 52 and the frequency evaluator 58. The slope evaluator 52 is configured for evaluating a slope of a spectrum of the audio signal 91 to obtain a slope result as described in connection with FIG. 9 and/or FIG. 12a. The frequency evaluator may be configured for evaluating at least a first and a second frequency at, for example the edges 206₁ and 206₂ and/or the edges 206₃ and/or 206₄ surrounding, bordering or fencing the respective artifact, i.e., the gap 202 and/or the spectral island 204.

The apparatus 125 comprises a processor 208 configured for determining a spectral weight G and/or Wand for processing the audio signal 91 at least in a spectral region between the respective edges 206₁ and 206₂, 206₃ and 206₄ respectively, using the spectral weights G and/or W. The apparatus 125 may be configured for determining the spectral weights G and/or W for each of the frequency regions, frequency bins and/or frames of the audio signal 91. Spectral weights G may be used for forming or shaping a filling signal S to be combined with the audio signal so as to fill spectral gaps. Spectral weights W may be used so as to attenuate spectral islands. I.e., for reducing an artifact within the spectral gap 202, a fill signal F may be used. For reducing artifacts caused by the spectral island 204, spectral weights W may be used for attenuating a height of the island. For a plurality of frequency values within the respective spectral gap 202 and the respective spectral island 204, a plurality of spectral weights may be determined.

Figure 12D:
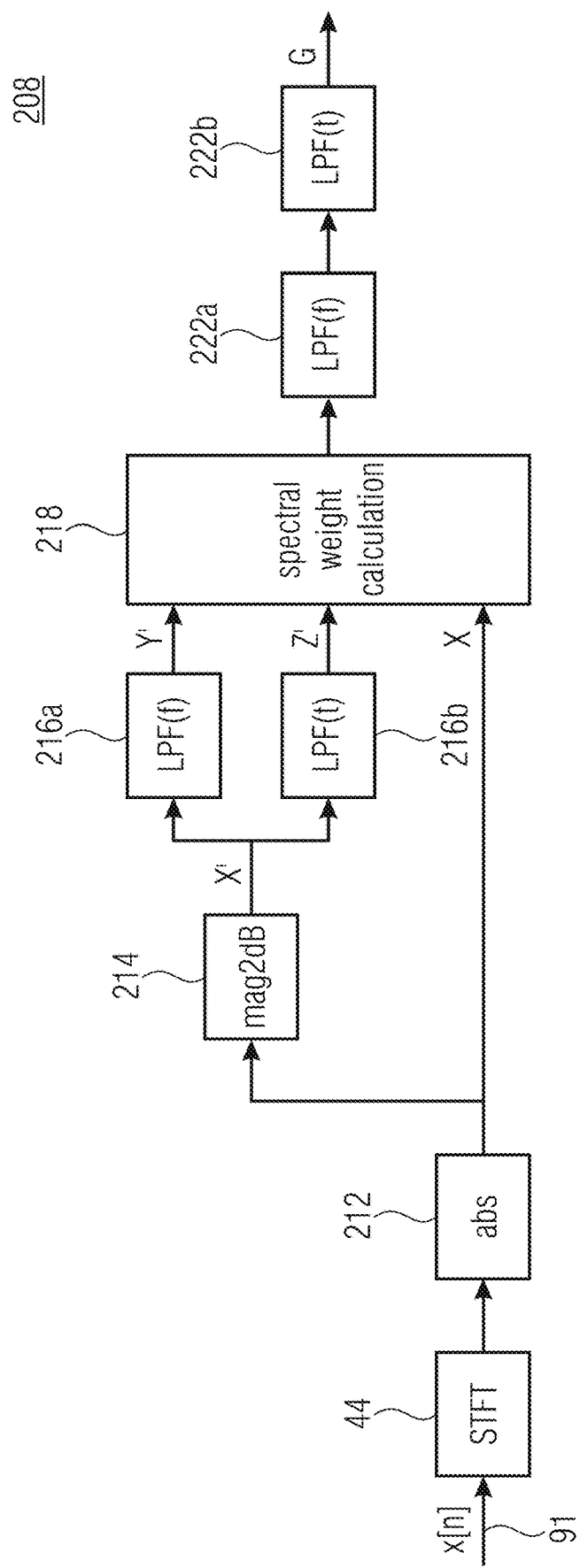
FIG. 12d shows a schematic block diagram of a functionality of a processor for determining spectral weights according to an embodiment of the second aspect.

FIG. 12d shows a schematic block diagram of a functionality which may be implemented by the processor 208 for determining the spectral weights G. Spectral gaps may be defined as an abrupt decrease, i.e., at least 30 dB, at least 40 dB or at least 50 dB of spectral magnitude areas in frequency and time domain/direction. The additional evaluation over time shows that spectral areas between harmonic of a tonal signal are not wrongly detected as spectral gaps. In [5] the detection method searches for perfect zeros in the spectral domain. This is only possible because the method is located in the decoder and has access to the same filterbank and blocking as the encoder. The described embodiments refer to a post-processing of the decoder which evaluate abrupt relative spectral changes using the difference of magnitude spectrum X and its smoothed copy of it. The signal flow for detecting both spectral gaps and the spectral islands are illustrated in FIG. 12d. STFT or a different spectrum calculator 44 may be used for obtaining a spectral representation of the audio signal 91. An absolute value former 212 may be configured for outputting the magnitude spectrum X. A logarithm 214 is configured for transforming the magnitude spectrum X into the logarithmic domain, for using a logarithmic transformation such as $X'=20 \log_{10}(X)$.

The obtained logarithmic magnitude spectrum X' may be smoothed by two low-pass filters in parallel, wherein a first low-pass filter 216a may be configured for smoothing the spectrum of the audio signal, i.e., the audio signal, in the frequency domain so as to obtain a signal Y' being smoothed in the frequency domain. A second low-pass filter 216b may be configured for smoothing the magnitude spectrum X' in the time domain so as to obtain a smooth signal Z'. Although being described as being smoothed in the logarithmic domain, the smoothing may also be performed in the linear domain or a different domain. I.e., the logarithm 214 may also be absent or may be arranged after the low-pass filters. I.e., the logarithmic magnitude spectrum X' may be smoothed by two low-pass filters, both over frequency and over time which may lead to the signals Y' and Z', respectively. For the calculation of the special weights G, the linear values may be calculated by $$Y = 10^{\frac{Y'}{20}}.$$

Those linear values may be compared with the magnitude spectrum X so as to obtain a frequency difference value and/or a time difference value. The relative differences $\Delta_t$ and $\Delta_f$ comparing the spectral magnitudes X to their smoothed versions over time Z' and frequency Y may be calculated in the logarithmic domain, for example, for each spectral coefficient and for each frame by $\Delta_f = Y' - 20 \log_{10}(X)$ and $\Delta_t = Z' - 20 \log_{10}(X)$ wherein $\Delta_f$ refers to the frequency difference value and $\Delta_t$ refers to the time difference value.

The spectral weight calculator 218 may be configured for calculating the spectral weight G according to $$G = \begin{cases} \Gamma & \text{if } (\Delta_f > \delta_f) \wedge (\Delta_t > \delta_t) \\ 0 & \text{otherwise} \end{cases}$$

i.e., the spectral weight G is set to a non-zero value if the frequency difference value $\Delta_f$ is greater than or equal to a frequency difference threshold $\Delta_f$ and if the time difference value $\Delta_t$ is greater than or equal to a time difference threshold value $\Delta t$. Although being described as entailing that the time difference values $\Delta_f$ and $\Delta_t$ are greater than their respective threshold values $\Delta_f$, $\Delta_t$ respectively, based on other threshold values or threshold values being chosen differently, the gain parameter may also be $\Gamma$ when being equal to the threshold values. The following determination rule may apply:

$$\Gamma = \left(\frac{X^\alpha + \gamma(Y^\alpha - X^\alpha)}{Y^\alpha - \kappa}\right)^\beta$$

where $\Delta_f$ and $\Delta_t$ denote threshold parameters. $\alpha$, $\beta$ and $\gamma$ are parameters which influence the characteristics of the spectral weight calculation. All parameters are tunable parameters. $\kappa$ is a term which is used to increase the impact of the weighting and may be calculated according to the determination rule or based thereon:

$$\kappa = 10^{\frac{20 \log_{10}(X) + \delta_f}{20}}.$$

The calculated spectral gains are smoothed over time and frequency, for example, using a low-pass filter 222a, 222b respectively. The spectral gains are subsequently used for a spectral weighting of a fill source signal S as being described in connection with FIG. 12e.

Figure 12E:
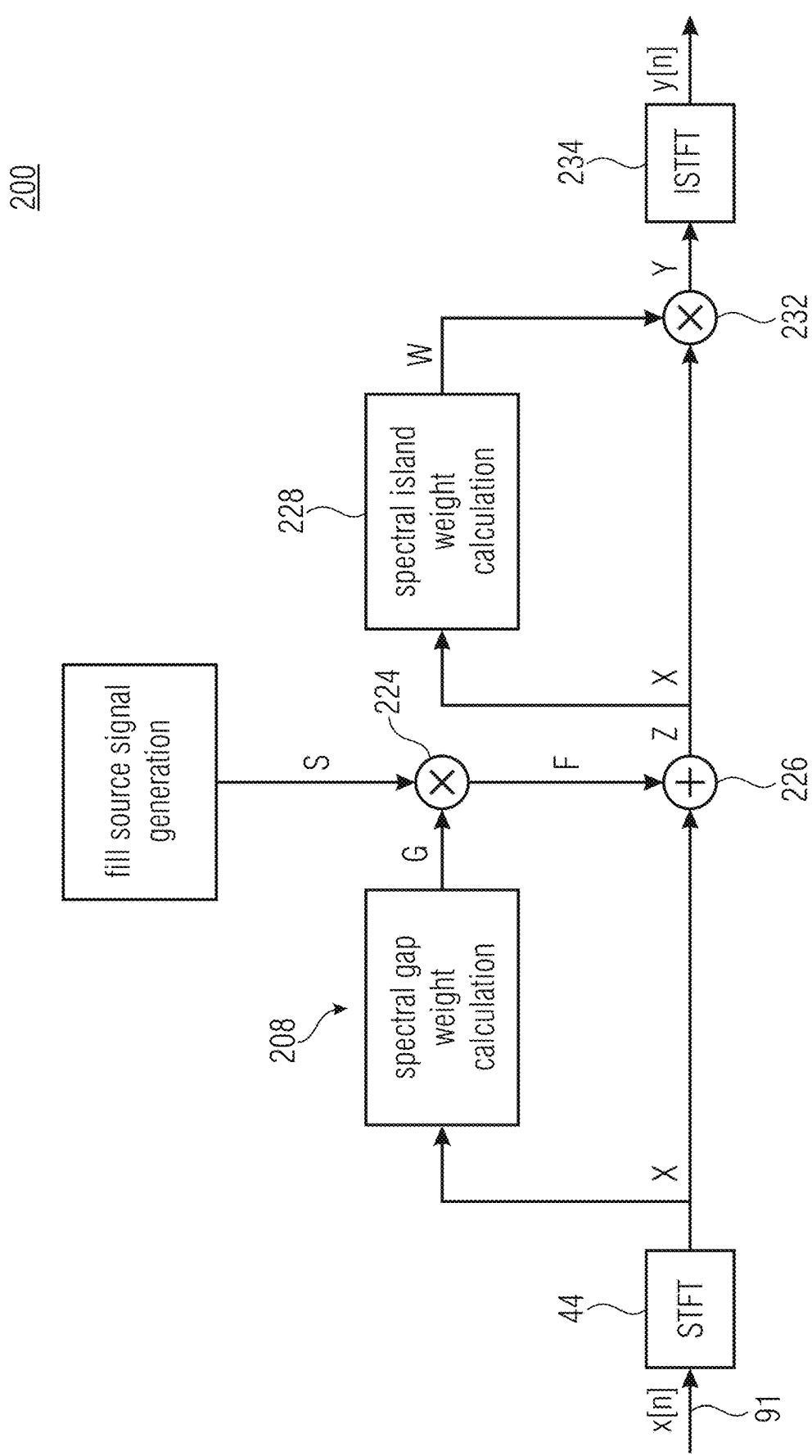
FIG. 12e shows a schematic block diagram of a signal enhancer according to an embodiment of the second aspect, configured for reducing the Birdies artifact.

FIG. 12e shows a schematic block diagram of a signal enhancer 200 configured for reducing the Birdies artifact. The processing may be done, for example, by use of the processor 208. The apparatus 200 may comprise a combiner 224 for combining a fill source signal S with the spectral weighting factors G, for example, by multiplication, so as to obtain the fill signal F. The fill signal F may comprise a structure according to which it only comprises non-zero values at locations where spectral gaps have been estimated. A further combiner 226 may be configured to combine the filler signal F with the magnitude spectrum X, for example, by a summation. I.e., the filling signal F is added to the input signal X. The fill source signal S may be obtained or generated by filtering the audio signal 91 in the time domain, which prolongs information from preceding frames. Alternatively, the filling source signal may be obtained by copying the spectral coefficients from other positions within one spectral frame, by copying spectral coefficients from another audio channel which does not exhibit a spectral gap at the responding location and/or by copying spectral coefficients from a preceding spectral frame which does not exhibit a spectral gap.

In known concepts, for example noise substitution from the Perceptual Noise Substitution (PNS) tool of the Advanced Audio Coding (AAC) are used. Noise like portions of the spectrum are substituted in the decoder by a pseudo random sequence of values scaled to match a given target energy. The process is controlled by side information. Further, a technique named noise-filling is known. Noise-filling is used in the Unified Speech and Audio Coding (USAC) codec to fill spectral holes caused by the dead-zone of the quantizer operating under constraints of a small bit budget. A pseudo-random sequence of values is used to fill these spectral zeroes. Further, a technique named Intelligent Gap Filling is known from MPEG-H and 3GPP EVS. Here, spectral gaps are filled with either noise or using spectral tiles sourced from a remote spectral location. The process is controlled by side information. The embodiments described herein differ from noise filling such that there is used a distribution of time frequency information from preceding time frames to fill spectral holes. In contrast to PNS, the filtered output signal is only filled into spectral gaps rather than entire PNS bands. In contrast to PNS and IGF (Intelligent Gap Filling) the embodiments may be used as processing non-guided, i.e., without using side information.

The apparatus 200 may comprise a spectral island weight calculator 228 which may also be implemented by the processor 208. Spectral islands contained in the signal Z being received from the combiner 226 and being obtained by adding input spectrum X and fill signal F according to $$Z = X + F$$

may be suppressed by means of spectral weighting according to $$Y = W \cdot Z$$

As G, W are spectral weights which are recalculated for each frame m and spectral coefficient k. In order to preserve as much bandwidth as possible, the suppression of spectral islands is done after spectral gaps have been filled. Only isolated spectral islands which could not be attached to the main part of the spectrum are finally suppressed. To achieve a partial enhancement, the spectral island suppression may be performed without the spectral gap filling. Alternatively, the spectral gap filling may be performed without the spectral weight calculation.

For suppressing the spectral weight calculation and for calculating the spectral weight W, the following teaching may be implemented. Spectral islands may be defined as abrupt increase of spectral magnitude areas in frequency and time direction surrounded by very low spectral magnitude values. A rising of magnitudes may be, for example, at least 30 dB, at least 40 dB or at least 50 dB. Spectral islands may be suppressed by attenuating the corresponding spectral coefficients by means of spectral weighting. For deriving the spectral weights W, a similar processing as described in connection with FIG. 12d may be performed. As described for the spectral weights G, the time difference value, and the frequency difference value $\Delta_f$ and $\Delta_t$ may be determined. The spectral weight W may be derived based on the determination rule:

$$W = \begin{cases} \Omega & \text{if } (\Delta_f > \delta_f) \wedge (\Delta_t > \delta_t) \wedge (Y < \delta_p) \\ 1 & \text{otherwise} \end{cases},$$

wherein $$\Omega = \left( \frac{Y^\alpha + \gamma(X^\alpha - Y^\alpha)}{X^\alpha} \right)^\beta$$

$\Delta_p$ is a threshold which reflects the assumption that spectral islands are surrounded by spectral coefficients of low energy. $\Delta_f$ and $\Delta_t$ are threshold parameters. As described above, $\alpha$, $\beta$ and $\gamma$ are tunable parameters. In consideration of the determination rule above, at ranges of the spectral island, the spectral weight $\Omega$ is determined allowing to attenuate the signal Z, Y, respectively, i.e., $\Omega$ is a value being lower than 1. In a range outside the spectral island, W is a value of 1, i.e., no attenuation is performed. The apparatus 200 may comprise a combiner 232 so as to combine the spectral weights W with the signal Z, for example, using a multiplication. A signal transformer 234 may be used so as to perform ISTFT, i.e., to obtain a time domain signal.

In other words, the Birdies suppression concept may be split into spectral gap filling and spectral island suppression. The fill signal F may be calculated by filtering a broadband fill source signal S with spectral weights G. F only contains non-zero values, where spectral gaps have been identified in X that is determined according to $$F = G \cdot S$$

Figure 12F:
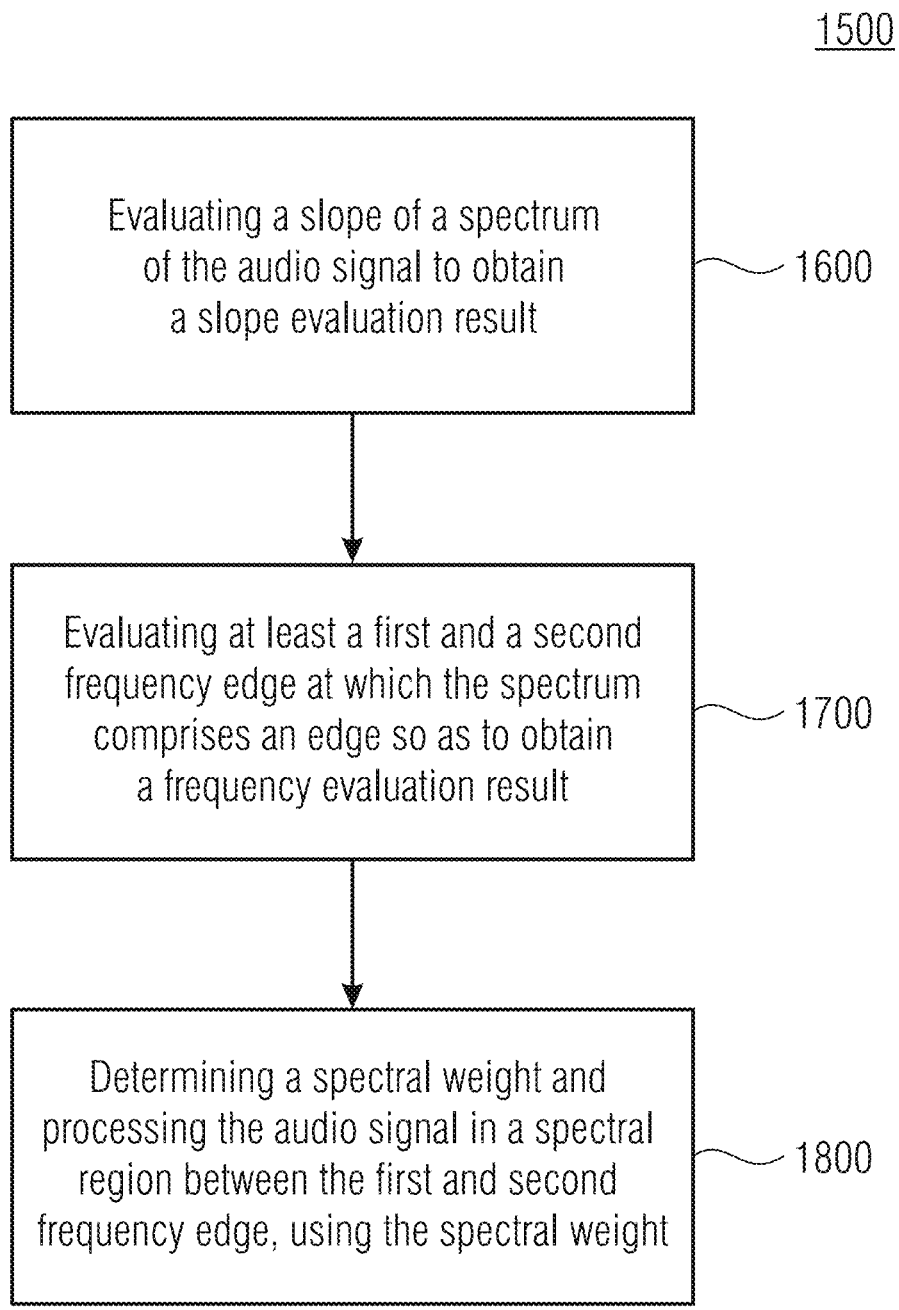
FIG. 12f shows a schematic flowchart of a method for processing an audio signal according to an embodiment of the second aspect.

FIG. 12f shows a schematic flowchart of a method 1500 for processing an audio signal.

The method 1500 comprises a step 1600 in which a slope of a spectrum of the audio signal is evaluated to obtain a slope relation result. A step 1700 comprises evaluating at least a first and a second frequency edge at which the spectrum comprises an edge so as to obtain a frequency evaluation result. A step 1800 comprises determining a spectral weight and processing the audio signal in a spectral region between the first and second frequency edge, using the spectral weight.

Figure 13A:
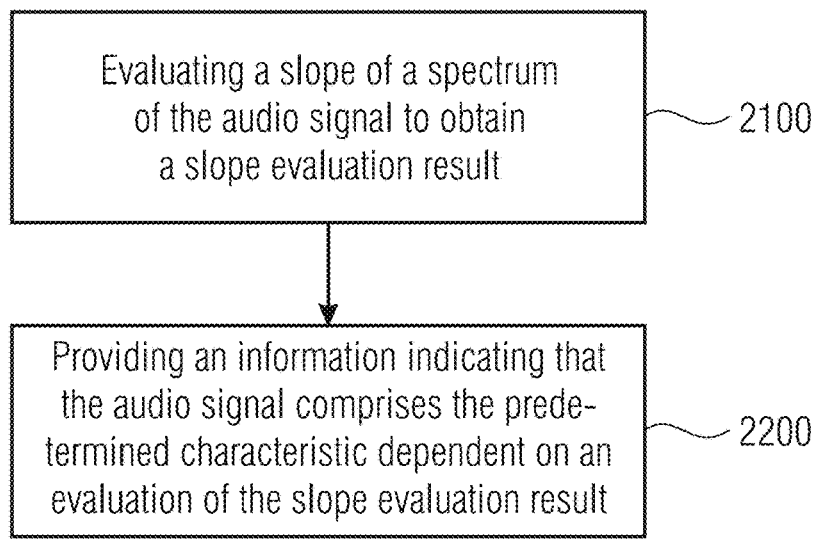
FIG. 13a shows a schematic flow chart of a method for determining a predetermined characteristic related to an artificial bandwidth limitation processing of an audio signal, according to an embodiment of the second aspect.
Figure 13B:
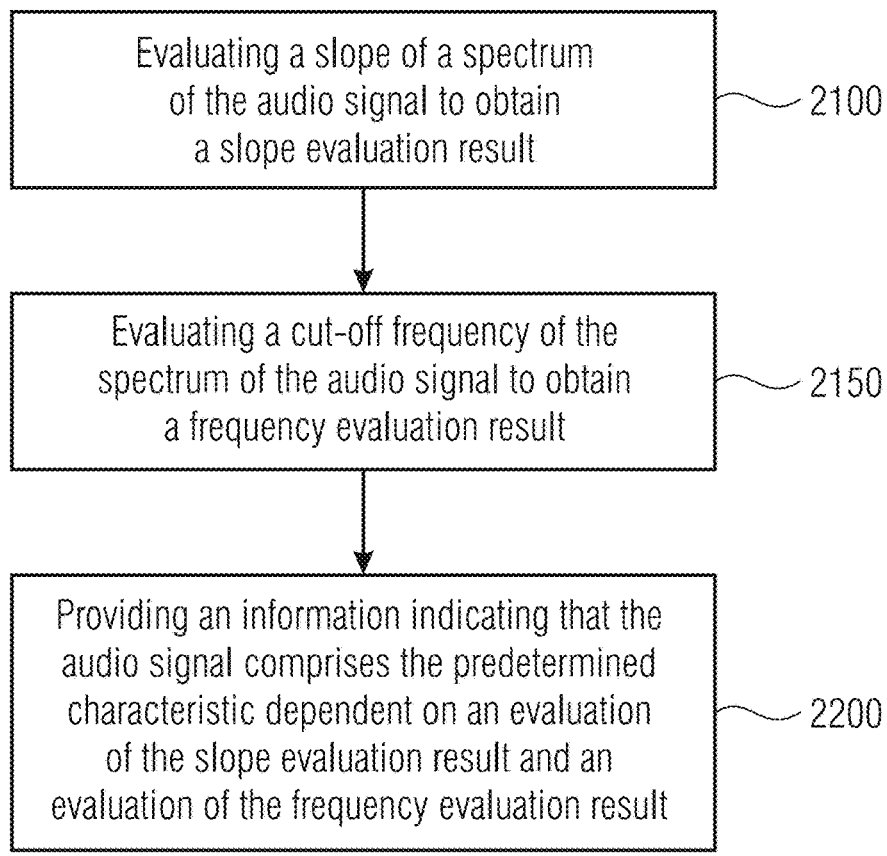
FIG. 13b shows a schematic flow chart of a further method for determining a predetermined characteristic related to an artificial bandwidth limitation processing of an audio signal according to an embodiment of the second aspect, the method also evaluating a cut-off frequency.

FIG. 13a shows a schematic flow chart of a method 2000 for determining a predetermined characteristic related to an artificial bandwidth limitation processing of an audio signal. The method 2000 comprises a step 2100 comprising evaluating a slope of a spectrum of the audio signal to obtain a slope evaluation result. A step 2200 comprises providing an information indicating that the audio signal comprises the predetermined characteristic dependent on an evaluation of the slope evaluation result. The information 66 provided by the processor 64 may contain a variable referred to herein after as D that may be used to activate bandwidth extension processing that is applied to improve the sound quality of an audio sing, for example, using the signal enhancer. Optionally, the cut-off frequency $f_c$ may be determined, i.e., an optional step may comprises evaluating a cut-off frequency of the spectrum of the audio signal to obtain a frequency evaluation result such that the information indicating that the audio signal comprises the predetermined characteristic may be provided dependent on the slope evaluation result and dependent on the frequency evaluation result. The cut-off frequency $f_c$ may be used to control the bandwidth extension (BWE) by determining the frequency range at which BWE operates such that it only recovers the frequency region that is missing. This is illustrated in FIG. 13b showing a schematic flowchart of a method 2500 according to another embodiment, the method comprising the step 2150 comprising evaluating a cut-off frequency of the spectrum of the audio signal to obtain a frequency evaluation result The second application where ABLA, i.e., detection of the respective characteristic, may be used is the classification of an audio signal as a signal of low sound quality due to lossy compression. This classification can be based solely on the described analysis or by combining it with other information that can be extracted from the audio signal. Examples for additional information that can be used in this context is the width of the stereo signal or the presence of Spectral Band Replication (SBR), i.e., a method that is applied by lossy codecs. The ABLA is then used to activate other processing that improves the sound quality of signals with a lossy compression, being not restricted to BWE processing. Examples are filtering for enhancement of the stereo width and of transient signal components.

The results of the ABLA, namely the parameter D and the cut-off frequency $f_c$, may be used for repairing such artifacts automatically without having a human operator involved. It may be of crucial importance to apply sound quality enhancement only to signals having degraded sound quality. Signals having high quality should not be processed in such a way because the sound quality can be negatively affected. Embodiments according to the second aspect allow to detect audio frames or audio signals being subjected to the artificial bandwidth limitation with a high precision. Audio signals have a natural bandwidth that is determined by the sound generating process. The bandwidth can change due to various technical processes, including bandwidth limitation that is applied for capturing, storing, processing and transmission of the signal. Bandwidth limitation is a low-pass filtering having the characteristics of a very steep attenuation, a very high attenuation and a cut-off frequency as described above.

In the following, reference will be made to the third and fourth aspect of the present invention referring to a concept for bandwidth extending a bandwidth limited signal in the third aspect, for example, responsive to having determined artificial bandwidth limitation according to the second aspect. Thus, embodiments according to the third aspect may be used as signal enhancer in connection with the second aspect.

The concept according to the third aspect aims to suppress several coding artifacts to improve the perceived sound quality. The technical steps may be implemented as post-processing and may be partially implemented using software that may be used by the decoder. The concept may work blindly without having access to the uncompressed audio signal and to other side information. The low bitrate coding enhancement processing according to the third aspect comprises or even essentially consists of a post-processor that introduces or enhances perceptual pleasantness related to concepts to unguided post-processing of audio material that has been precoded by heritage perceptual coders. Thereby, the precoded audio material can profit from modern concepts of perceptual pleasantness.

The embodiments which are described in connection with the third and fourth aspect may use a basic principle called spectral weighting or short-term spectral attenuation. Therefore, a time domain signal x[n] is transformed to its frequency domain representation X[k,m] where k and m donate the frequency and timeframe index, respectively. According to embodiments, a short-time Fourier transform (STFT) may be applied, but also other transforms may be used. The output signal Y of the spectral weighting may be given by the following equation $$Y[k,m]=G[k,m]\cdot X[k,m],$$

wherein the time domain representation y[n] of the frequency domain signal Y[k,m] may be computed by means of an inverse transform, for example, an inverse STFT, i.e., ISTFT. In the following sections, time domain signals may be denoted with small letters and frequency domain signals with capital letters. Indices k and m or frequency domain signals will be omitted for better readability. The spectral weighting will be explained in more detail in connection with an aspect being referred to as a spectral weighting in which details for the spectral weights G[k,m] are explained.

Figure 14:
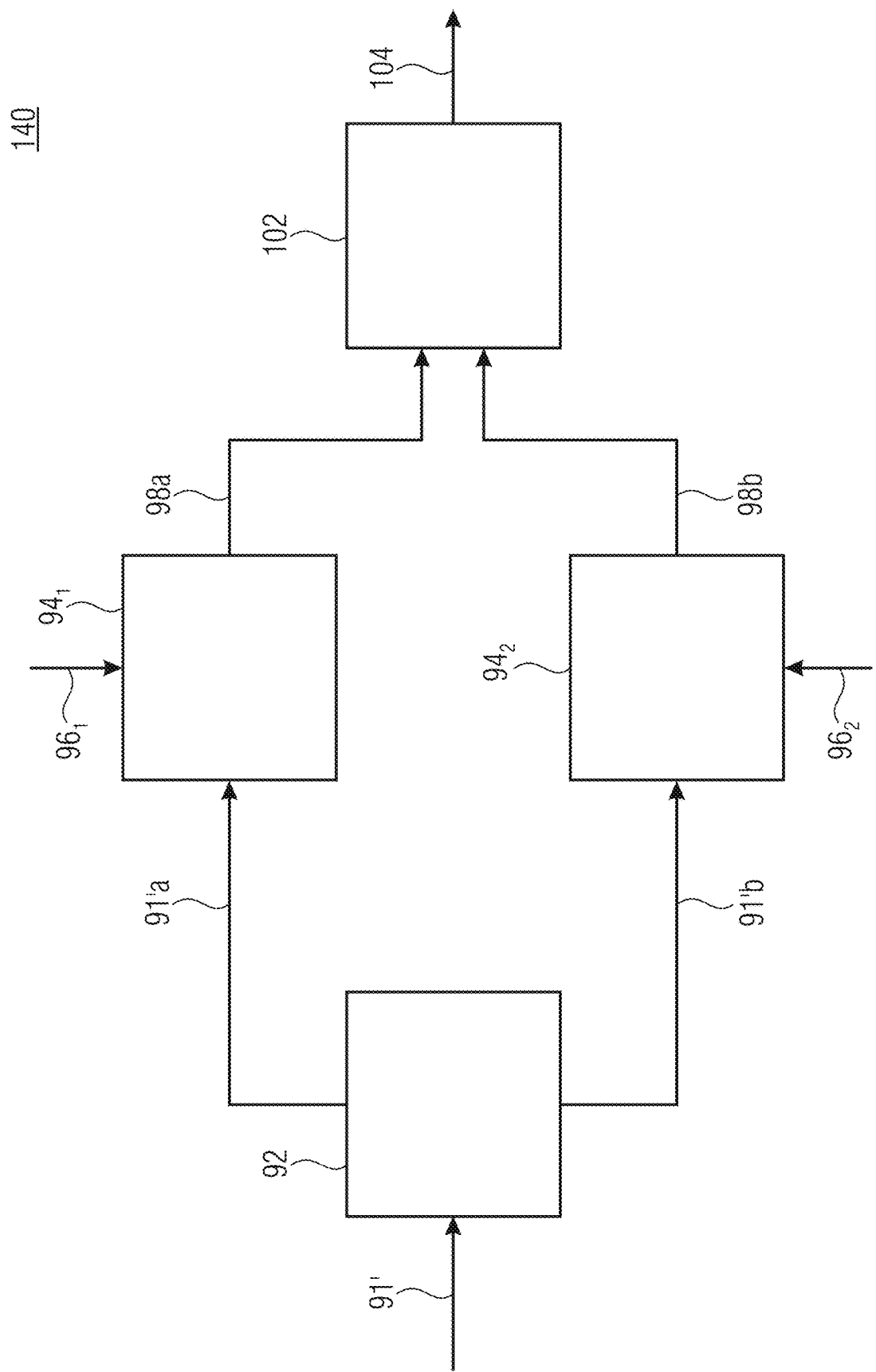
FIG. 14 shows a schematic block diagram of an apparatus according to an embodiment of the third aspect.

FIG. 14 shows a schematic block diagram of an apparatus 140 according to an embodiment of the third aspect. The apparatus 140 is configured for processing an audio signal and may receive the spectrum 12' of the audio signal for the processing. The apparatus 140 may be configured for receiving the time domain representation of the audio signal, i.e., the audio signal 12 and may derive the spectrum 12', for example, the apparatus 140 may comprise the spectrum calculator 44 for such a purpose.

The apparatus 140 comprises a separator 92 for separating a first portion 91'a of a spectrum 91' of an audio signal 91 from a second portion 91'b of the spectrum 91' of the audio signal 91. The first portion 91'a has a first signal characteristic and the second portion 91'b has a second signal characteristic. The audio signal 91 may be received by the apparatus 91 in the time domain and/or in the frequency domain and may be, for example, bandwidth-limited using a cut-off frequency $f_c$ and may be subjected to post-processing. One main feature of the third aspect relating to the bandwidth extension is that the input signal may be split into different characteristics such as transient and sustained signal portions which are treated independently by applying different parameter settings for the modules in each part.

The first and the second signal characteristic may differ from each other by way of different perceptions and/or by different characteristics in the frequency range. Although the embodiments are not limited hereto, the first and the second signal characteristics may be complementary to each other, i.e., by removing, excluding or subtracting one signal characteristic from the common spectrum 91', the remaining portion forms the other characteristic. By way of a non-limiting example, the first signal characteristic may be a middle frequency range of the spectrum and the second signal characteristic may be a side frequency range of the spectrum. Alternatively, the first signal characteristic may be a direct signal characteristic of the audio signal and the second signal characteristic may be an ambient signal characteristic of the audio signal. According to another embodiment, the first signal characteristic may be a tonal characteristic of the audio signal and the second signal characteristic may be a sustained signal characteristic of the audio signal which may be referred to as transient or the like. Alternatively, the first signal characteristic may be a speech characteristic of the audio signal and the second signal characteristic may be a non-speech characteristic of the audio signal. Other signal characteristics are also possible. Further, it is possible to form combinations thereof, i.e., to combine two or more of the above identified characteristics. The first and second portions 91'a and 91'b may comprise a comparable or same bandwidth, starting frequency and stop frequency and may form, when being combined with each other the spectrum 91' again. I.e., the splitting or separation may be done by means of transient-sustained signal decomposition. Alternatively or in addition, other decomposition rules or methods are possible, such as mid-side signal decomposition, direct-ambient signal decomposition or foreground/background decomposition and/or speech-nonspeech decomposition, etc.

The apparatus 140 may comprise a first bandwidth extender $94_1$ for extending a bandwidth of the first portion 91'a using first parameters $96_1$ associated with the first signal characteristic for obtaining a first extended portion 98a. The apparatus 140 further comprises a second bandwidth extender $94_2$ for extending a bandwidth of the second portion 91'b using second parameters $96_2$ associated with the second signal characteristic for obtaining a second extended portion 98b. Bandwidth extension may comprise forming additional parts or frequency portions in the spectrum to be combined with the original signal. This may include a copy and/or a generation of such further frequency regions by transposing, spectral stretching or generation of overtones through application of a non-linearity. By using a first and a second bandwidth extender, the different signal characteristics present in the different portions 91'a and 91'b may be considered differently by the respective bandwidth extender $94_1$- and $94_2$. For example, a bandwidth of a copied portion, a number of copies, an alternation of copies, a spectral shaping of a signal being obtained and/or frequency characteristics of spectral portions being artificially generated may vary between different signal characteristics which may be considered by using different sets of parameters $96_1$ and $96_2$ in connection with the different signal characteristics. This allows for a high adaptation of the bandwidth extension to the signal characteristic.

Although having described the apparatus 140 as comprising a first and a second bandwidth extender for considering a first and a second signal characteristic, an apparatus according to further embodiments may be configured for subjecting more than two, for example, three, four, five or even a higher number, to different bandwidths extensions. Such an apparatus may comprise corresponding numbers of bandwidth extenders but may also use one bandwidth extender for at least two bandwidths extensions, for example, when sequentially processing different signal characteristics. Accordingly, the apparatus 140 may be implemented by implementing one bandwidth extender 94 and for adapting the bandwidth extender with different parameters $96_1$ and $96_2$ sequentially while processing the different portions 91'a and 91'b sequentially.

The apparatus 140 comprises a combiner 102 configured for using the first and second extended portions 98a and 98b for obtaining an extended combined audio signal 104. The extended portions 98a and 98b may be received from the combiner 102 as a time domain representation such that the combined audio signal 104 may also be in the time domain. Alternatively, the extended portions 98a and 98b may be received by the combiner in the frequency domain such that the combined audio signal 104 may also be in the frequency domain so as to be converted to the time domain afterwards. Alternatively, the combiner 102 may be configured to transform each of the single portions 98a and 98b or a combined version thereof into the time domain and for providing the combined audio signal 104 in the time domain.

Figure 15:
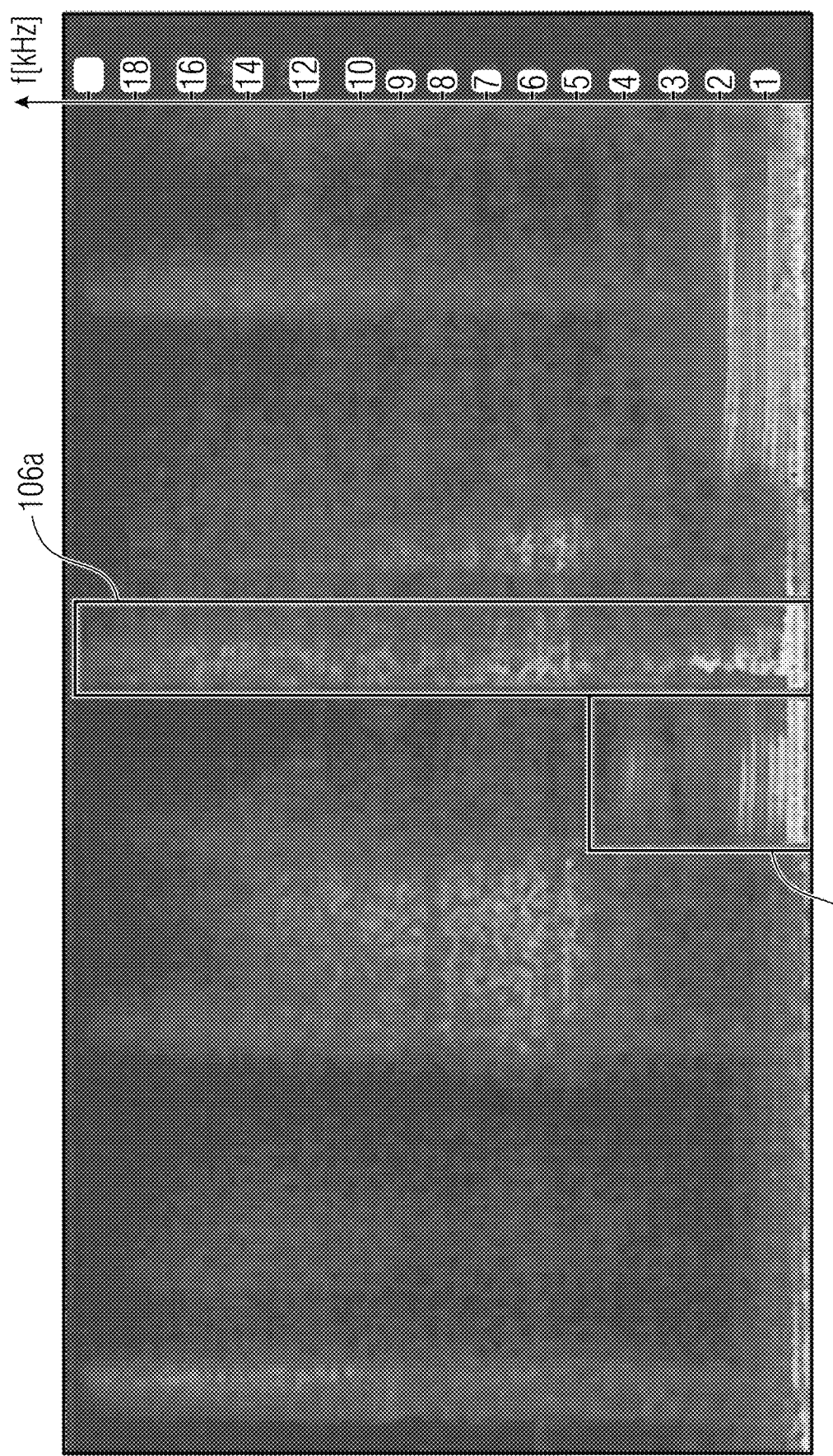
FIG. 15 shows a schematic diagram illustrating an example spectrum comprising different components according to an embodiment of the third aspect.

FIG. 15 is a schematic diagram illustrating an example spectrum comprising different components 106a and 106b. For example, the component 106a may be related to a transient signal of the spectrum, for example, obtained by a snare drum. Such signals may have a higher correlation within one spectral frame and may also have a higher bandwidth than a sustained signal, for example, indicated by the spectral portion 106, which may relate to a human voice. In FIG. 15, it may be seen that the transient portion 106a has considerably more bandwidth than the portion 106b, for example, a singing voice.

Figure 16:
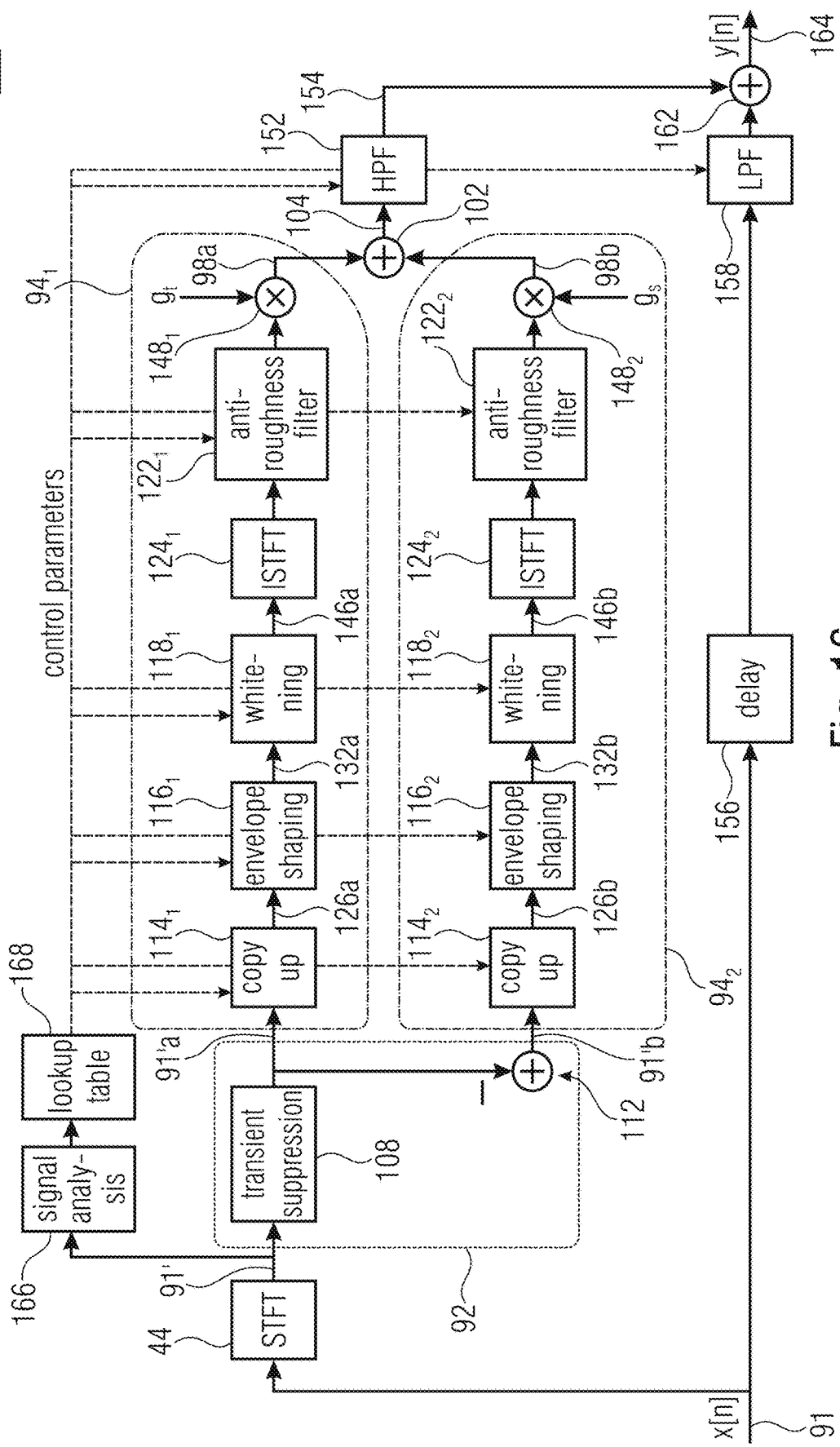
FIG. 16 shows a schematic block diagram of an apparatus according to an embodiment of the third aspect.

FIG. 16 shows a schematic block diagram of an apparatus 160 according to an embodiment of the third aspect. In the following, reference will be made to the audio signal and the signals derived thereof. The audio signal may be present and/or processed in the time domain and/or in the frequency domain, wherein both variants may be transformed with respect to each other by a frequency to time conversion or a time to frequency conversion. Thus, when referring to the audio signal, this may refer to the time domain representation and to the frequency domain representation synonymously acceptable being explained explicitly otherwise.

The apparatus 160 comprises the separator 92 being configured for receiving the frequency domain representation 91' of the audio signal 91. For this purpose the apparatus 160 may comprise the spectrum calculator 44 for obtaining the frequency domain representation 91' from the time domain representation.

The separator 92 may comprise a transient suppressor 108 configured for receiving the audio signal, for example, the frequency domain representation thereof, and for reducing transient portions in the audio signal 91 so as to obtain a first modified audio signal. The separator 92 may be configured for obtaining the first portion 98a based on the first modified audio signal. According to an embodiment, the first portion 98a corresponds to the first modified audio signal. According to another embodiment, a processing of the first modified portion is performed, for example, a filtering, amplification, attenuation or the like.

The separator 92 may comprise a subtractor 112 for subtracting the first modified audio signal, the first portion 91'a for example, from the audio signal 91 so as to obtain a second modified signal. According to an embodiment, the second modified signal is the second portion 91'b. As described for the first portion 91'a, the second portion 91'b may also be obtained based on a processing of the obtained subtraction result. Thus, by removing the first portion 91'a from the audio signal 91, the second portion 91'b may be obtained. By obtaining the first modified signal and by subtracting it from the audio signal so as to obtain the second modified signal, decomposition of the audio signal into the two portions may be performed.

The separator 92 may be configured to operate in the frequency domain or in the time domain and to process the audio signal 91 such that the transient suppressor 108 reduces or eliminates transient and/or tonal portions for each subband of a spectrum of the audio signal 91. This may lead to less or even no processing for subbands comprising little or non-transient or little or non-tonal (i.e. noisy) portions. The transient suppressor 108 may comprise a transient processing stage, a tonal processing stage and/or a combining stage so as to process one of the characteristics to be separated by suppressing them or by amplifying them. The frequency domain representation of the audio signal 91 may comprise a multitude of subbands (frequency bands), wherein the transient processing stage and/or the tonal processing stage are configured to process each of the frequency bands. Alternatively, the spectrum obtained by frequency conversion of the audio signal 91 may be reduced, i.e., cut, to exclude certain frequency ranges or frequency bands from further processing, such as frequency bands containing the selected characteristic or missing the selected characteristic. This may allow for a reduced computational effort and thus for faster and/or a more precise processing.

The transient processing stage may be configured to determine for each of the processed frequency bands, if the frequency band comprises transient portions. The tonal processing stage may be configured to determine for each of the frequency bands, if the audio signal 91 comprises tonal portions in the frequency band. The transient processing stage may be configured to determine at least for the frequency bands comprising transient portions spectral weighting factors, wherein the spectral weighting factors are associated with the respective frequency band and may allow to attenuate/exclude or amplify the respective portions. Transient and tonal characteristics may be identified by spectral processing. A level of transiency and/or tonality may be measured by the transient processing stage and/or the tonal processing stage of the separator 92 and may be converted to a spectral weight. The separator 92 may be configured to determine spectral weighting factors at least for frequency bands comprising the tonal portions. The spectral weighting factors may comprise a multitude of possible values, the magnitude of the spectral weighting factors indicating an amount of transient and/or tonal portions in the frequency band.

The spectral weighting factors may comprise an absolute or relative value. For example, the absolute value may comprise a value of energy of transient and/or tonal sound in the frequency band. Alternatively, the spectral weighting factors may comprise the relative value such as a value between 0 and 1, the value 0 indicating that the frequency band comprises no or almost no transient or tonal portions and the value 1 indicating the frequency band comprising a high amount or completely transient and/or tonal portions. The spectral weighting factors may comprise one of a multitude of values such as a number of 3, 5, 10 or more values (steps), e.g., (0, 0.3 and 1), (0.1, 0.2, . . . , 1) or the like. A size of the scale, a number of steps between a minimum value and a maximum value may at least zero but advantageously at least one and more advantageously at least five. Advantageously, the multitude of values of the spectral weights comprises at least three values comprising a minimum value, a maximum value and a value that is between the minimum value and the maximum value. A higher number of values between the minimum value and the maximum value may allow for a more continuous weighting of each of the frequency bands. The minimum value and the maximum value may be scaled to a scale between 0 and 1 or other values. The maximum value may indicate a highest or lowest level of transiency and/or tonality.

A combining stage of the separator 92 may be configured to combine the spectral weights for each of the frequency bands with the audio signal. The separator 92 may be configured to apply the combined spectral weights to each of the frequency bands. For example the spectral weights may be multiplied with spectral values of the audio signal 91 in the processed frequency band.

By suppressing or excluding some portions/characteristics from the audio signal 91, a first modified signal missing the respective characteristic but comprising the other characteristic may be obtained. By subtracting the signal from the audio signal an inverse signal comprising the suppressed characteristic and missing the characteristic of the first modified signal may be obtained by way of the second modified signal.

In the following, reference will be made to an example configuration of the bandwidth extenders $94_1$ and $94_2$. Each of the bandwidth extenders $94_1$ and $94_2$ may comprise a duplicator 114 for duplicating at least a part of the respective portion, may comprise an envelope shaper 116 shaping at least the extended portions generated by the duplicator, may comprise a whitener 118 for equalizing at least the extended portions and/or may comprise an anti-roughness filter 122 for phase-shifting at least a portion of the extended portion. Each of these elements may be arranged together with other referenced elements. Alternatively, some or all of those elements may be absent and/or may be substituted by other elements. For example, instead of a copying performed by the duplicator, an artificial generation of a bandwidth may be implemented by the bandwidth extender, such that a bandwidth generator may substitute the duplicator 114. Alternatively, a shaping or whitening of the spectrum may be dismissed and/or other processing may be used. Further, the anti-roughness filter 122 is optional. Although being illustrated as filtering a respective signal in the time domain by being supplied with the output of an inward short-term Fourier transform block 124, the anti-roughness filter may be configured for operating in the frequency-domain and may therefore be arranged before a respective inverse short-term Fourier transform block 124. Thus, further to the arranged blocks, also an order thereof may be varied.

Each of the bandwidth extenders $94_1$ and $94_2$ may comprise a respective first and second duplicator $114_1$ and $114_2$. The duplicators $114_1$ and $114_2$ are configured for duplicating at least a part of the respective first or second portion $91'a$ and $91'b$ and for combining at least one version of the duplicated part of the first portion, the second portion respectively with the first portion, the second portion $91'a$, $91'b$, respectively, so as to obtain a respective extended portion $126a$, $126b$, respectively.

Figure 17A:
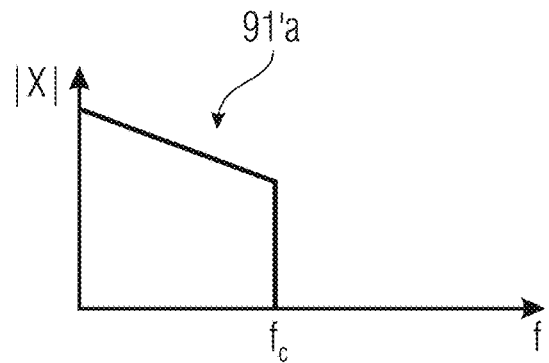
FIG. 17a shows an example spectrum of a first portion of the audio signal, according to an embodiment of the third aspect.

When referring now to FIG. 17a, there is shown an example spectrum of the first portion $91'a$, wherein the explanation given refers to the second portion $91'b$ without any limitation. The portion $91'a$ may have a relevant energy or amplitude |X| below the cut-off frequency $f_c$ and may comprise a low amount of energy or even no energy above the cut-off frequency $f_c$. The spectrum may decrease with an increase in frequency. In other words, FIG. 17a shows the magnitude spectrum |X| of a band-limited signal. The cut-off frequency is denoted as $f_c$.

Figure 17B:
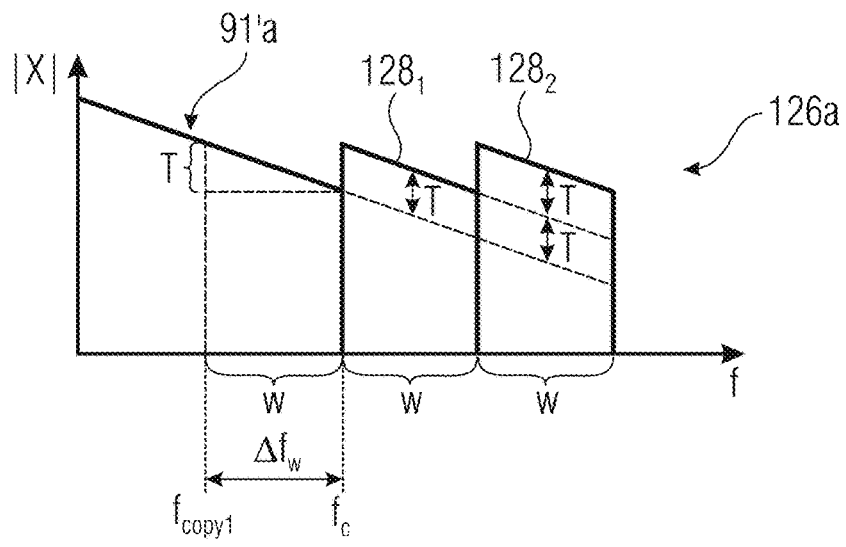
FIG. 17b shows a schematic diagram of the first portion being extended by a number of two duplicated parts according to an embodiment of the third aspect.

FIG. 17b shows a schematic diagram of the first portion $91'a$ being extended by a number of two duplicated parts $128_1$ and $128_2$. Each of the duplicated parts $128_1$ and $128_2$ may be a copy of a frequency band w of the first portion $91'a$ being copied to a frequency range unoccupied by the portion $91'a$, i.e., to frequency ranges above the cut-off frequency $f_c$, wherein the duplicated portions $128_1$ and $128_2$ may be combined so as to directly order on the original signal, i.e., the first portion $91'a$. FIG. 17b therefore illustrates how the copy-up is performed. Complex spectral coefficients are shifted from a so-called source patch w in the frequency interval $[f_c-w, f_c]$ to destination patches in the intervals $[f_c, f_c+w, f_c+2w]$, etc., i.e., to $[f_c(n-1)w, f_c+nw]$ for each n, wherein n is a variable ranging from 1 to the number of patches or number of copies being inserted. The number n being 2 by non-limiting example in FIG. 17b and a width $Df_w$ of the duplicating portion may be adjusted by the apparatus 160 independently for each of the bandwidth extenders $94_1$ and $94_2$. I.e., how often the source patch w is shifted may depend on the desired bandwidth and/or a number of patches, wherein both may be a tunable parameter. As on the decreasing magnitude of the spectrum, steps or discontinuities at locations where the patch is attached may occur.

The copied part of the first and second portion may range from a first intermediate frequency, for example, $f_{copy1}$ of the first portion $91'a$ to a maximum frequency $f_f$ of the first portion. Accordingly, the copied part of the second portion may comprise a second frequency range ranging from a same or different intermediate frequency of the second portion $91'b$ to a maximum frequency of the second portion which may also be the cut-off frequency $f_c$. Based on different intermediate frequencies, the width Dfw may be different. For. obtaining a same resulting bandwidth, therefore, a number of patches may also vary between the different bandwidth extenders.

For avoiding unwanted artifacts, the first bandwidth extender may comprise a first envelope shaper $116_1$ and the second bandwidth extender $94_2$ may comprise a second envelope shaper $116_2$. The envelope shapers $116_1$ and $116_2$ may be configured for shaping at least the extended portion, i.e., frequency portions above the cut-off frequency $f_c$. Shaping the envelope, i.e., performing a spectral envelope shaping, may be used as frequently, magnitude spectra are not flat, they tend to fall in magnitude towards higher frequencies as illustrated in FIG. 17a. FIG. 17b visualizes the magnitude spectrum when copy-up is performed without further adaptations. Abrupt transitions in the magnitude spectrum may appear at frequencies $f_c, f_c+w, \ldots, f_c+kw$. This may lead to a piercingly bright sound perception which shall be prevented by the envelope shapers $116_1$ and $116_2$.

To avoid such effects, the spectral tilt T as shown in FIG. 17b may be estimated by calculating the slope |X| which has been fitted by means of linear regression to the logarithmic spectrum of the source patch which comprises the frequency interval $[f_c\text{-w}, f_e]$. Each patch w may be attenuated by a value kT, i.e., the higher the patch is copied into the frequency range, the higher the attenuation may be. k may be a natural number and may be the so-called patch order, which starts from 1 and is increased for each additional patch which is shifted and may thus correspond to n mentioned before.

In other words, FIG. 17b shows a copy-up of spectral coefficients without envelope shaping. The source for copy-up is from the interval $[f_c\text{-w}, f_e]$, where w is the patch width. During analog shaping, the magnitude of the copied target patches in the interval $[f_c, f_{c+2w}]$ is attenuated by a multiple of T, which stands for the spectral tilt.

Figure 17C:
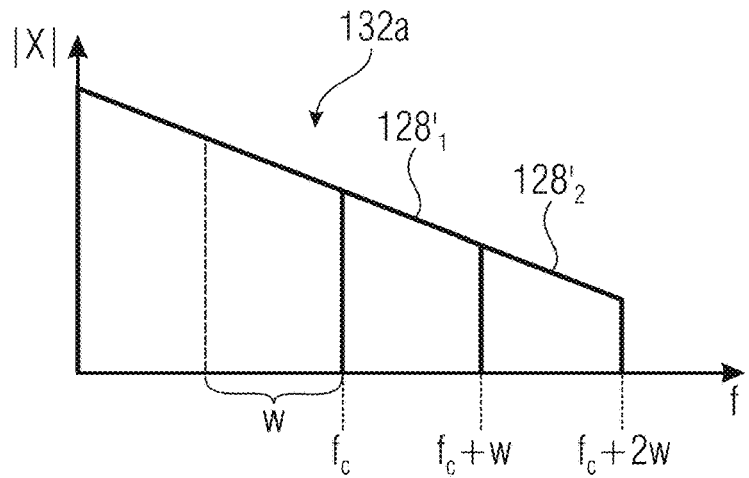
FIG. 17c shows an example magnitude spectrum that may be obtained from an envelope shaper being configured for shaping at least the extended portions of FIG. 17b, according to an embodiment of the third aspect.

FIG. 17c shows an example magnitude spectrum 132a that may be obtained from the envelope shaper $116_1$ being configured for shaping at least the extended portions $126_1$. Based on the interpolation, the magnitudes of the copied portions $128_1$ and $128_2$ may be shaped or attenuated so as to obtain a homogenous spectrum. FIG. 17c shows the magnitude spectrum of the envelope shaping with patch order 2, wherein the patch order may comprise any value of 1 or higher. Each of the bandwidth extenders $49_1$ and $49_2$ may comprise a whitener for equalizing at least the extended first portion, the extended second portion, respectively. Spectral whitening may be done by raising spectral values and lowering spectral peaks.

Figure 18:
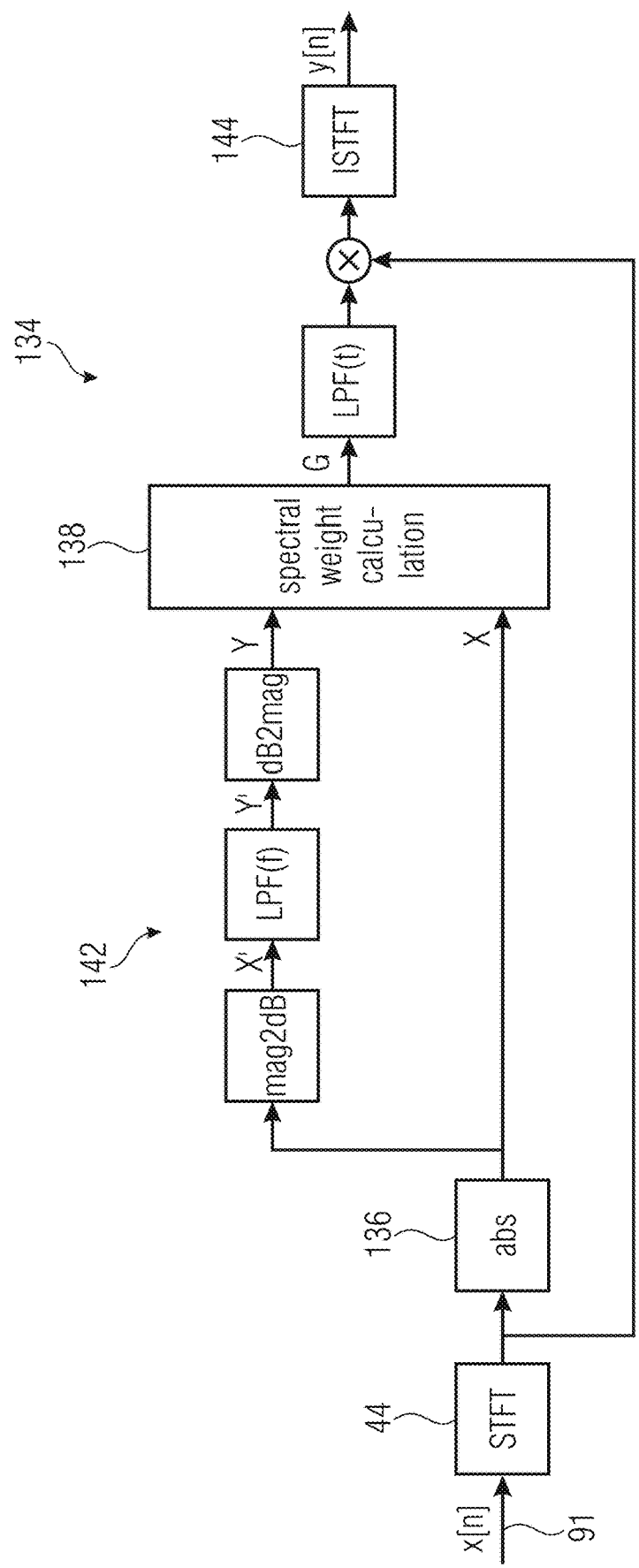
FIG. 18 shows a schematic block diagram of a spectral whitener being configured for whitening the audio signal according to an embodiment of the third aspect.

For a better understanding, FIG. 18 shows a schematic block diagram of a spectral whitener being configured for whitening the audio signal 91 independently. The whitener may comprise the spectrum calculator 44 so as to obtain a spectrum of the audio signal. The whitener 134 may be configured for comparing the magnitude X[k,m] of each spectral coefficient and timeframe to a smoothed version Y[k,m], where k is the spectral coefficient index and m the frame index. Y[k,m] may be derived by smoothing logarithmic spectral magnitudes over frequency. Subsequently, these logarithmic values may be transformed to the linear domain using a determination rule according to $$Y = 10^{\frac{Y'}{20}}$$

Real valued spectral weights G[k,m] may be computed as described by the determination rule:

$$G = \begin{cases} \left(\frac{Y^{\alpha_1} + \gamma_1(X^{\alpha_1} - Y^{\alpha_1})}{X^{\alpha_1}}\right)^{\beta_1} & \text{if } X \geq Y \\ \left(\frac{Y^{\alpha_2} + \gamma_2(X^{\alpha_2} - Y^{\alpha_2})}{X^{\alpha_2}}\right)^{\beta_2} & \text{if } X < Y \end{cases}$$

Again, index k and m are omitted for a better readability. $\alpha_1, \alpha_2, \beta_1, \beta_2, \gamma_1, \gamma_2$ are tunable parameters that may be adapted for each of the whiteners $118_1$ and $118_2$ independently. The whitener may comprise a calculator 126 for calculating absolute values of the spectrum. Those values may be referred to as X, wherein the values are ones provided to a calculator 138 for calculating any spectral weights G and are ones provided to a smoothing path 142 so as to obtain the smoothed version Y. A frequency converter 144 may be configured for transforming the result into a time domain. When referring now to FIG. 16, there may be seen that the whitener $118_1$ and $118_2$ may already operate in the frequency domain such that the respective whitener may be implemented without the spectrum calculator 44 and/or the frequency converter 144 or the like.

Each of the bandwidth extenders $94_1$ and $94_2$ may comprise a respective anti-roughness filter $122_1$, $122_2$, respectively, for phase-shifting at least a portion of the extended first portion, of the extended second portion, respectively. This may either be executed as phase-shifting the copied portions $128_1$ and $128_2$ and/or the shaped versions $128'_1$, $128'_2$ thereof and/or the whitened versions 146a and 146b, respectively. I.e., the anti-roughness filter is configured for phase-shifting the respective extended portion or signal the right thereof so as to obtain a phase-shifted signal. The anti-roughness filter $122_1$ and $122_2$ may be configured for applying different phase-shifts to the respective signal to be filtered. By using the phase shift, a phase-shift of the copied portion or the extended portion with respect to the original signal may be obtained. Alternatively, the anti-roughness filter may perform a phase-shift to the complete signal provided. This may be implemented, for example, when the respective core portion is substituted afterwards by a non-phase-shifted portion as will be described in the following. The anti-roughness filter $122_1$ and $122_2$ may be implemented so as to filter a respective signal in the time domain. Therefore, an ISTFT blocks $124_1$, $124_2$ may be arranged so as to provide a respective signal in the time domain. Alternatively, the anti-roughness filter $122_1$ and $122_2$ may be implemented so as to filter in the frequency domain. In such a case, the ISTFT blocks $124_1$ and $124_2$ may be absent or may be arranged after the anti-roughness filters $122_1$, $122_2$, respectively. Anti-roughness filtering may be performed to decrease the perceived roughness which is mainly evoked by the copy-up. A filter which does not affect the timbre of the signal but mainly changes the phase of the signal may be suitable here. For example, two nested allpass filters may be arranged in parallel and may be calculated in the time domain. Nested of allpass filters may be understood as $H_1(z)$ and $H_2(z)$ denoting, unity-gain allpass transfer functions of a respective filter, then both $H_1(H_2(z))$ and $H_2(H_1(z))$ are allpass filters.

Optionally, each of the bandwidth extenders $94_1$ and $94_2$ may comprise an amplifier/attenuator $148_1$, $148_2$, respectively, for applying a gain $g_t$, $g_s$ respectively for amplifying the sustained or transient portions. A result may be the extended portions 98a and 98b provided to the combiner 102. As explained above, the extended portions 98a and 98b may be obtained differently and/or by only performing some of the signal modifications explained.

In connection with the roughness filter, the apparatus 160 may comprise a high-pass filter 152 for filtering the first extended portion and the second extended portion 98a and 98b, the combined signal 102, respectively, and synonymously so as to obtain a filtered signal 154. In parallel to the bandwidth extenders $94_1$ and $94_2$, the audio signal 91 may be subjected to a delay 156 for compensating time delays caused by the time-to-frequency conversion in block 44 and the frequency-to-time conversion in blocks $124_1$ and $124_2$. The apparatus 160 may comprise a low-pass filter 158 configured for filtering the delayed audio signal. The apparatus 160 may further comprise a combiner 162 configured for combining the low-pass filtered audio signal and the signal 154. According to an embodiment, the apparatus 160 is configured to match the upper frequency (cut-off frequency $X_c$) of the low-pass filter 158 with a lower edge frequency of the high-pass filter 152 so as to obtain a combined homogeneous signal. In particular, the apparatus 160 may be configured to adapt the respective lower frequency of the high-pass filter 152 together with the upper edge frequency (cut-off frequency) of the low-pass filter 158 responsive to and in accordance with the determined cut-off frequency of the audios signal 91. Thus, based on the high-pass filter 152, signal portions below the cut-off frequency $f_c$ may be dismissed or strongly attenuated such that only the extended and phase-shifted portions remain. In contrast hereto, the low-pass filter 158 may be used to dismiss, discard or strongly attenuate parts of the audio signal 91, portions thereof respectively extending beyond the cut-off frequency $f_c$. This allows for obtaining the extended and copied versions being phase-shifted with respect to the original audio signal 91 being only delayed so as to compensate for other delays within the bandwidth extenders, except for the anti-roughness filters $122_1$ and $122_2$. An obtained audio signal 164 may be an extended and optimized audio signal.

Because anti-roughness filtering shall only be applied to the bandwidth extended areas of the spectrum, the resulting signal may be high-pass filtered and added to the low-pass filtered and delayed input signal. Delay is used or needed to compensate for the delay introduced by the STFT. The cut-off frequencies of the aforementioned high-pass and low-pass filters may correspond to the cut-off frequency $f_c$ as shown, for example, in FIG. 17*a*.

Figure 19:
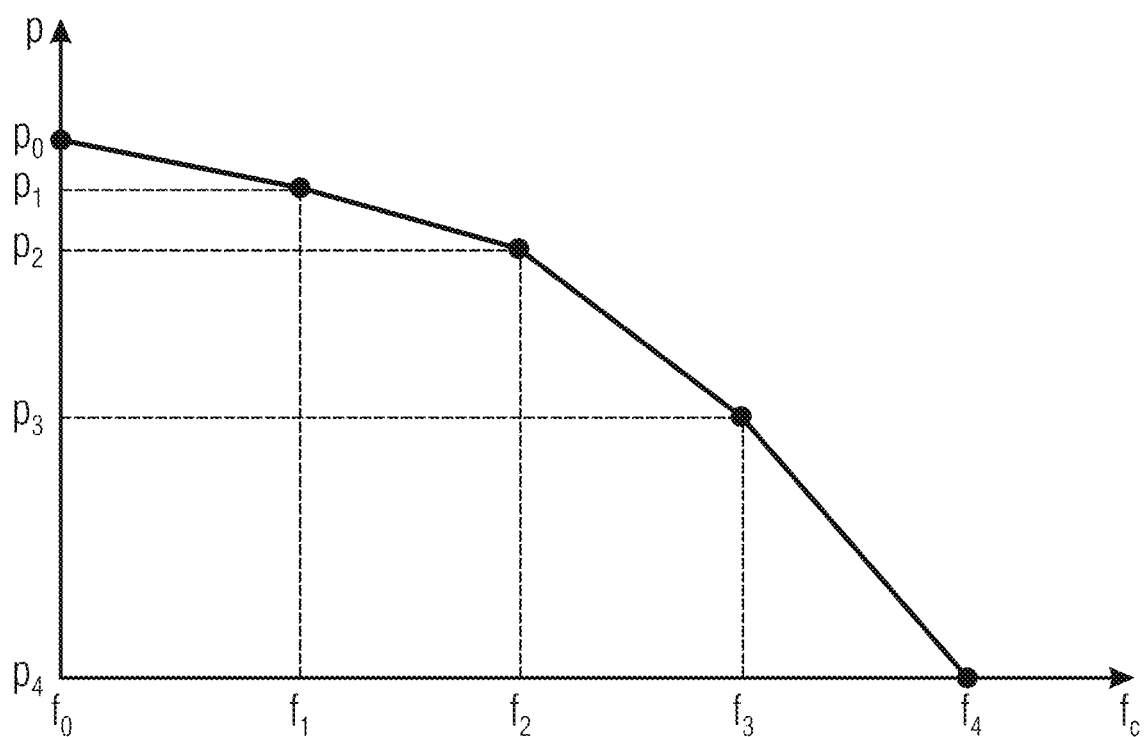
FIG. 19 shows a functionality of optional blocks being a signal analyzer and being a lookup table of the apparatus of FIG. 16, according to an embodiment of the third aspect.

With respect to FIG. 19 in connection with FIG. 16, there is shown a functionality of optional blocks 166 being a signal analyzer and 168 being a lookup table of the apparatus 160. Apparatus 160 may be a blind bandwidth extension. It may be an aim at restoring the lost bandwidth as described and without having further knowledge, for example, based on side information. The signal analyzer 166 may be configured for detecting, if the signal has been artificially band-limited or not and/or may estimate a cut-off frequency $f_c$ of the audio signal 91. Both steps may be performed as described in connection with the artificial bandwidth limitation analysis. Both values may be updated for each frame. Thus, the audio signal 91 may comprise a plurality of frames. The apparatus 160 may comprise the signal analyzer 166 configured for analyzing for each frame, the spectrum of the audio signal 91 for a characteristic relating to an artificial bandwidth limitation of the audio signal 91 and for determining a cut-off frequency $f_c$ in the audio signal 91.

Based on different cut-off frequencies which are schematically referred to as $f_0$, $f_1$, $f_2$, $f_3$, $f_4$, respectively in FIG. 19, different parameters are being used for adapting a functionality of the duplicator 114, the shaper 116, the whitener 118 and/or the anti-roughness filter 122 may vary. For example, a parameter p may be used to adapt the respective block. As illustrated in FIG. 19, different cut-off frequencies may be associated with different parameters or different values of the same parameter. Those values may be stored in a lookup table 168 for providing the respective parameter to the respective block. In FIG. 16, dashed connections indicate that a module is controlled, for example, in real-time. An example parameter may be But here is an example: one parameter can be the bandwidth of the source patch w. This parameter may affect the bandwidth which is artificially created. Another example parameter may be a time constant of a smoothing filter which may be different for different codecs. A plurality of other examples may be used to control the blocks 114, 116, 118 and/or 122 in the frequency domain and/or time domain.

The lookup table may hold tunings for some or all of the control parameters depending on the signal analysis results. In case of the estimation of the cut-off frequency $f_c$, for each selected frequency $f_i$ perceptual tuning of the corresponding parameter may be executed which may lead to a control value $p_i$. It is noted that a selected value $p_i$ may differ for the different bandwidth extenders, i.e., the apparatus 160 may be configured to adapt the respective block differently. Lookup table sampling points $s_i$ for a bandwidth extender $94_1$ or $94_2$ may be given, for example, as tuples according to $$s_i=(f_i,p_i)$$

In FIG. 19, there is shown an example for a tuning of one control parameter p for five cut-off frequencies $f_0$, to $f_4$. According to some examples, a parameter may be interpolated when intermediate values are appropriate. In such a case, between two sampling points in the interval $[f_i, f_{i+1}]$, linear interpolation may be executed according to:

$$p(f_c) = y_i + (f_c - f_i) \cdot \frac{y_{i+1} - y_i}{f_{i+1} - f_i}$$

An example for such interpolation values may be, for example, a width w of a respective patch as explained in connection with FIGS. 17*a*-17*c*. Parameters that may remain not subjected to interpolation may be, for example, a number of patches which is limited, for example, to integer values.

The apparatus may be configured for using the first and second parameters for a frame having the characteristic relating to an artificial bandwidth limitation. For other frames, the apparatus may be configured for using third parameters for the first bandwidth extender and fourth parameters for the second bandwidth extender, e.g., for frames having a characteristic different from the characteristic relating to an artificial bandwidth limitation. Alternatively, the apparatus may be configured to deactivate the first and second bandwidth extender for the frames having a characteristic being different from the characteristic relating to an artificial bandwidth limitation. Thus, the apparatus may be configured for performing bandwidth extension for frames that are considered to comprise the respective characteristic and may treat frames that are considered to not comprise the characteristic differently by using the third and fourth parameters or to leave the respective frame untreated.

The apparatus may thus comprise a lookup-table 168 comprising a plurality of parameters associated with a corresponding plurality of signal modification parameters such as the cut-off frequency $f_c$ and a plurality of other parameters associated with a corresponding plurality of signal modification parameters $f_c$ used for the first and second bandwidth extenders $94_1$, $94_2$ respectively. The apparatus may comprise a signal analyzer 166 for analyzing the spectrum for a modification applied to the audio signal 91. The apparatus 160 may be configured for deriving a modification parameter associated with the modification, for example, the cut-off frequency $f_c$ and/or a parameter relating to the steepness of the slope. The apparatus may be configured for deriving the respective first and/or second parameter using the lookup-table and using the modification parameter. According to one example, the apparatus may derive the modification parameter cut-off frequency and may determine the parameter p once for the first bandwidth extender and once for the second bandwidth extender.

In known concepts, artificial bandwidth extension is a well-known audio coding technique. Also, unguided bandwidth extension is well-known. However, semantic decomposition prior to bandwidth extension calculation is unknown. Semantic decorrelation may be used for the purpose of spatial upmixing, not containing a copy-up or transposition functionality like inevitably found in bandwidth extension applications. Therefore, the embodiments according to the third aspects differ. Another technique is known from a decorrelated bandwidth extension. Here, all high-band target spectral regions are decorrelated through dedicated decorrelators or through inserting decorrelated instances of random noise to be mutually independent. The present embodiments according to the third aspect teaches mutual decorrelation of semantically decomposed signal parts whereas the known concepts just comprise the decorrelation of different spectral target regions.

FIG. 20 shows a schematic flowchart of a method 3000 according to an embodiment of the third aspect. The method 3000 comprises a step 3100 comprising separating a first portion of a spectrum of the audio signal from a second portion of the spectrum of the audio signal, the first portion having a first signal characteristic and the second portion having a second signal characteristic. A step 3200 comprises extending a bandwidth of the first portion using first parameters associated with the first signal characteristic for obtaining a first extended portion. A step 3300 comprises extending a bandwidth of the second portion using the second parameters associated with the second signal characteristic, for obtaining a second extended portion. A step 3400 comprises using the first extended portion and the second extended portion for obtaining an extended combined audio signal.

According to the fourth aspect, the anti-roughness suppression may be performed as a post-processing, for example, after having performed bandwidth extension with a different concept. Thus, the anti-roughness suppression or anti-roughness filtering may be used so as to reduce artifacts, for example, in connection with the signal enhancer 48 when having determined that artificial bandwidth limitation has been performed and that the respective extension has also been performed.

FIG. 21 shows a schematic diagram of an apparatus 210 according to an embodiment of the fourth aspect. The apparatus 210 may be used, for example, for processing the audio signal 12 being subjected to an artificial bandwidth extension. The apparatus 210 may comprise the anti-roughness filter 122 for phase-shifting at least a portion of the audio signal 12, so as to obtain a phase-shifted signal 172. The anti-roughness filter 122 may operate, for example, in the time domain or alternatively in the frequency domain. According to an embodiment, the anti-roughness filter 122 may be configured for phase-shifting the complete audio signal 12. The apparatus 210 comprises a high-pass filter, e.g., the high-pass filter 152 for filtering the phase shifted signal 173, so as to obtain a first filtered signal 174. The apparatus 210 comprises a low-pass filter such as the low-pass filter 158 for filtering the audio signal 12 so as to obtain a second filtered signal 176. The apparatus 210 further comprises a combiner 162 for combining the signals 154 and 156 so as to obtain an enhanced audio signal 178, in which the perceived roughness is reduced. As was described in connection with the apparatus 160, the extended bandwidth is phase-shifted with respect to the audio signal 12. One aspect is to filter the audio signal 12, using the low-pass filter 158 so as to dismiss any signal portions that are above the selected filter frequency, the cut-off frequency $f_c$ respectively. This allows reducing or limiting effects or superposition of different signal portions in the combined signal 178.

Figure 22:
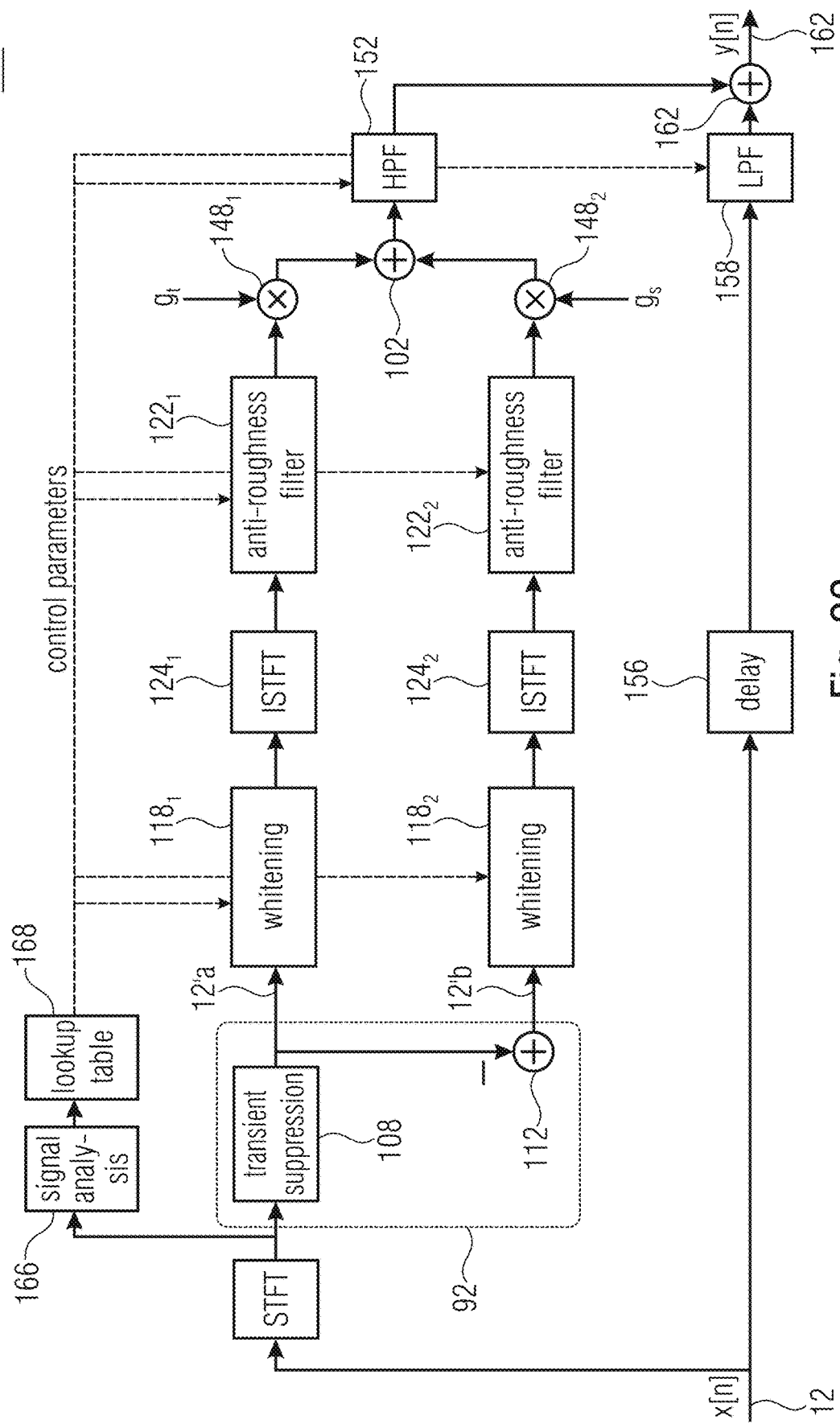
FIG. 22 shows a schematic block diagram of an apparatus comprising a separator according to an embodiment of the fourth aspect.

FIG. 22 shows a schematic block diagram of an apparatus 220 according to an embodiment of the fourth aspect. As described in connection with FIG. 16, the apparatus 220 may comprise the separator 92 for providing first and second portions 12'a and 12'b of the audio signal 12 in the frequency domain. The apparatus 220 may comprise different paths, each path comprising, by non-limiting example, a whitener $118_1$, $118_2$, respectively together with an anti-roughness filter $122_1$, $122_2$, respectively, operating by non-limiting example only, in the time domain. Alternatively or in addition, each path may comprise an amplifier/attenuator 148. Thus, the apparatus 220 may be configured for enhancing the audio signal 12 by enhancing the different portions 12'a and 12'b independently from each other. For such a purpose, the apparatus 220 may comprise the signal analyzer 166 and the lookup table 168 as described in connection with FIG. 16.

In particular, the apparatus 220 may comprise the signal analyzer 166 configured for determining a start frequency of bandwidth extension in the audio signal 12, the start frequency of bandwidth extension arranged between an extending bandwidth, e.g., the added patches w according to FIGS. 70a-c or processed versions thereof, of the audio signal 12 and a core bandwidth, i.e., the original bandwidth such as the bandwidth of the audio signal 91.

In connection herewith, the apparatus may be configured to adapt a lower frequency of the high-pass filter 152 and/or an upper frequency of the low-pass filter 158 according to a start frequency of bandwidth extension in the audio signal 12. The start frequency of bandwidth extension may be received by a further channel or may be determined by the signal analyzer 166.

According to an embodiment that may be combined with the independent embodiment of apparatus 210 and with each of the other embodiments of the fourth aspect, the apparatus may be configured to adapt the roughness filter and/or a signal enhancer, for example, comprising the whitener 118, an envelope shaper or the like for enhancing the audio signal 12, using a start frequency of bandwidth extension in the audio signal. For example, based on the start frequency of bandwidth extension in the audio signal 12, the lookup table may provide four different parameters for each of the blocks to be adjusted, such as the whitener 118 and/or the anti-roughness filter 122 and/or further blocks.

According to an embodiment that may be combined with each of the other embodiments according to the fourth aspect, the anti-roughness filter 122 may be arranged in a first path and wherein the low-pass filter 158 may be arranged in a second path. The second path may comprise the whitener 118 for equalizing a signal based on a signal provided to or received from the anti-roughness filter, i.e., an order or sequence of the whitener and the anti-roughness filter may be changed.

According to a further embodiment of the fourth aspect, which may be combined with each of the other embodiments, the anti-roughness filter 122 may be arranged in a first path and the low-pass filter 158 may be arranged in a second path. The apparatus 220 may comprise a signal enhancer configured to enhance the audio signal in the first path and at least partially in the frequency domain, for example, using the whitener 118 and/or the shaper 116. The second path may comprise a delay block such as the delay 156 for delaying the audio signal 12 by a delay corresponding to a delay in the first path caused by a time-to-frequency conversion and a frequency-to-time conversion within a tolerance range of at most ±10%, +5% or ±2% and probably excluding the anti-roughness filter delay.

According to a further embodiment, which may be combined with each of the other embodiments according to the fourth aspect, the anti-roughness filter 122 is a first anti-roughness filter. The apparatus comprises a separator for receiving a spectrum of the audio signal 12 and for separating a first portion 12'a of the spectrum 12' of the audio signal 12 from a second portion 12'b of the spectrum of the audio signal 12. The first portion 12'a has a first signal characteristic and the second portion 12'b has a second signal characteristic. The apparatus 220 may be configured for providing the first portion 12'a to a first path having the first anti-roughness filter $122_1$ and for providing the second portion 12'b to a third path having the second anti-roughness filter $122_2$.

According to a further embodiment which may be combined with the previously mentioned embodiment, the apparatus may be configured to apply a first gain $g_t$ to the first path and a second gain $g_s$ to the third path.

According to a further embodiment of the fourth aspect which may be combined with the previous and the penultimate embodiment, the apparatus may be configured for adjusting the first anti-roughness filter $122_1$ and the second anti-roughness filter $122_2$ differently from each other using a start frequency of bandwidth extension of the audio signal 12.

According to a further embodiment of the fourth aspect which may be combined with the last three embodiments of the fourth aspect, the separator comprises a transient suppressor, such as the transient suppressor 108 configured for receiving the audio signal 12 and for reducing transient portions in the audio signal 12 so as to obtain a first modified audio signal. The separator 92 is configured for obtaining the first portion 12'a based on the first modified audio signal, for example, by using the first modified audio signal as the first portion 12'a. The separator 92 further comprises the subtractor 112 for subtracting the first modified audio signal from the audio signal 12 so as to obtain a second modified signal. The separator 92 is configured for obtaining the second portion based on the second modified audio signal, for example, by taking the second modified audio signal as the second portion 12'b.

According to a further embodiment of the fourth aspect, which may be combined with the last four embodiments, the first signal characteristic is one of a) a middle frequency range of the spectrum; b) a direct signal characteristic of the audio signal; c) a tonal characteristic of the audio signal; and d) a speech characteristic of the audio signal. The second signal characteristic is according to the letters used: a) a side frequency range of the spectrum; b) an ambient signal characteristic of the audio signal; c) a sustained signal characteristic of the audio signal; and d) a non-speech characteristic of the audio signal.

According to a further embodiment of the fourth aspect, which may be combined with each of the other embodiments of the fourth aspect, the enhanced audio signal 164 comprises the second filtered signal being phase-shifted when compared to the first filtered signal, i.e., the upper frequency region is phase-shifted when compared to the lower frequency region.

Figure 23:
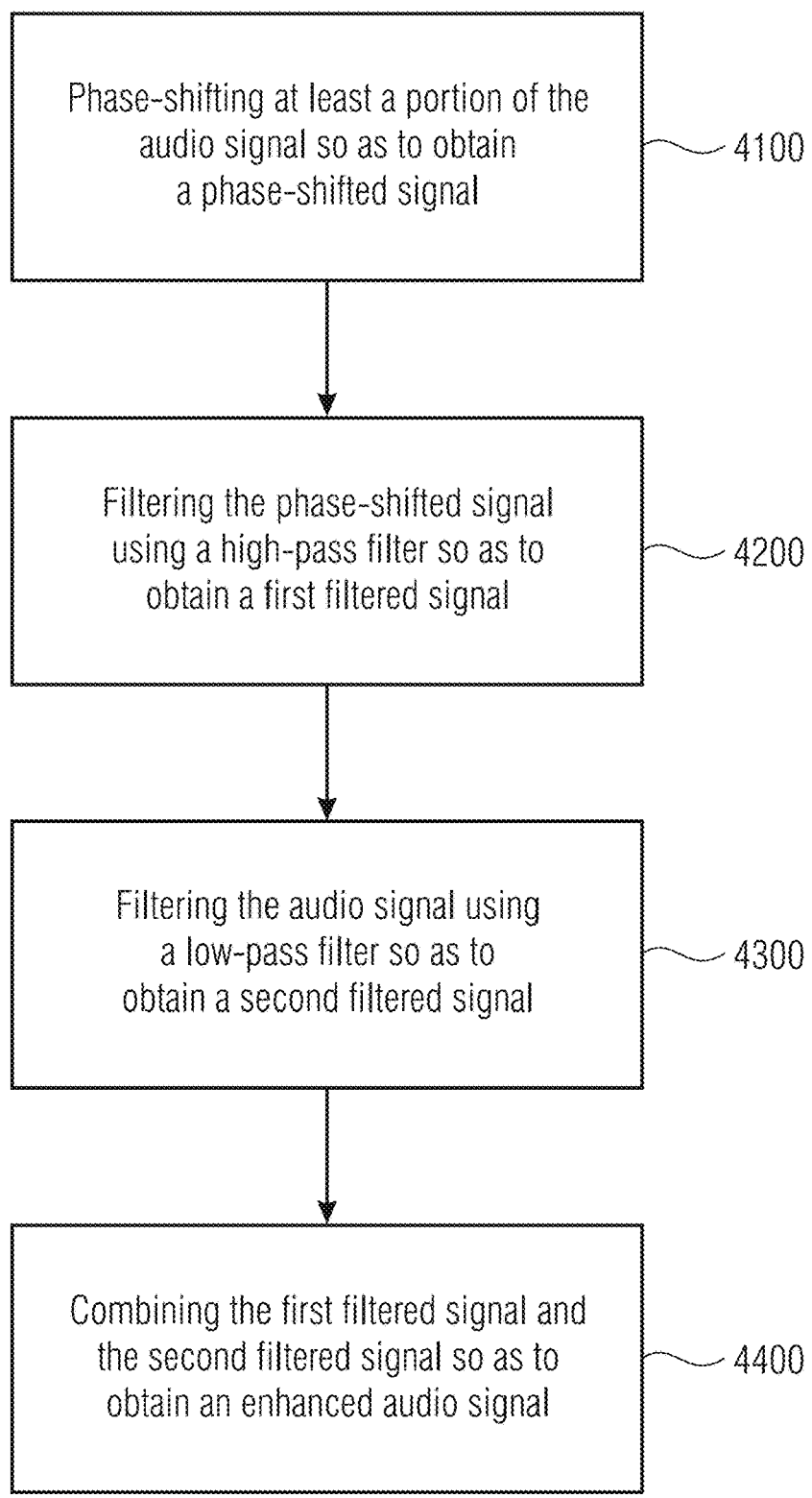
FIG. 23 shows a schematic flowchart of a method for processing an audio signal according to an embodiment of the third aspect.

FIG. 23 shows a schematic flowchart of a method 4000 for processing an audio signal. The method 4000 comprises a step 4100 comprising phase-shifting at least a portion of the audio signal so as to obtain a phase-shifted signal. A step 4200 comprises filtering the phase-shifted signal using a high-pass filter so as to obtain a first filtered signal. A step 4300 comprises filtering the audio signal using a low-pass filter so as to obtain a second filtered signal. A step 4400 comprises combining the first filtered signal and the second filtered signal so as to obtain an enhanced audio signal. In other words, the artificial bandwidth extension roughness suppression (ARS) targets to reduce artifacts such as the tonal spike artifact and the beating artifact as described before. As illustrated in FIG. 22, some of the ARS methods or blocks are also used by the BWE concept which already has been described before. It has to be noted too that these common methods or concepts may be used with different parameter tunings. In the following sections, differences between the apparatus 160 and the apparatus 220 will be outlined.

The signal analyzer is used to activate ARS in FIG. 22 by on the one hand detecting whether the signal has been artificially bandwidth-extended or not. On the other hand, a real-time estimation of the start frequency (cut-off frequency) of the artificial bandwidth extension may be performed which has been applied to the present signal. The description of the signal analyzes whether a concept may be performed according to the other aspects described herein. The signal analyzer results are forwarded to the lookup table 168 for obtaining an output thereof having included control parameters which affect the modules shown in FIG. 22. The lookup table 168 may comprise parameter tunings which were perceptually tuned for several start frequencies.

The lookup table for ARS may be based on the same principle as the BWE lookup table described in connection with FIG. 16 with the difference that the dependent variable may be the estimation of the BWE start frequency. Also the parameters which are controlled may differ.

In the following, additional embodiments and aspects of the invention will be described which can be used individually or in combination with any of the features and functionalities and details described herein.

According to a first aspect, an apparatus for determining a predetermined characteristic related to an artificial bandwidth limitation processing of an audio signal may have: a slope evaluator 52 configured for evaluating a slope 54 of a spectrum of the audio signal to obtain a slope evaluation result 56; and a processor 64 for providing an information 66 indicating that the audio signal 12 comprises the predetermined characteristic dependent on an evaluation of the slope evaluation result 56.

According to a second aspect when referring back to the first aspect, the apparatus may further have a frequency evaluator 58 configured for evaluating a cut-off frequency $f_c$ of the spectrum of the audio signal 12 to obtain a frequency evaluation result 62; wherein the processor 64 may be configured for providing the information 66 indicating that the audio signal 12 comprises the predetermined characteristic dependent on the evaluation of the slope evaluation result 56 and an evaluation of the frequency evaluation result 62.

According to a third aspect when referring back to the first or second aspect, the apparatus may be configured for determining the predetermined characteristic for a plurality spectrums $12'_1$, $12'_2$, $12'_3$ of the audio signal 12, wherein the slope evaluator 52 is configured for evaluating the slope 54 of each of the spectrums $12'_1$, $12'_2$, $12'_3$, wherein the frequency evaluator 58 is configured for evaluating each of the spectrums $12'_1$, $12'_2$, $12'_3$, and wherein the processor is configured for providing the information indicating that the audio signal comprises the predetermined characteristic for each of the spectrums $12'_1$, $12'_2$, $12'_3$.

According to a fourth aspect when referring back to the third aspect, the apparatus may further have: a determiner 78 configured for determining an energy E of a frequency band $f_h$ of the spectrum 12' and to provide a signal 82 comprising information indicating the energy E of the frequency band $f_h$ to the processor 64, wherein the processor 64 may be configured for providing the information 66 indicating that the audio signal 12 comprises the predetermined characteristic based on a previous spectrum if the energy E of the spectrum 12' is below an energy threshold level.

According to a fifth aspect when referring back to any of the first to fourth aspects, the slope evaluator 52 may be configured for evaluating an attenuation within the spectrum 12' and for providing the slope evaluation result 56 so as to indicate a measure for the attenuation, wherein the processor 64 may be configured for providing the information 66 indicating that the audio signal comprises the predetermined characteristic if the measure for the attenuation is at least a steepness threshold value.

According to a sixth aspect when referring back to any of the first to fifth aspects, the slope evaluator 52 may be configured for evaluating a steepness of the spectrum 12' and for providing the slope evaluation result 56 so as to indicate a measure for the steepness, wherein the processor 64 may be configured for providing the information 66 indicating that the audio signal 12 comprises the predetermined characteristic if the measure for the steepness is at least a steepness threshold value.

According to a seventh aspect when referring back to the fifth or sixth aspect, the slope evaluator 52 may be configured for determining a spectral difference function S(h) of the spectrum 12 using a window function, the window function combining a plurality of frequency values of the spectrum 12', and to determine the measure for the attenuation using results of the window function.

According to an eighth sixth aspect when referring back to any of the first to seventh aspects, the slope evaluator 52 may be configured for evaluating an attenuation between a first energy level of a first frequency band $f_1$ of the spectrum and a second energy level of a second frequency band $f_2$ of the spectrum 12', wherein the first energy band $f_1$ may have a first frequency range being lower when compared to a second frequency range of the second frequency band $f_2$, and for providing the slope evaluation result 56 so as to indicate a measure for the attenuation, wherein the processor 64 is configured for providing the information 66 indicating that the audio signal 12 comprises the predetermined characteristic if the measure for the attenuation is at least an attenuation threshold value.

According to a ninth aspect when referring back to any of the first to eighth aspects, the frequency evaluator may be configured for determining a measure for energy E in a frequency band of the audio signal and for determining the cut-off frequency $f_c$ based on the energy in a decreasing frequency range based on an increase of energy in the frequency range.

According to a tenth aspect when referring back to any of the first to ninth aspects, the apparatus may further have a filter 74 configured for receiving the frequency evaluation result 62 and for providing a filtered frequency evaluation result 62', wherein the processor may be configured for providing the information 66 indicating that the audio signal 12 comprises the predetermined characteristic based on a plurality of the slope evaluation results 56 and the filtered frequency evaluation result 62' associated with a plurality of spectrums $12'_1$, $12'_2$, $12'_3$ of the audio signal 12.

According to an eleventh aspect when referring back to any of the first to tenth aspects, the processor 64 may be configured for providing the information 66 indicating that the audio signal 12 comprises the predetermined characteristic by providing a respective information for a plurality of frames of the audio signal 12 for each of the plurality of frames, wherein the processor 64 may be configured for obtaining a plurality of frame results based on the plurality of frames and to combine the frame results so as to obtain a combined result 66' being valid for the plurality of frames.

According to a twelfth aspect when referring back to the eleventh aspect, the processor may be configured for executing a median filtering using the plurality of frame results for obtaining the combined result 66'.

According to a thirteenth aspect when referring back to any of the first to twelfth aspects, the apparatus may further have a resampling evaluator configured for evaluating the audio signal 12 for a predetermined characteristic related to an upsampling using a sampling frequency, wherein the apparatus is configured to adapt frequency ranges of the slope evaluator 52 and/or of the frequency evaluator 58 based on the sampling frequency.

According to a fourteenth aspect when referring back to the thirteenth aspect, the resampling evaluator may be configured for obtaining a negative evaluation result when the determination rule applies $X(k)$>threshold and $X(k)<X(k+1)$−offset parameter wherein X(k) is a value X of the spectrum at frequency index k and offset parameter is a noise suppressing value.

According to a fifteenth aspect when referring back to the thirteenth or fourteenth aspect, the resampling evaluator may be configured for obtaining a positive evaluation result indicating that the audio signal 12 was subjected to an upsampling limiting the bandwidth at frequency index k when the determination rule applies $S(k)$>threshold wherein S(k) is a spectral difference function relating to the spectrum at the frequency index k.

According to a sixteenth aspect when referring back to any of the first to fifteenth aspects, the apparatus may further have a signal enhancer 48, 125, 200 configured for reducing artifacts caused by the artificial bandwidth limitation processing of the audio signal 12 dependent on the information indicating that the audio signal 12 comprises the predetermined characteristic or dependent on an information indicating that the audio signal comprises a characteristic related to spectral enhancement processing.

According to a seventeenth aspect when referring back to the sixteenth aspect, the signal enhancer may be configured for filling a spectral gap 202 using a weighted filling signal F and/or for attenuating a spectral island 204 using weighting factors G, W.

According to an eighteenth aspect, an apparatus for processing an audio signal 91 may have: a slope evaluator 52 configured for evaluating a slope 54 of a spectrum 91',x' of the audio signal 91 to obtain a slope evaluation result 56; a frequency evaluator 58 configured for evaluating at least a first and a second frequency edge $206_1$-$206_4$ at which the spectrum 91',X' comprises an edge; and a processor 208, 228 configured for determining a spectral weight G, W and for processing the audio signal 91, X in a spectral region between the first and second frequency edge $206_1$-$206_4$, using the spectral weight.

According to a nineteenth aspect when referring back to the eighteenth aspect, a spectral gap 202 may be arranged between the first $206_1$ and second $206_2$ edge, wherein the processor 208 is configured for determining the spectral weight G, to combine the spectral weight G with a filling signal S so as to obtain a weighted filling signal F; wherein the apparatus may have a combiner 226 configured for combining the audio signal 91 or a signal derived thereof with the weighted filling signal F.

According to a twentieth aspect when referring back to the nineteenth aspect, the processor 208, 228 may be configured for smoothing the audio signal 91, X or the signal derived thereof over frequency so as to obtain a first filtered signal Y' and over time so as to obtain a second filtered signal Z so as to obtain a second filtered signal Z; and for comparing the first filtered signal Y' with the audio signal 91, X or the signal derived thereof for obtaining a frequency difference value Δf and for comparing the second filtered signal Z' with the audio signal 91, X or the signal derived thereof for obtaining a time difference value $\Delta_t$; for setting the spectral weight G to a non-zero value if the frequency difference $\Delta_f$ value is greater than or equal a frequency difference threshold value $S_f$ and if the time difference value Δt is greater than or equal a time difference threshold value $S_t$.

According to a twenty-first aspect when referring back to the nineteenth or twentieth aspect, the apparatus may be configured for generating the filling signal S evaluating at least one preceding frame of the audio signal 91, X or the signal derived thereof.

According to a twenty-second aspect when referring back to any of the eighteenth to twenty-first aspects, the processor 208 may be configured for determining the spectral weight based on the determination rule:

$$\Gamma = \left( \frac{X^\alpha + \gamma(Y^\alpha - X^\alpha)}{Y^\alpha - \kappa} \right)^\beta$$

wherein Γ is the spectral weight, X is the magnitude spectrum of the audio signal or of the signal derived thereof, Y is a value derived from a smoothed version of the audio signal or of the signal derived thereof, α, β, γ are tunable parameters, κ is an impact parameter for scaling an impact of weighting.

According to a twenty-third aspect when referring back to the twenty-second aspect, the impact parameter κ is based on the determination rule:

$$\kappa = 10^{\frac{20 log_{10}(X) + \delta_f}{20}}$$

wherein $\delta_f$ denotes a frequency difference threshold value.

According to a twenty-fourth aspect when referring back to any of the eighteenth to twenty-third aspects, a spectral island 204 may be arranged between the first 206₃ and second 206₄ edge; wherein the processor 228 may be configured for determining the spectral weight W and to combine the spectral weight W with the audio signal 91, X or a signal Z derived thereof so as to reduce the spectral island 204.

According to a twenty-fifth aspect, a method 2000 for determining a predetermined characteristic related to an artificial bandwidth limitation processing of an audio signal may have the steps of: evaluating 2100 a slope of a spectrum of the audio signal to obtain an slope evaluation result; and providing 2300 an information indicating that the audio signal comprises the predetermined characteristic dependent on an evaluation of the slope evaluation result.

According to a twenty-sixth aspect, a method 1500 for processing an audio signal may have the steps of: evaluating 1600 a slope of a spectrum of the audio signal to obtain a slope evaluation result; evaluating 1700 at least a first and a second frequency edge at which the spectrum comprises an edge so as to obtain a frequency evaluation result; and determining 1800 a spectral weight and processing the audio signal in a spectral region between the first and second frequency edge, using the spectral weight.

According to a twenty-seventh aspect, a non-transitory storage medium may have stored thereon a computer program having a program code for performing, when running on a computer, the above methods of the twenty-fifth or twenty-sixth aspect.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive encoded audio signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] M. Arora, J. Lee, and S. Park, "High quality blind bandwidth extension of audio for portable player applications," in Proc. of the AES 120th Conv., 2006.
[2] Markus Erne, "Perceptual audio coders "what to listen for?"," in Audio Engineering Society Convention 111, November 2001.
[3] Chia-Ming Chang, Han-Wen Hsu, Kan-Chun Lee, Wen-Chieh Lee, Chi-Min Liu, Shou-Hung Tang, Chung-Han Yang, and Yung-Cheng Yang, "Compression artifacts in perceptual audio coding," in Audio Engineering Society Convention 121, October 2006.
[4] Martin Dietz, Lars Liljeryd, Kristofer Kjörling, and Oliver Kunz, "Spectral band replication, a novel approach in audio coding," in Audio Engineering Society Convention 112, April 2002.
[5] Sascha Disch, Andreas Niedermeier, Christian R. Helmrich, Christian Neukam, Konstantin Schmidt, Ralf Geiger, Jeremie Lecomte, Florin Ghido, Frederik Nagel and Bernd Edler, "Intelligent gap filling in perceptual transform coding of audio," in Audio Engineering Society Convention 141, September 2016.

The invention claimed is:

1. An apparatus for determining a predetermined characteristic indicating that an audio signal was subjected to an artificial bandwidth limitation processing, the apparatus comprising:
a spectrum calculator configured for receiving the audio signal and configured for calculating a spectrum from the audio signal ;a slope evaluator configured for evaluating a slope of the spectrum of the audio signal to acquire a slope evaluation result; and
a processor for providing a signal indicating that the audio signal comprises the predetermined characteristic dependent on an evaluation of the slope evaluation result, wherein the processor is configured for providing the signal indicating that the audio signal comprises the predetermined characteristic by providing a respective signal indicating a result for a frame whether the frame comprises the predetermined characteristic for a plurality of frames of the audio signal for each of the plurality of frames, wherein the processor is configured for acquiring a plurality of results for the plurality of frames indicating whether the frame comprises the predetermined characteristic based on the plurality of frames and to combine the plurality of results indicating whether the frame comprises the predetermined characteristic so as to acquire a combined result being valid for the plurality of frames; and
wherein the processor is configured for executing a median filtering using the plurality of results for acquiring the combined result;
wherein the slope evaluator and the spectrum calculator is implemented in hardware and/or software.

2. The apparatus of claim 1, further comprising a frequency evaluator configured for evaluating a cut-off frequency of the spectrum of the audio signal to acquire a frequency evaluation result;
wherein the slope evaluation result comprises information about at least one of:
a maximum, minimum or average value of the slope of at least a part of the spectrum, rising or falling edges within the spectrum or the slope thereof;
wherein the processor is configured for providing the signal indicating that the audio signal comprises the predetermined characteristic dependent on the evaluation of the slope evaluation result and an evaluation of the frequency evaluation result;
wherein the frequency evaluator is implemented in hardware and/or software.

3. The apparatus of claim 2, wherein the apparatus is configured for determining the predetermined characteristic for a plurality of spectrums of the audio signal, wherein the slope evaluator is configured for evaluating the slope of each of the plurality of spectrums, wherein the frequency evaluator is configured for evaluating each of the plurality of spectrums, and wherein the processor is configured for providing the signal indicating that the audio signal comprises the predetermined characteristic for each of the plurality of spectrums.

4. The apparatus of claim 3, further comprising:
a determiner configured for determining an energy of a frequency band of the spectrum and to provide a signal comprising information indicating the energy of the frequency band to the processor, wherein the processor is configured for providing the signal indicating that the audio signal comprises the predetermined characteristic based on a previous spectrum if the energy of the spectrum is below an energy threshold level;
wherein the determiner is implemented in hardware and/or software.

5. The apparatus of claim 1, wherein the slope evaluator is configured for evaluating an attenuation within the spectrum and for providing the slope evaluation result so as to indicate a measure for the attenuation, wherein the processor is configured for providing the signal indicating that the audio signal comprises the predetermined characteristic if the measure for the attenuation is at least an attenuation threshold value.

6. The apparatus of claim 5, wherein the slope evaluator is configured for determining a spectral difference function of the spectrum using a window function, the window function combining a plurality of frequency values of the spectrum, and to determine the measure for the attenuation using results of the window function.

7. The apparatus of claim 1, wherein the slope evaluator is configured for evaluating a steepness of the spectrum and for providing the slope evaluation result so as to indicate a measure for the steepness, wherein the processor is configured for providing the signal indicating that the audio signal comprises the predetermined characteristic if the measure for the steepness is at least a steepness threshold value.

8. The apparatus of claim 1, wherein the slope evaluator is configured for evaluating an attenuation between a first energy level of a first frequency band of the spectrum and a second energy level of a second energy band of the spectrum, wherein the first frequency band comprises a first frequency range being lower when compared to a second frequency range of the second frequency band, and for providing the slope evaluation result so as to indicate a measure for the attenuation, wherein the processor is configured for providing the signal indicating that the audio signal comprises the predetermined characteristic if the measure for the attenuation is at least an attenuation threshold value.

9. The apparatus of claim 1, wherein the apparatus comprises a frequency evaluator configured for determining a measure for energy in a frequency band of the audio signal and for determining a cut-off frequency based on the measure for energy in a decreasing frequency range based on an increase of energy in the decreasing frequency range;
wherein the frequency evaluator is implemented in hardware and/or software.

10. The apparatus of claim 1, further comprising a frequency evaluator configured for evaluating a cut-off frequency of the spectrum of the audio signal to acquire a frequency evaluation result; and
further comprising a filter configured for receiving the frequency evaluation result and for providing a filtered frequency evaluation result, wherein the processor is configured for providing the signal indicating that the audio signal comprises the predetermined characteristic based on a plurality of slope evaluation results and the filtered frequency evaluation result associated with a plurality of spectrums of the audio signal;
wherein the frequency evaluator and the filter are implemented in hardware and/or software.

11. The apparatus of claim 1, further comprising a resampling evaluator configured for evaluating the audio signal for a predetermined characteristic related to an upsampling using a sampling frequency, wherein the apparatus is configured to adapt frequency ranges of the slope evaluator and/or of the frequency evaluator based on the sampling frequency;
wherein the frequency evaluator and the resampling evaluator are implemented in hardware and/or software.

12. The apparatus of claim 11, wherein the resampling evaluator is configured for acquiring a negative evaluation result when a determination rule applies $$X(k) > threshold$$

and $$X(k) < X(k+1) - offsetparameter$$

wherein $X(k)$ is a value X of the spectrum at frequency index k and offset parameter is a noise suppressing value.

13. The apparatus of claim 11, wherein the resampling evaluator is configured for acquiring a positive evaluation result indicating that the audio signal was subjected to the upsampling limiting a bandwidth at frequency index k when a determination rule applies $$S(k) > threshold$$

wherein $S(k)$ is a spectral difference function relating to the spectrum at the frequency index k.

14. The apparatus of claim 1, further comprising a signal enhancer configured for reducing artifacts caused by the artificial bandwidth limitation processing of the audio signal dependent on the signal indicating that the audio signal comprises the predetermined characteristic or dependent on a signal indicating that the audio signal comprises a characteristic related to spectral enhancement processing;
wherein the signal enhancer is implemented in hardware and/or software.

15. The apparatus of claim 14, wherein the signal enhancer is configured for filling a spectral gap using a weighted filling signal and/or for attenuating a spectral island using weighting factors.

16. The apparatus of claim 1, further comprising a frequency evaluator being implemented in hardware and/or software and configured for evaluating a cut-off frequency of the spectrum of the audio signal; wherein the cut-off frequency of the spectrum is related to a speech-related application and comprises a frequency of at most 4 KHz.

17. A method for determining a predetermined characteristic indicating that an audio signal was subjected to an artificial bandwidth limitation processing, the method comprising:
receiving the audio signal and calculating a spectrum from the audio signal using a spectrum calculator being implemented in hardware and/or software;
evaluating a slope of the spectrum of the audio signal to acquire an slope evaluation result; and
providing a signal indicating that the audio signal comprises the predetermined characteristic dependent on an evaluation of the slope evaluation result;
providing the signal indicating that the audio signal comprises the predetermined characteristic by providing a respective signal indicating a result for a frame whether the frame comprises the predetermined characteristic for a plurality of frames of the audio signal for each of the plurality of frames, and acquiring a plurality of results for the plurality of frames indicating whether the frame comprises the predetermined characteristic based on the plurality of frames and combining the plurality of results indicating whether the frame comprises the predetermined characteristic so as to acquire a combined result being valid for the plurality of frames; and
executing a median filtering using the plurality of results for acquiring the combined result.

18. A non-transitory digital storage medium having stored thereon a computer program for performing a method for determining a predetermined characteristic indicating that an audio signal was subjected to an artificial bandwidth limitation processing, the method comprising:
receiving the audio signal and calculating a spectrum from the audio signal using a spectrum calculator being implemented in hardware and/or software;
evaluating a slope of the spectrum of the audio signal to acquire an slope evaluation result; and
providing a signal indicating that the audio signal comprises the predetermined characteristic dependent on an evaluation of the slope evaluation result;
providing the signal indicating that the audio signal comprises the predetermined characteristic by providing a respective signal indicating a result for a frame whether the frame comprises the predetermined characteristic for a plurality of frames of the audio signal for each of the plurality of frames, and acquiring a plurality of results for the plurality of frames indicating whether the frame comprises the predetermined characteristic based on the plurality of frames and combining the plurality of results indicating whether the frame comprises the predetermined characteristic so as to acquire a combined result being valid for the plurality of frames; and executing a median filtering using the plurality of results for acquiring the combined result, when said computer program is run by a computer.

* * * * *